US012252619B2

(12) United States Patent
Rau et al.

(10) Patent No.: US 12,252,619 B2
(45) Date of Patent: Mar. 18, 2025

(54) ADDITIVE MANUFACTURING OF AROMATIC THERMOPLASTICS FROM PHOTOCURABLE PRECURSOR SALTS

(71) Applicant: Virginia Tech Intellectual Properties, Inc., Blacksburg, VA (US)

(72) Inventors: Daniel Rau, Blacksburg, VA (US); Jana Herzberger, Blacksburg, VA (US); Timothy Long, Blacksburg, VA (US); Christopher Williams, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 967 days.

(21) Appl. No.: 16/981,115

(22) PCT Filed: Mar. 30, 2019

(86) PCT No.: PCT/US2019/025066
§ 371 (c)(1),
(2) Date: Sep. 15, 2020

(87) PCT Pub. No.: WO2019/191733
PCT Pub. Date: Oct. 3, 2019

(65) Prior Publication Data

US 2021/0115279 A1 Apr. 22, 2021

Related U.S. Application Data

(60) Provisional application No. 62/650,370, filed on Mar. 30, 2018.

(51) Int. Cl.
*B33Y 70/00* (2020.01)
*C08G 69/40* (2006.01)
(Continued)

(52) U.S. Cl.
CPC ............ *C09D 11/102* (2013.01); *B33Y 70/00* (2014.12); *C08G 69/40* (2013.01); *C09D 11/101* (2013.01);
(Continued)

(58) Field of Classification Search
CPC ........ G03F 7/029; G03F 7/0037; G03F 7/037; G03F 7/027; B33Y 70/00; B33Y 10/00;
(Continued)

(56) References Cited

U.S. PATENT DOCUMENTS

2017/0073545 A1* 3/2017 Nakayama .......... H01M 4/0404

FOREIGN PATENT DOCUMENTS

| | | | | |
|---|---|---|---|---|
| EP | 1909142 | * | 4/2008 | G03F 7/085 |
| WO | WO 2018/035368 | * | 2/2018 | C08G 73/22 |
| WO | WO-2018035368 A1 | * | 2/2018 | B33Y 10/00 |

OTHER PUBLICATIONS

Gui, TL et al. Synthesis and Electro-Optical Properties of Poly(4-ethynylaniline). Molecular Crystals and Liquid Crystals, vol. 459, No. 1, 2006, published online Jan. 31, 2007, pp. 299-306: abstract (Year: 2007).*

(Continued)

*Primary Examiner* — Monica A Huson
(74) *Attorney, Agent, or Firm* — Thomas|Horstemeyer, LLP

(57) ABSTRACT

In various aspects, a polymer resin is provided for vat or ultraviolet-assisted direct ink writing (UV-DIW) photopolymerization. The resin can include a polyamic acid salt formed from the addition of a photocrosslinkable amine to a polyamic acid. The resin can include a photoinitiator suitable for initiating crosslinking of the photocrosslinkable amine when exposed to a light source of a suitable wavelength and intensity. The polyamic acid can be formed, for instance, by the addition of a diamine to a suitable dianhy-
(Continued)

dride. Methods of additive manufacturing using the resins are also provided.

17 Claims, 36 Drawing Sheets

(51) Int. Cl.
*C09D 11/101* (2014.01)
*C09D 11/102* (2014.01)
*C09D 11/38* (2014.01)
*B29C 64/124* (2017.01)
*B29K 79/00* (2006.01)
*B33Y 10/00* (2015.01)

(52) U.S. Cl.
CPC ............ *C09D 11/38* (2013.01); *B29C 64/124* (2017.08); *B29K 2079/08* (2013.01); *B33Y 10/00* (2014.12)

(58) Field of Classification Search
CPC ..... C09D 11/101; C09D 11/38; C09D 11/102; C08G 69/40; B29C 64/124; B29K 2079/08
See application file for complete search history.

(56) References Cited

OTHER PUBLICATIONS

Sahnoun, M et al. Synthetic and Characterization Aspects of Dimethylaminoethyl Methacrylate Reversible Addition Fragmentation Chain Transfer (RAFT) Polymerization. Journal of Polymer Science, Part A, vol. 43, No. 16, Aug. 15, 2005, pp. 3551-3565; abstract; p. 23555 col. 1. paragraph 1 (Year: 2005).*

* cited by examiner

ADDITIVE MANUFACTURING OF AROMATIC THERMOPLASTICS FROM PHOTOCURABLE PRECURSOR SALTS

CROSS-REFERENCE TO RELATED APPLICATIONS

This application is the 35 U.S.C. § 371 national stage application of PCT Application No. PCT/US2019/025066, filed Mar. 30, 2019, where the PCT claims priority to, and the benefit of, U.S. provisional application entitled "ULTRAVIOLET-ASSISTED DIRECT INK WRITING TO ADDITIVELY MANUFACTURE ALL-AROMATIC POLYIMIDE PARTS" having Ser. No. 62/650,370, filed Mar. 30, 2018, both of which are herein incorporated by reference in their entireties.

TECHNICAL FIELD

The present disclosure generally relates to additive manufacturing methods, additive manufacturing compositions, and articles made therefrom.

BACKGROUND

High-performance engineering thermoplastics typically contain highly aromatic molecular structures leading to glass transition temperatures ($T_g$) above 200° C., degradation temperatures ($T_d$) above 500° C., and excellent mechanical properties (Young's modulus exceeding 1 GPa). Their high thermal stability facilitates impact in aerospace, automotive, and microelectronics industries. However, an all-aromatic molecular structure limits their application due to melt processing challenges. The thermal resistance of these polymers makes processing using conventional melt processing essentially impossible.

Polyimides and polybenzoxazoles are widely used in industry as high-temperature engineering materials in a large variety of environment (e.g. at high and low temperatures, in vacuum, in space, in chemically reactive environments) and products (e.g. in space suits, as protective clothing, as thermal and electrical insulation, as radiation shields for electronics, and filtration media, such as membranes). To date, these products are produced by conventional fabrication techniques which restrict the geometries of the latter. Especially PDMA-ODA polyimide, Kapton, is only available as film.

Current solutions involve a compromise between processability and properties. Energy-intensive molding processes result in limited resolution and complexity. Moreover, dimensional stability of the molded components is extremely sensitive to the presence of moisture. Overcoming the processing barriers of high-temperature polyimides without compromising their molecular architecture requires unique synthetic and manufacturing strategies.

Stereolithography is an additive manufacturing process that works by focusing an ultraviolet (UV) laser on a vat of polymerizable photopolymer resin. Complex three-dimensional structures can be built in a layer-by-layer fashion. Manufacturing using mask-projection stereolithography (MPSL) requires a photo-crosslinkable site in the polymeric (or monomeric) material. Typically, the polymeric design integrates an inert core with photo-crosslinkable moieties such as acrylates or epoxies. The preparation of complex scaffolds for tissue and cell growth represents a recent application of MPSL. While these reports highlight the importance of multifunctional polymers as 3D-printable materials, the biological focus has restricted the field to aliphatic polymers and oligomers. The $T_d$ of these aliphatic polymers is generally lower than 400□C with $T_g$ usually below 100° C. Only a few high-$T_d$, 3D printable polymers such as cyanate ester resins exist. Furthermore, the limited range of engineering polymers available for 3D printing using MPSL is further constrained to thermosets due to molecular design constraints. There is a need for new functional polymeric materials for unlocking the potential of 3D printing with MPSL.

PCT/US2017/47426 describes homogenous 3D objects made of high performance polymers such as Kapton, produced by SLA. The approach relies upon soluble acrylate-functional polyamic ester precursors as with photo-curable acrylate groups enable 3D printing of the material by SLA. Guo et al. prepared soluble, fully imidized polyimides bearing acrylate groups along the polymer backbone as UV-crosslinkable precursors and printed the latter by direct light processing 3D printing (Guo, Y. et al, *J. Mater. Chem. A* 2017, DOI: 10.1039/C7TA01952A). However, these approaches rely upon the availability of soluble polyimides and/or proceed through a polyamic ester intermediate that is printed and converted to polyimide via post-processing.

There remains a need for improved compositions for additive manufacturing and 3D printing, methods of making, and uses thereof that overcome the aforementioned deficiencies.

SUMMARY

In various aspects, polymer resins and methods of use are provided that overcome one or more of the aforementioned deficiencies. In some aspects, a polymer resins is provided for ultraviolet-assisted direct ink write photopolymerization. The polymer resin can include a polyamic acid salt with repeat units having a structure according to the following formula where each occurrence of R" is a photocrosslinkable group; where each occurrence of R is independently H, substituted and unsubstituted alkyl, substituted and unsubstituted heteroalkyl, or substituted and unsubstituted alkenyl

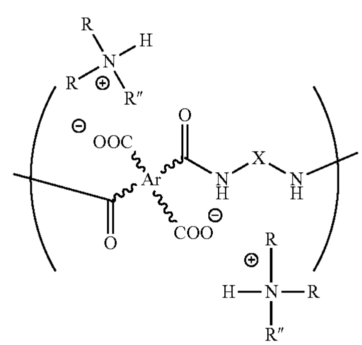

In the above aspects, each occurrence of Ar can be independently selected from the group

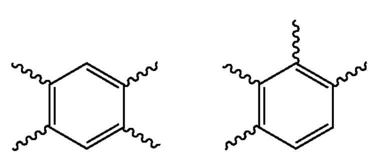

-continued

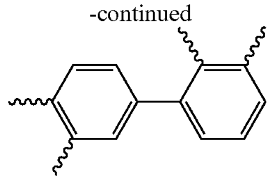

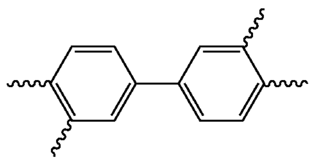

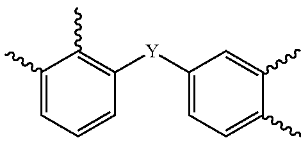

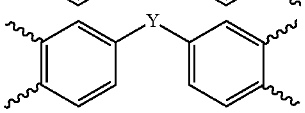

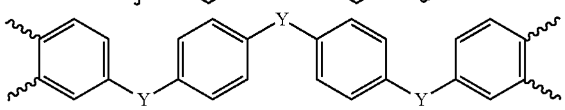

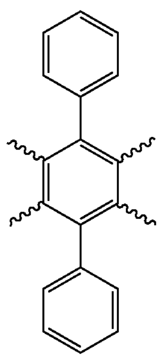

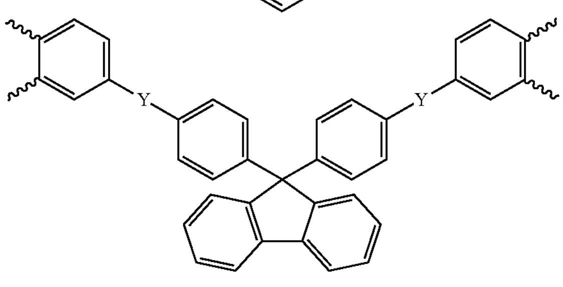

In the above structures, each occurrence of X is independently a substituted or unsubstituted aryl or heteroaryl group; and each occurrence of Y is independently selected from the group consisting of O, S, C═O, $C(CF_3)_2$, $C(CH_3)_2$, $SO_2$, and C≡C.

In some aspects, each occurrence of X is independently selected from the group

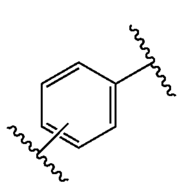

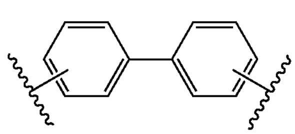

-continued

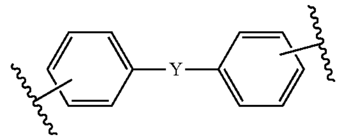

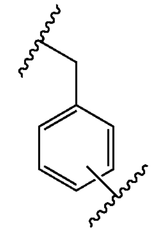

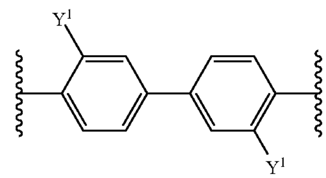

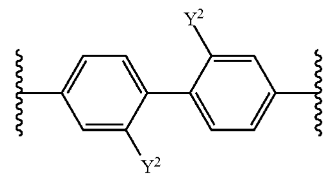

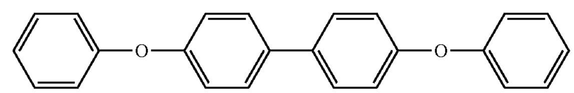

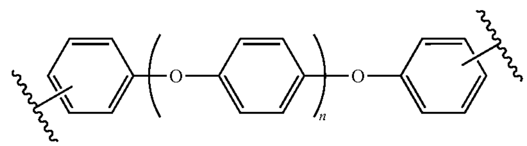

In some aspects, each occurrence of R" is selected from the group

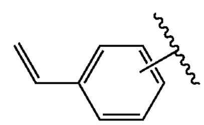

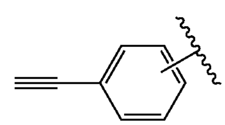

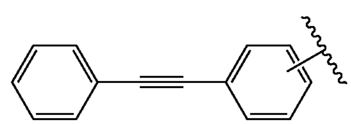

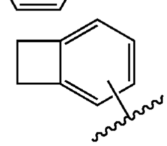

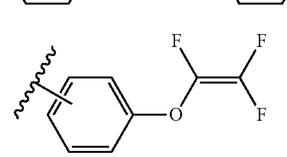

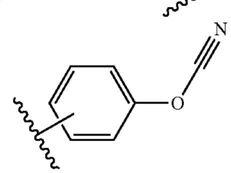

In some aspects, a polymer resin is provided for ultraviolet-assisted direct ink write photopolymerization. The polymer resin can include (i) a polyamic acid salt formed from the addition of a photocrosslinkable amine to a polyamic acid.

The photocrosslinkable amine can include any of the following where each occurrence of $R_1$ is independently —H or —$CH_3$; where each occurrence of $R_2$ is independently —H, —$CH_3$, or —$CH_2CH_3$; and where each occurrence of $R_3$ and $R_4$ is independently —H, an aliphatic group, or an aromatic group.

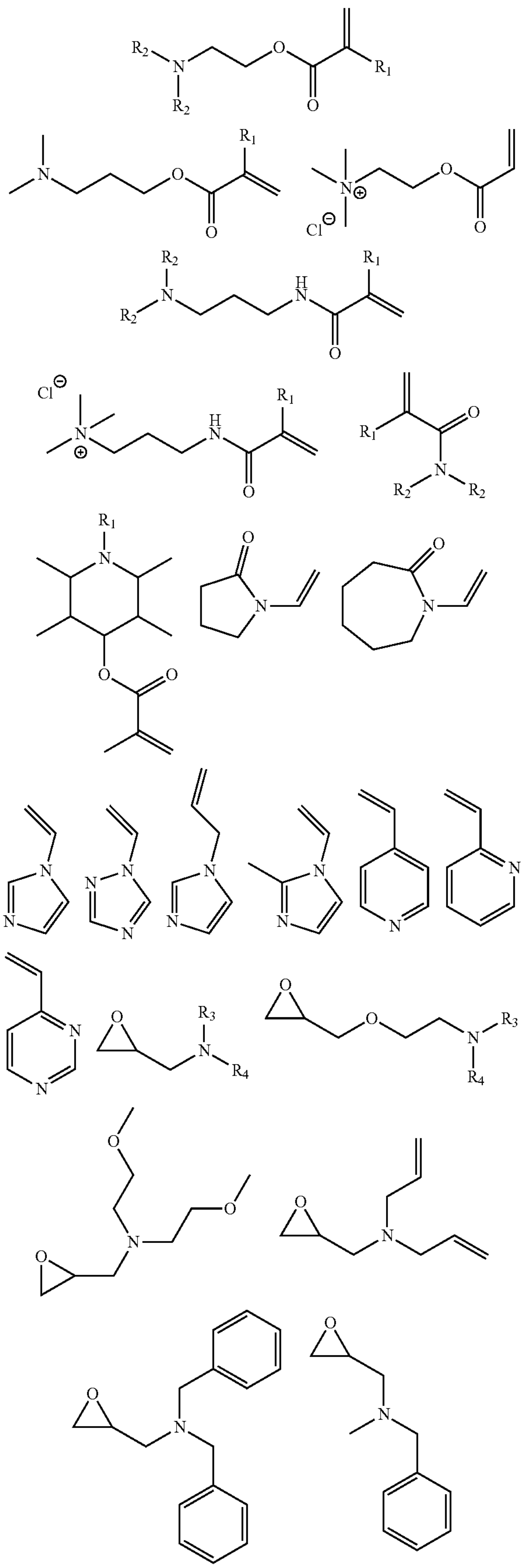

-continued

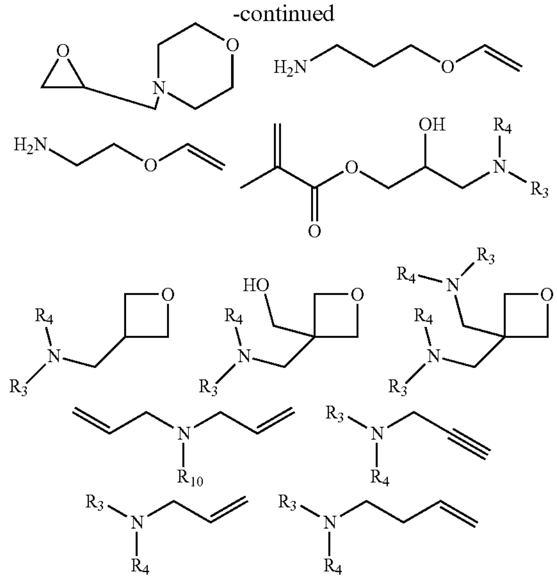

In some aspects, the polyamic acid is formed by the addition of a diamine to a dianhydride in a suitable precursor solvent and wherein the polyamic acid is not isolated from the suitable solvent prior to forming the polyamic acid salt. In some aspects, the suitable precursor solvent is selected from the group consisting of: N-methyl-2-pyrrolidone (NMP), dimethylacetamide (DMAC), dimethylformamide (DMF), y-butyrolactone, mixtures with hydrocarbon solvents/aromatic hydrocarbon solvents, water, ammonia, and mixtures thereof. In some aspects the polyamic acid has a viscosity ranging from about 100 Pa·s to 400 Pa·s.

The polymer resins described herein can also include (ii) a photoinitiator suitable for initiating crosslinking of the photocrosslinkable groups (e.g. suitable for initiating crosslinking of the photocrosslinkable amine) when exposed to a light source of a suitable wavelength and intensity; and (iii) a suitable solvent.

A variety of methods of making an article are also provided. The methods can include (a) applying an effective amount of a light to a polymer resin described herein; (b) repeating step (a) a number of times to form the precursor article in a layer-by-layer fashion; and (c) heating the precursor article to a first elevated temperature for a period of time to form the article comprising polyimide repeat units having a structure according to the following formula wherein each occurrence of X is a substituted or unsubstituted aromatic group, and wherein each occurrence of A is a substituted or unsubstituted aromatic group.

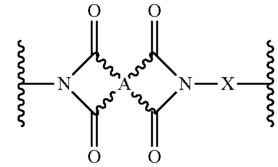

Other systems, methods, features, and advantages of the polymer resins and method of making articles using the polymer resins will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Further aspects of the present disclosure will be readily appreciated upon review of the detailed description of its various embodiments, described below, when taken in conjunction with the accompanying drawings.

FIG. 7A is plateau modulus versus TPO amount.

FIG. 9A: 1.5 wt. % photoinitiator, curing time=0.47 s, crossover modulus=1320 Pa and plateau modulus=4.5 $10_5$ Pa. FIG. 9B: 0.5 wt. % photoinitiator, curing time=0.71 sec, crossover modulus=1140 Pa and plateau modulus=1.9 $10_5$ Pa. The TPO concentration in wt. % is measured with reference to the PAA DMAEA salt. The targeted molecular weight ($M_n$) of the PAA was 30 kDa.

(FIG. 20A) Apparent viscosity (Pa s) versus shear rate ($s^{-1}$) for PAA in NMP (precursor) and PAA 0.5 equiv. DMAEMA salt solution (ink). (FIG. 20B) Moduli (Pa) versus time (s) from photorheology measurements of the PAA DMAEMA ink. UV-irradiation started at 30 s.

FIGS. 21A-21F show photographs of (FIG. 21A) as-printed organogel part, (FIG. 21B) part dried at 200° C. in vacuum, (FIG. 21C) part after thermal imidization at 400° C. under nitrogen atmosphere. (FIG. 21D) As-printed organogel in various 3D geometries. (FIG. 21E) PMDA-ODA PI parts of various 3D geometries after imidization. (FIG. 21F) PMDA-ODA PI scaffold with self-supporting, bridging features after imidization.

(FIG. 22B) Storage modulus (MPa) versus temperature (° C.) for AM specimen, bladed film from commercial PAA after imidization and commercial Kapton film.

DETAILED DESCRIPTION

Figure 1:
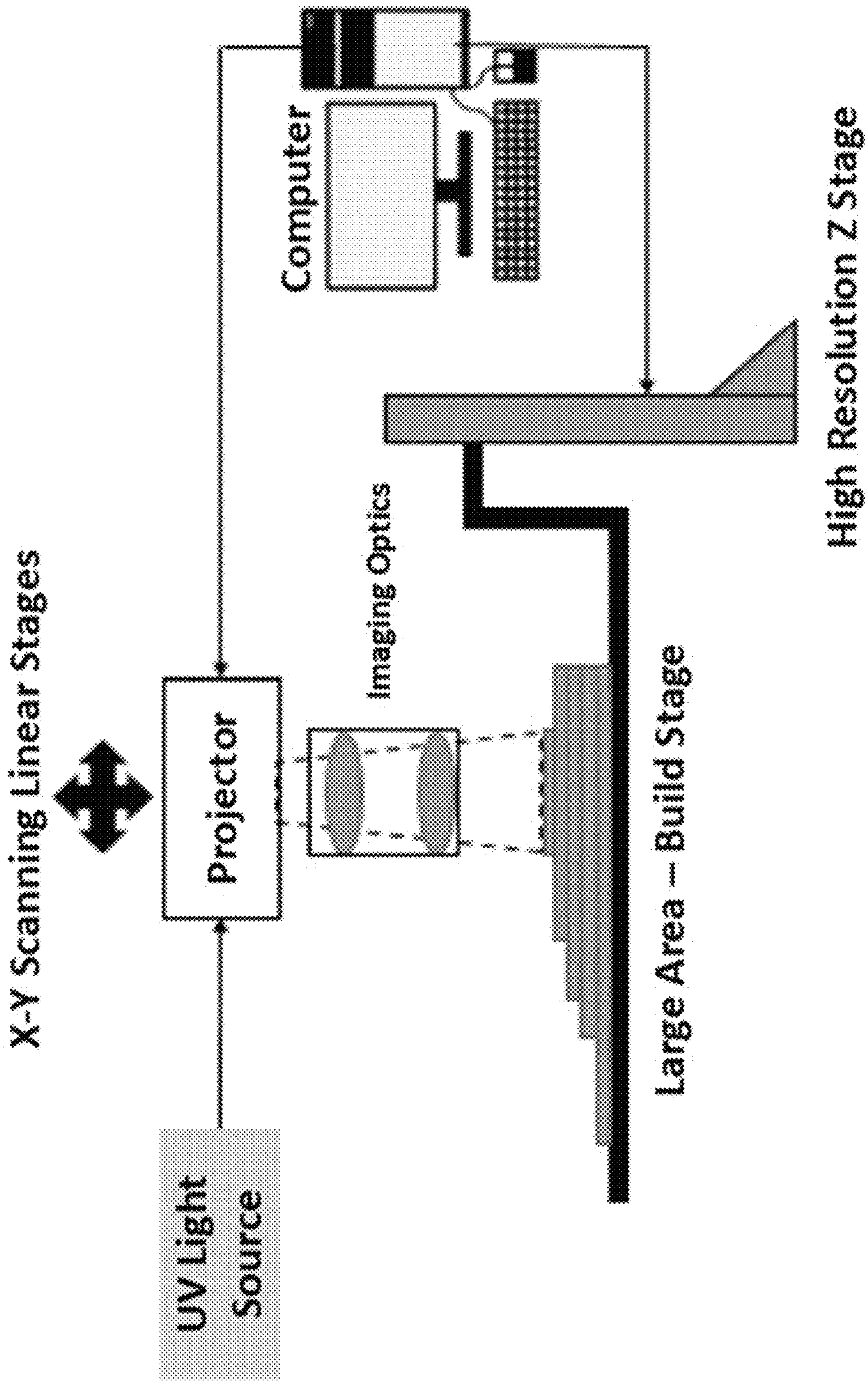
FIG. 1 is a schematic of a Scanning-Mask Projection Vat-Photopolymerization (S-MPVP) system. The system includes a broad-spectrum (300-500 nm) UV source, a dynamic mask projection device mounted on a high precision X-Y linear stage, imaging optics, a build platform attached to a highresolution z-stage and a computer to precisely control the mechatronic sub-systems.
Figure 2:
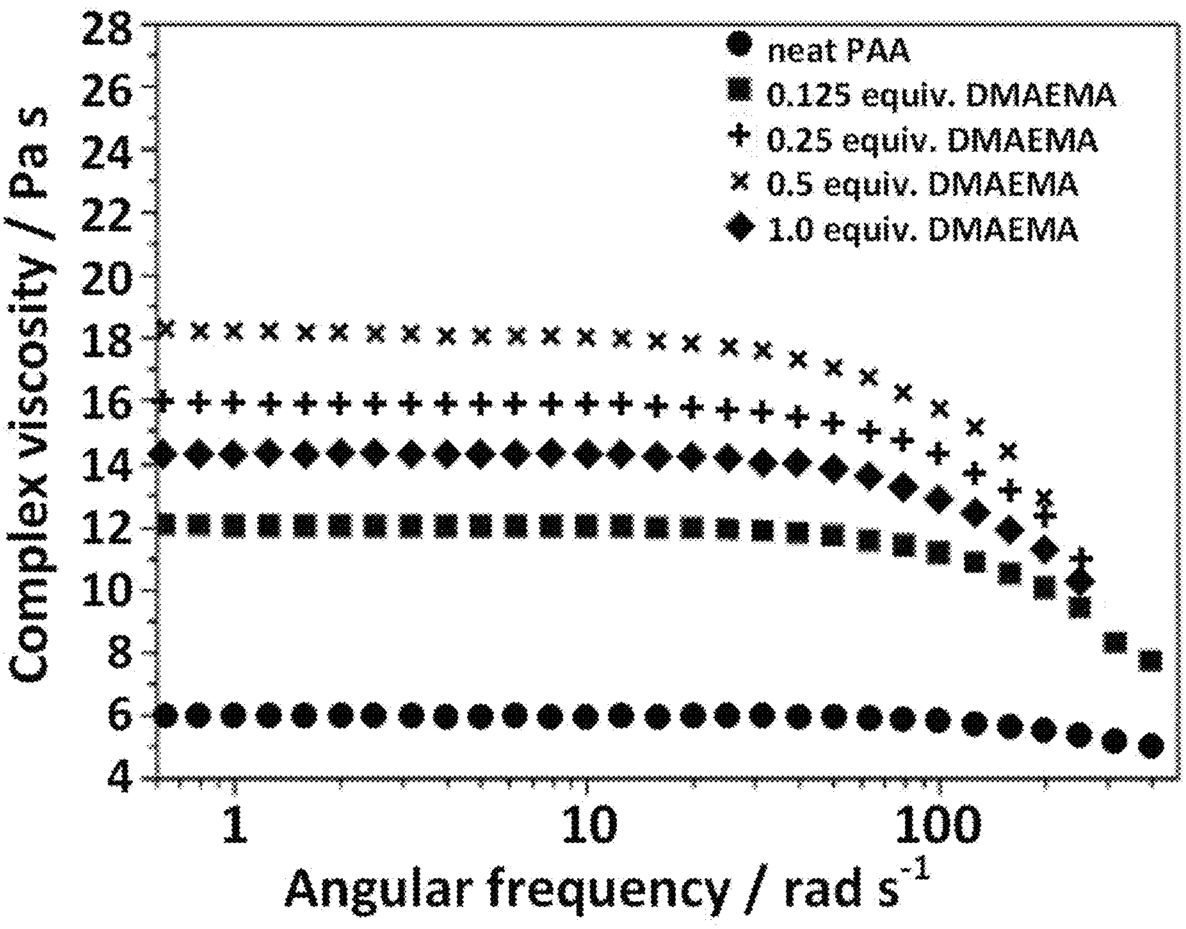
FIG. 2 is a graph of the complex viscosity plotted versus angular frequency of commercial PAA solution (15-16 wt. % in NMP) and PAA DMAEMA salts with varied DMAEMA amount in NMP (calculated in respect to the COOR groups of PAA).
Figure 3:
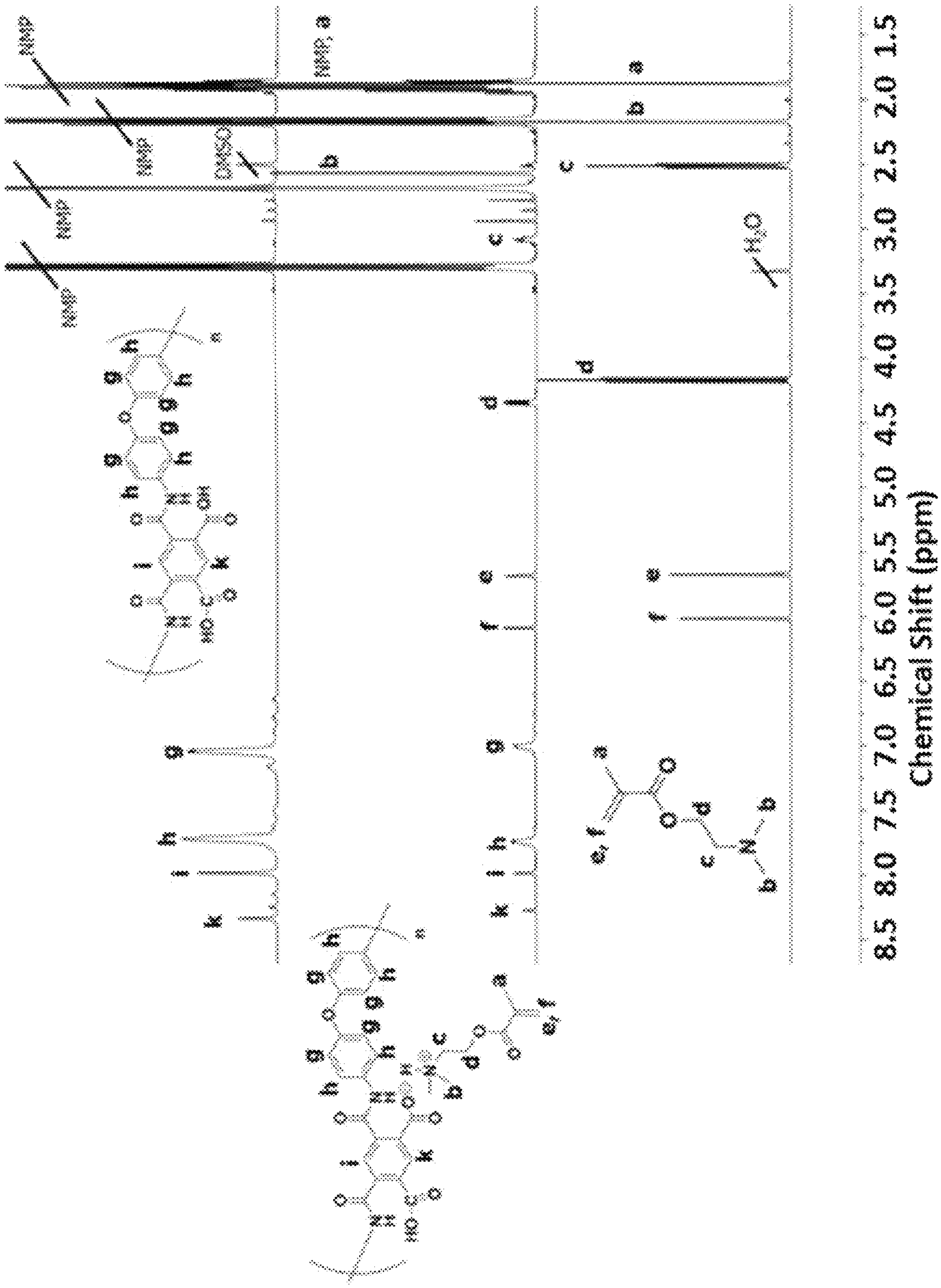
FIG. 3 is a graph of the $^1$H NMR (400 MHz, DMSO-d) of PAA in NMP (top), PAA DMAEMA salt in NMP (middle) and DMAEMA (bottom). DMAEMA interacts electrostatically with the carboxyl groups of the PAA which induces a downfield shift of signal b, c and d in the PAA DMAEMA salt.
Figure 4:
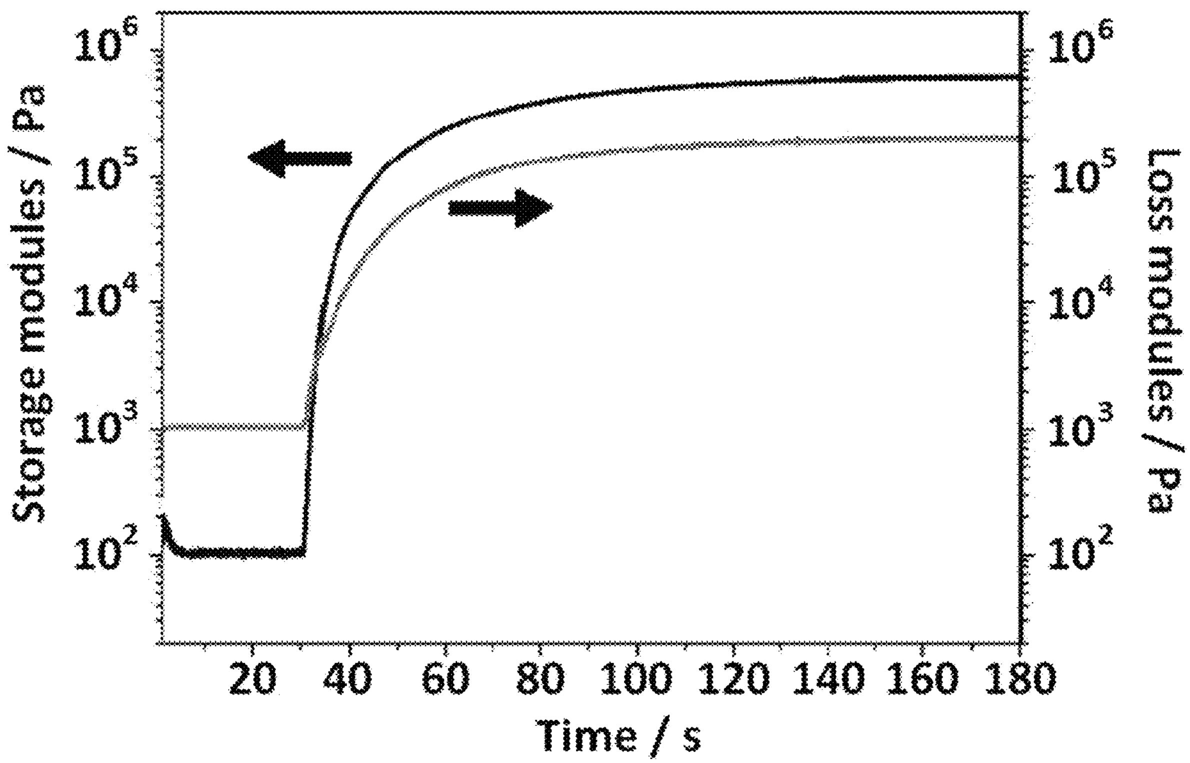
FIG. 4 is a graph of the storage and loss modulus from photorheology measurements as a function of time during UV exposure. Irradiation starts at 30 s. Diphenyl(2,4,6-trimethylbenzoyl)phosphine oxide (TPO) was used as photoinitiator due to its solubility in NMP and light absorbance above 400 nm. All measurements were performed at 25° C. with 20 wt. % solids of PAA salt (0.5 equiv. DMAEMA) in NMP. Curing time=3 s, crossover modulus=3190 Pa and plateau modulus=6.1 $10_5$ Pa. The TPO concentration in wt. % is measured with reference to the PAA salt (PAA+0.5 euqiv. DMAEMA). Commercial PAA in NMP (15 wt. %) served as starting material. DMAEMA equivalents were calculated in respect to the COOH groups of PAA.
Figure 5A:
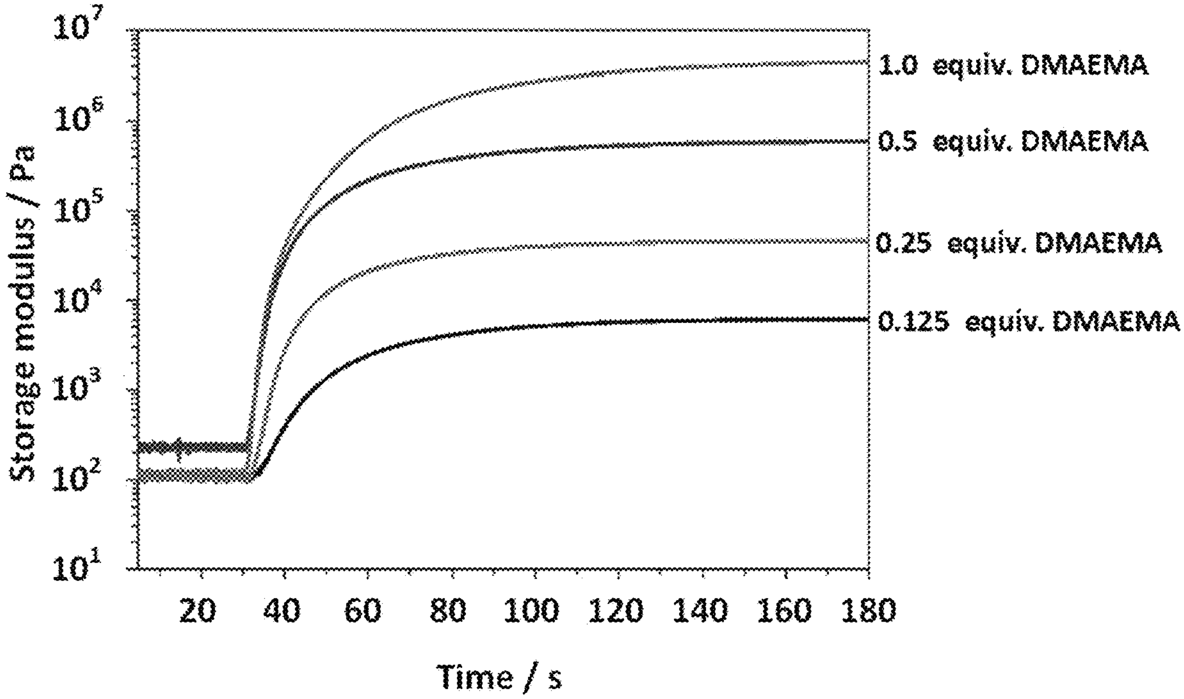
FIG. 5A is a graph of the storage modulus (G') as a function of time during photopolymerization of PAA DMAEMA salts. Irradiation starts after 30 s. Varied DMAEMA amount of PAA DMAEMA salts in NMP with 1.5 wt. % TPO as photoinitiator. Commercial PAA (15 wt. %) served as starting material. DMAEMA equivalents were calculated in respect to the COOH groups of PAA. The plateau modulus increases with increasing DMAEMA equivalents.
Figure 5B:
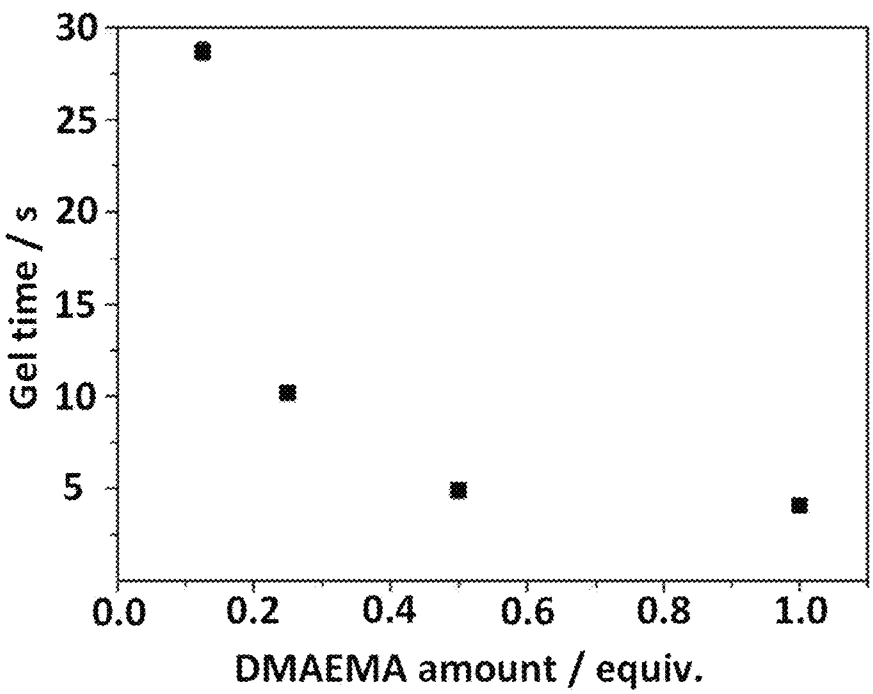
FIG. 5B is a plot of gel time versus DMAEMA amount. The gel time was determined from photorheology studies, using the intersection of the loss and storage modulus. Measurements were performed in triplicates. Errors are calculated from the standard deviation of the averaged values.
Figure 6A:
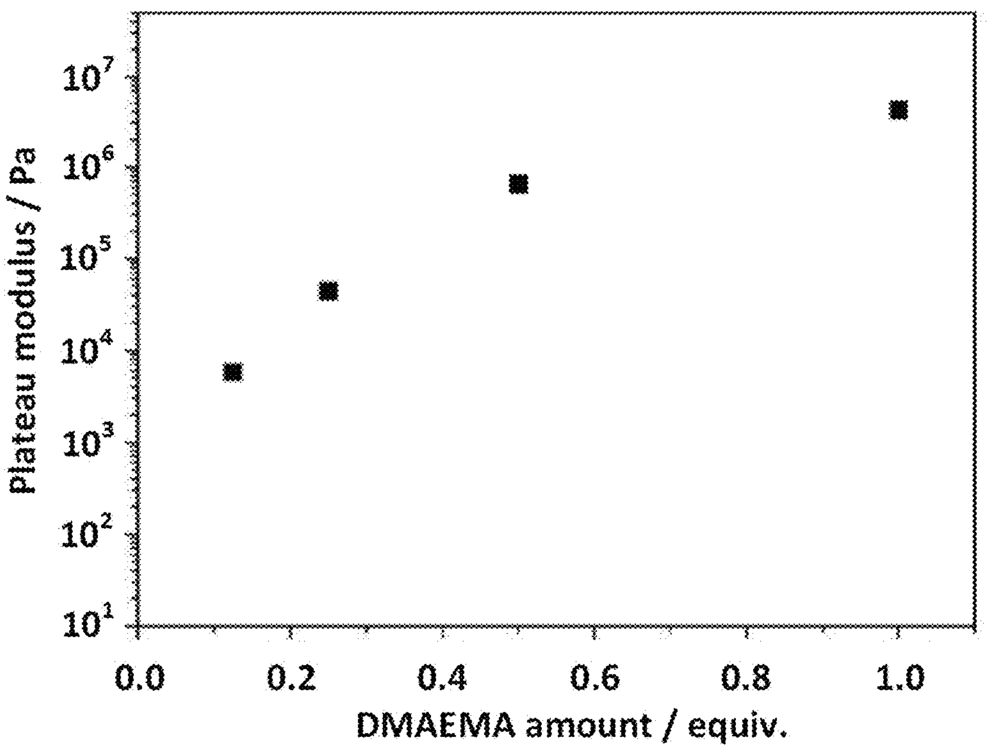
FIG. 6A is a graph of the plateau modulus plotted versus DMAEMA amount for PAA DMAEMA salt solutions in NMP with varied DMAEMA amount.
Figure 6B:
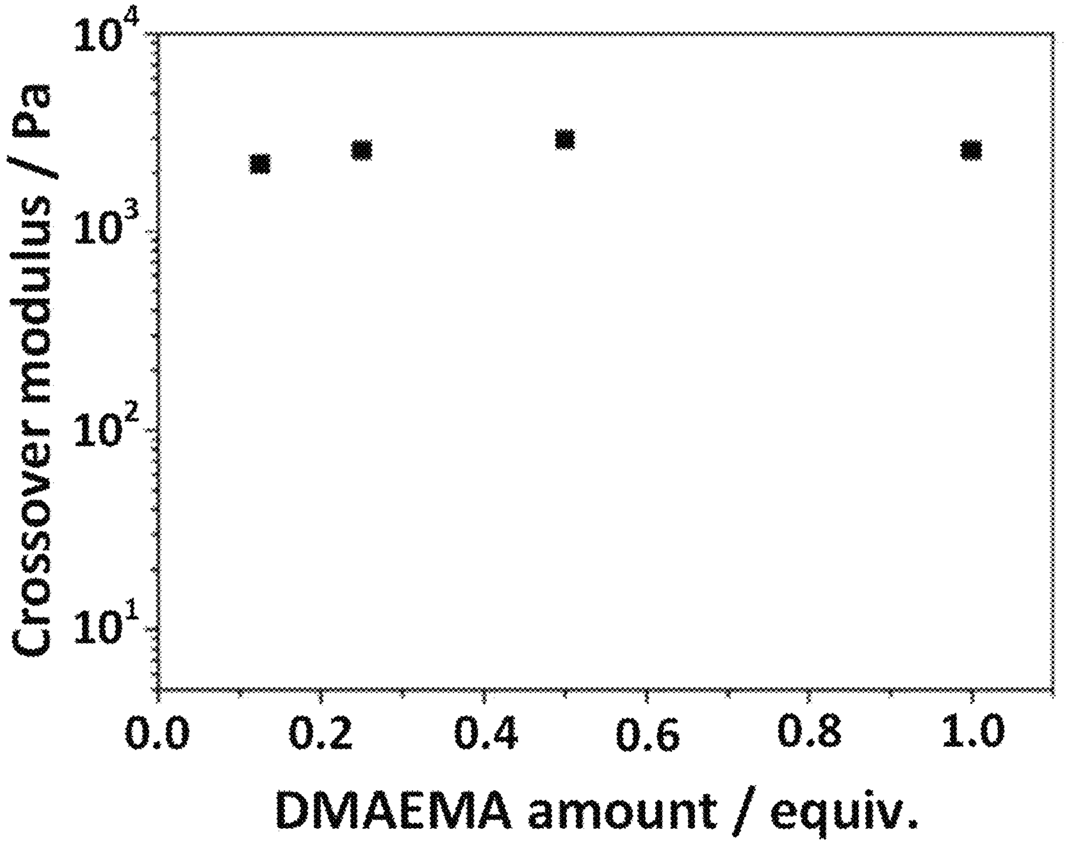
FIG. 6B is a plot of crossover modulus versus DMAEMA amount for PAA DMAEMA salt solutions in NMP. Commercial PAA (15 wt. %) served as starting material. DMAEMA equivalents were calculated in respect to the COOH groups of PAA. Measurements were performed in triplicates. Errors are calculated from the standard deviation of the averaged values.
Figure 7A:
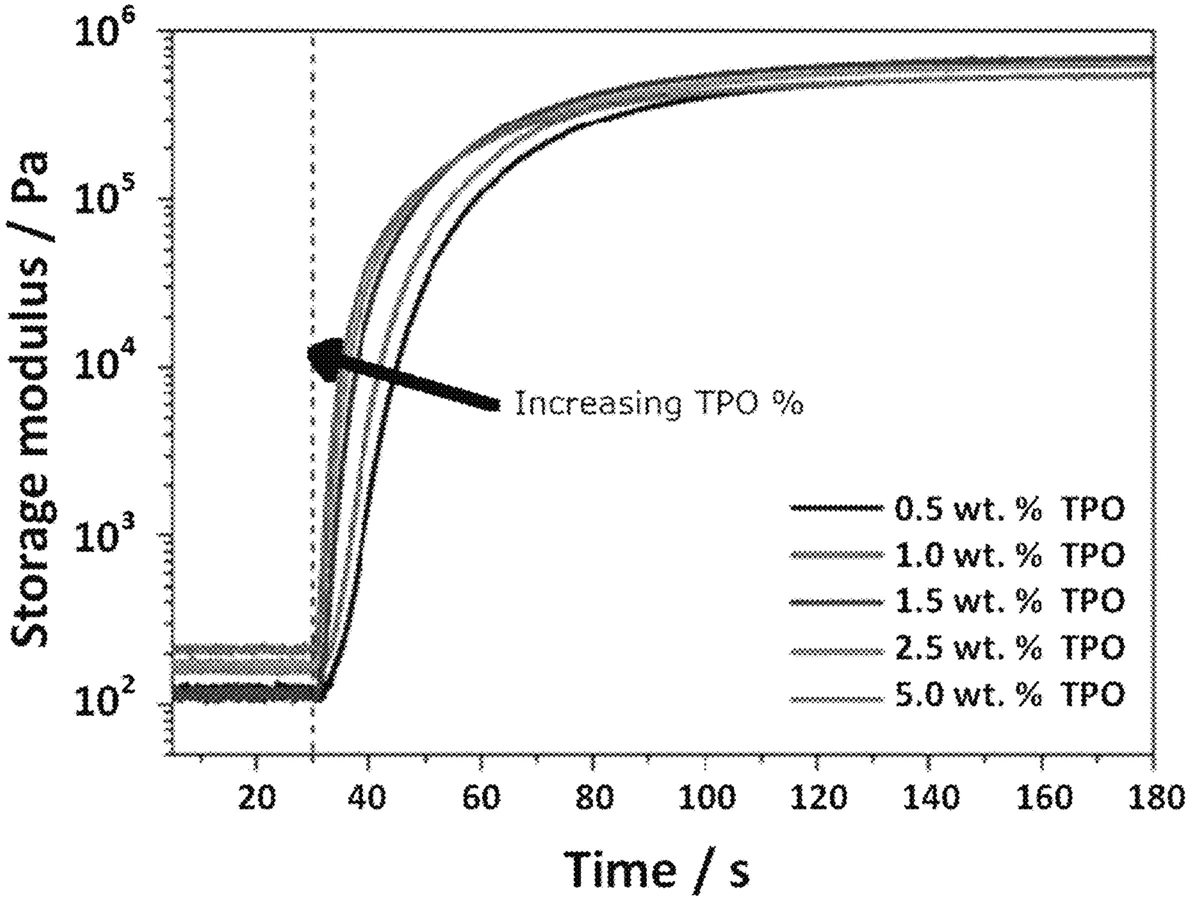
FIG. 7A is a graph of the storage modulus as a function of time during photopolymerization of PAA 0.5 equiv. DMAEMA salt solution (20 wt % in NMP) with varied TPO amount. Irradiation starts at 30 s.
Figure 7B:
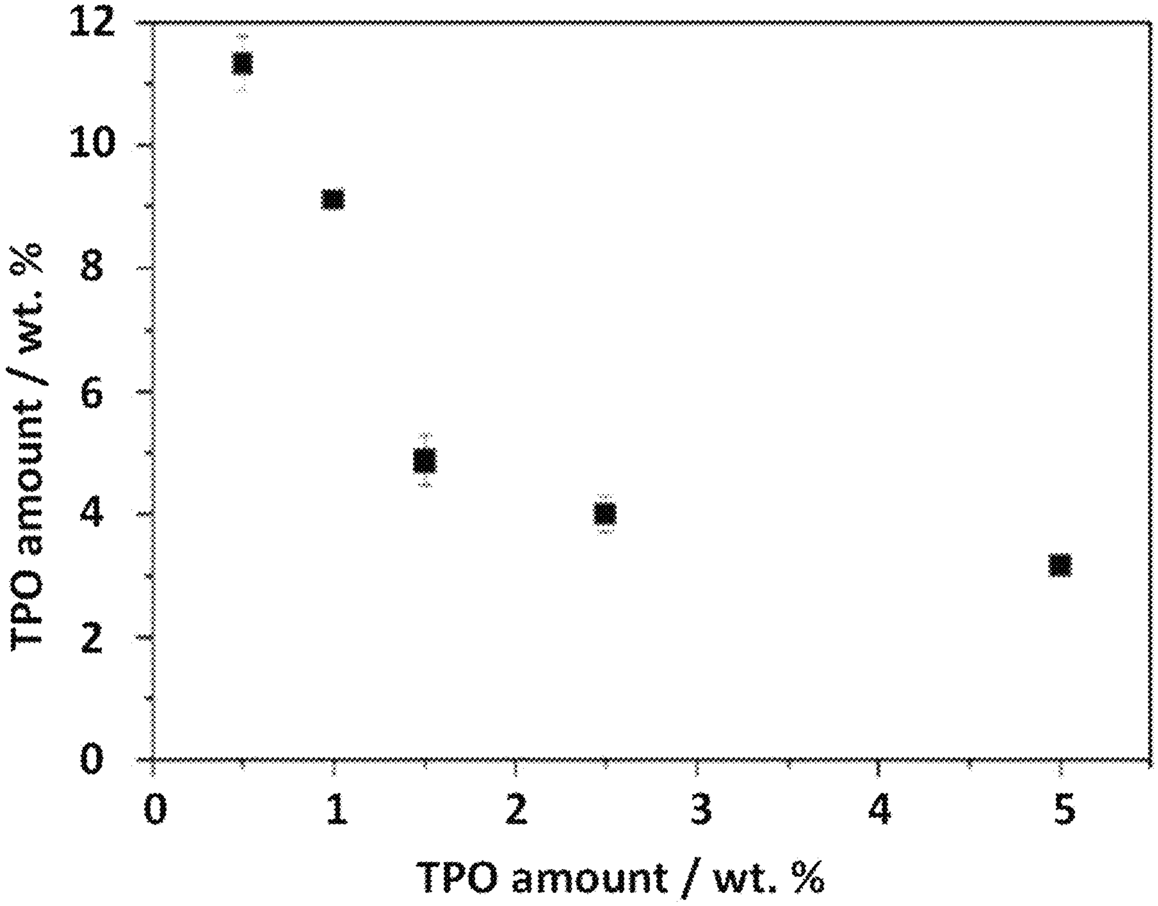
FIG. 7B is a plot of gel time versus TPO amount. Gel time was determined from the intersection of loss and storage modulus.
Figure 7C:
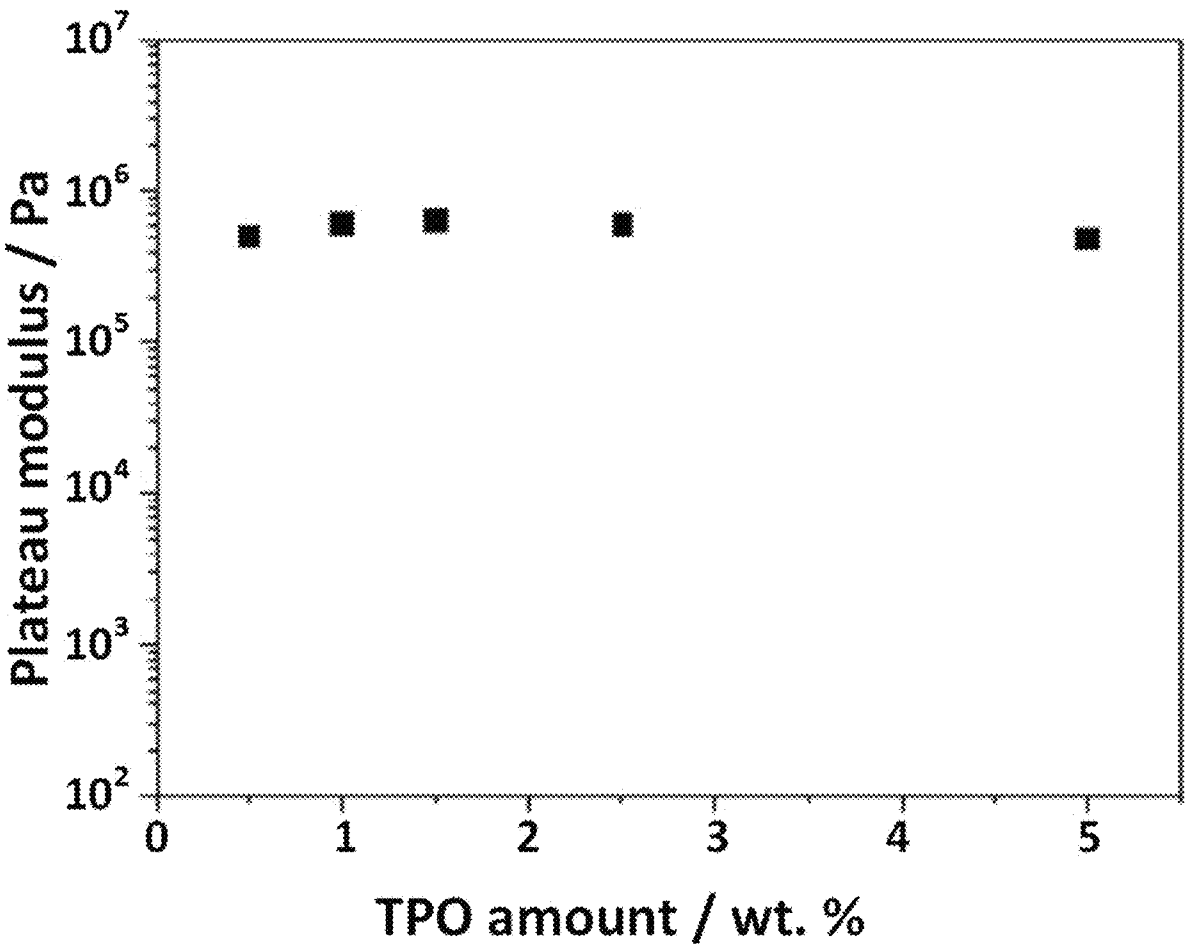
FIG. 7D is crossover modulus versus TPO amount. Measurements were performed in triplicates. Errors are calculated from the standard deviation of the averaged values. Commercial PAA (15 wt. %) served as starting material. 0.5 equiv. DMAEMA were calculated in respect to the COOR groups of PAA. TPO amount was calculated in respect to PAA+DMAEMA.
Figure 7D:
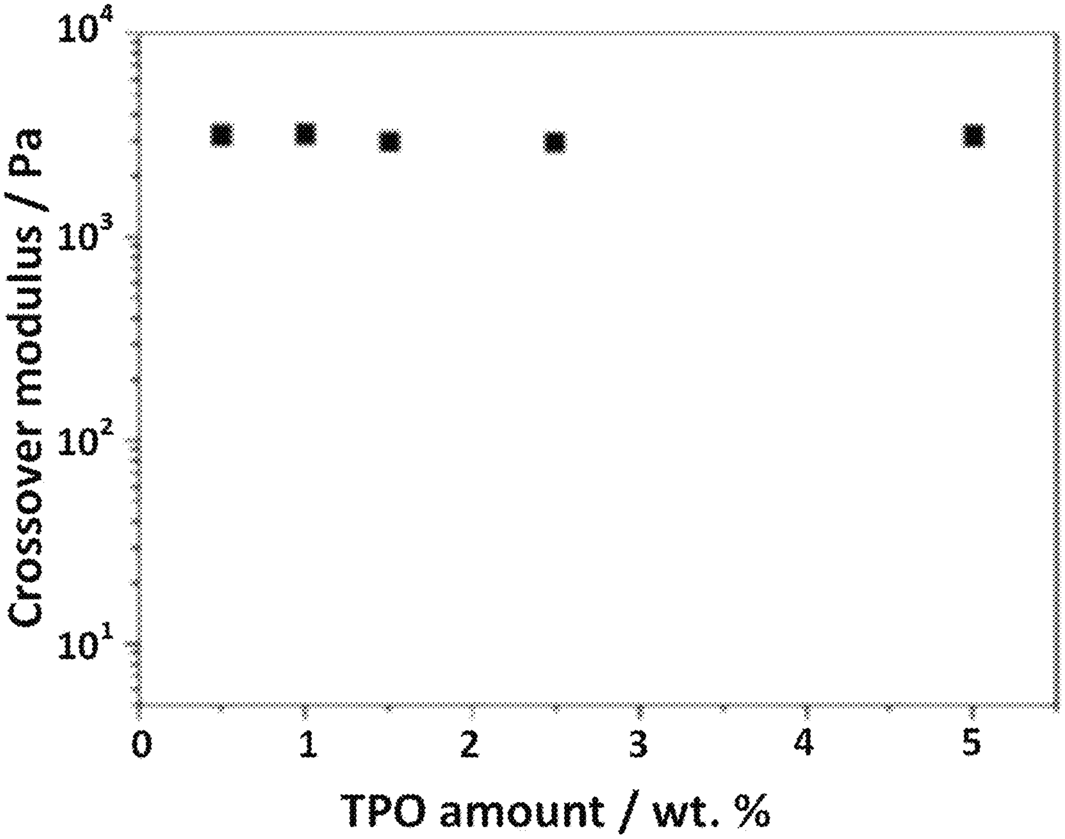
Figure 8:
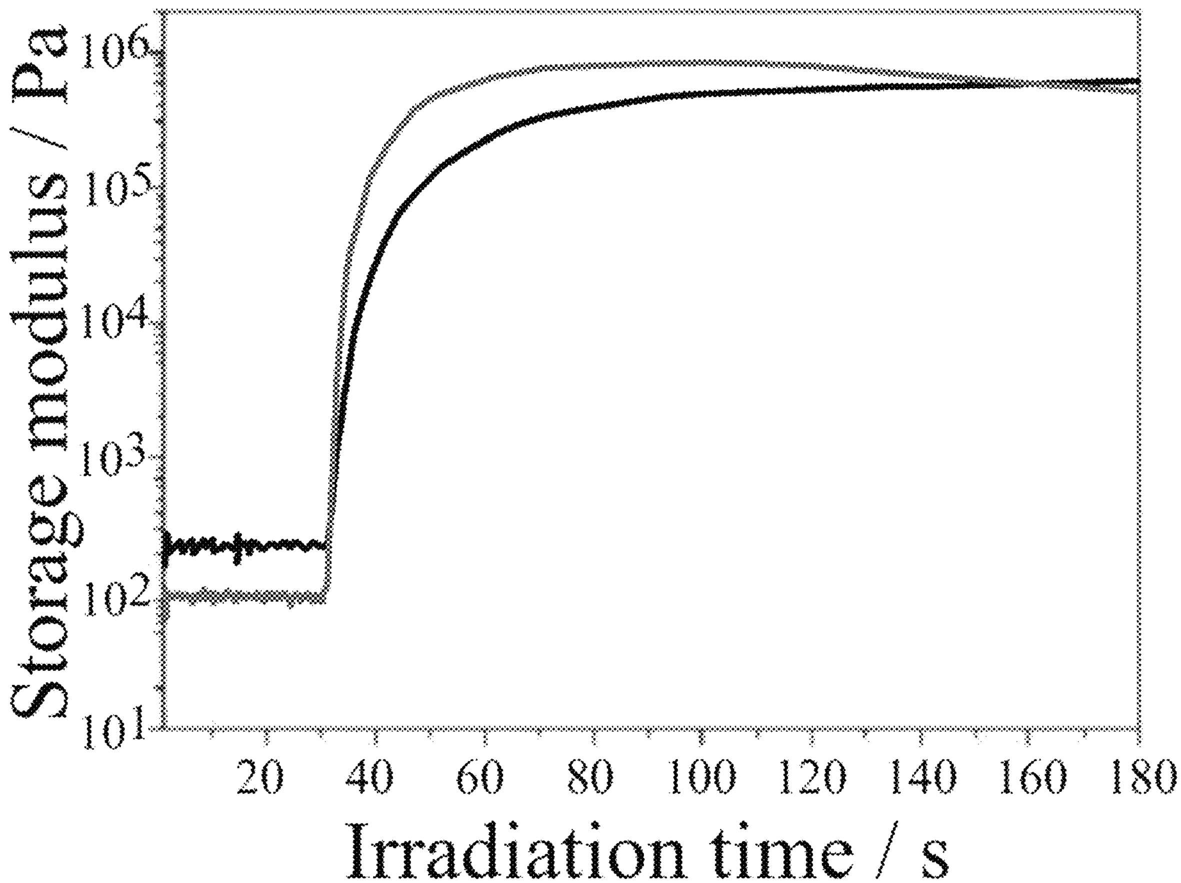
FIG. 8 is a graph of the storage modulus as a function of time during photopolymerization of PAA 0.5 equiv. DMAEMA salt solution with 1.5 wt. % TPO. Irradiation starts at 30 s. Commercial PAA (15 wt. % in NMP) served as starting material Black trace: PAA 0.5 equiv. DMAEMA salt solution in NMP, Grey trace: PAA 0.5 equiv. DMAEMA salt solution in NMP/H2O mixture 13:1.
Figure 9A:
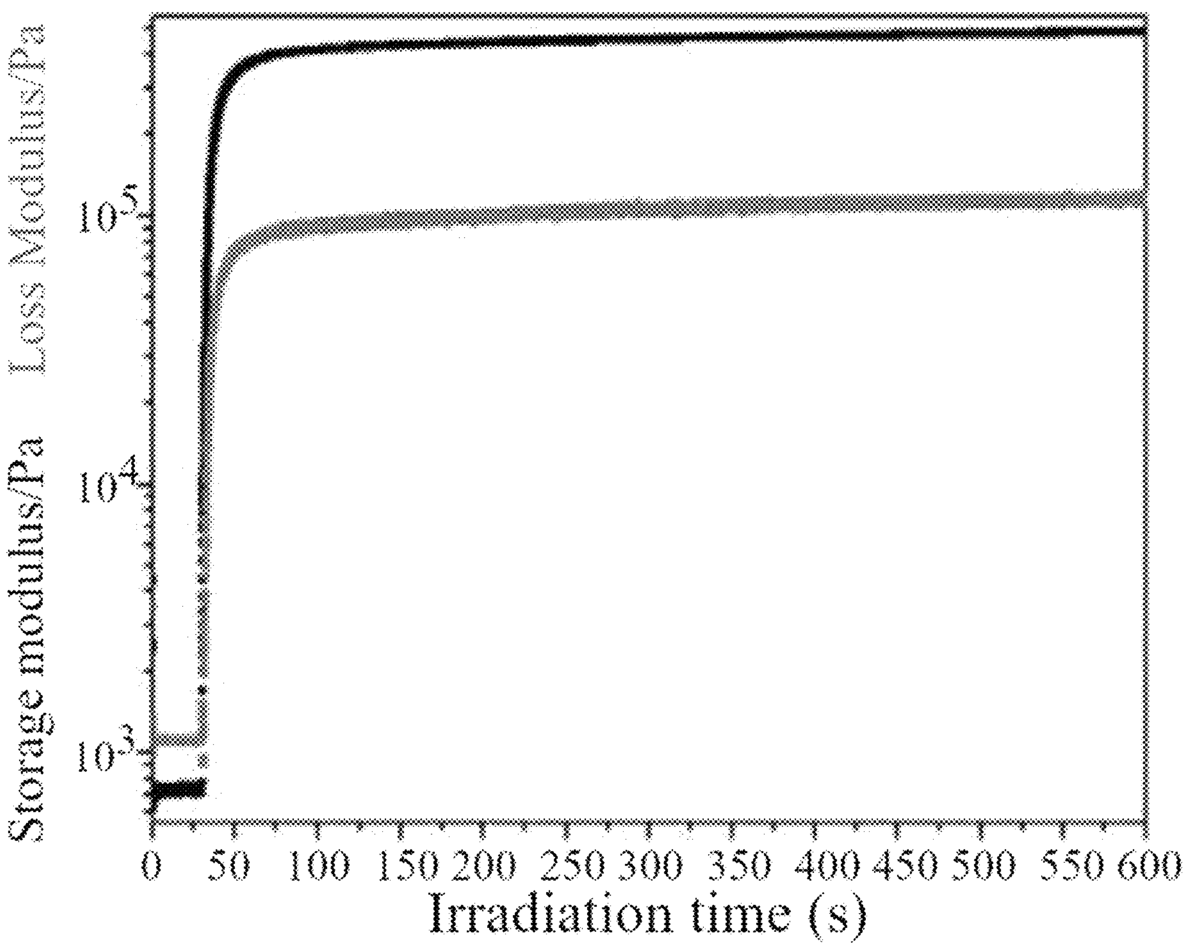
FIGS. 9A-9B are graphs of the storage and loss modulus from photorheology measurements as a function of time during UV exposure. Irradiation starts at 30 sec. Diphenyl (2,4,6-trimethylbenzoyl)phosphine oxide (TPO) was used as photoinitiator due to its solubility in NMP and light absorbance above 400 nm. All measurements were performed at 25° C. with 15 wt. % solids of PAA salt (1.1 eq DMAEA) in a NMP/H2O 13:1 mixture.
Figure 9B:
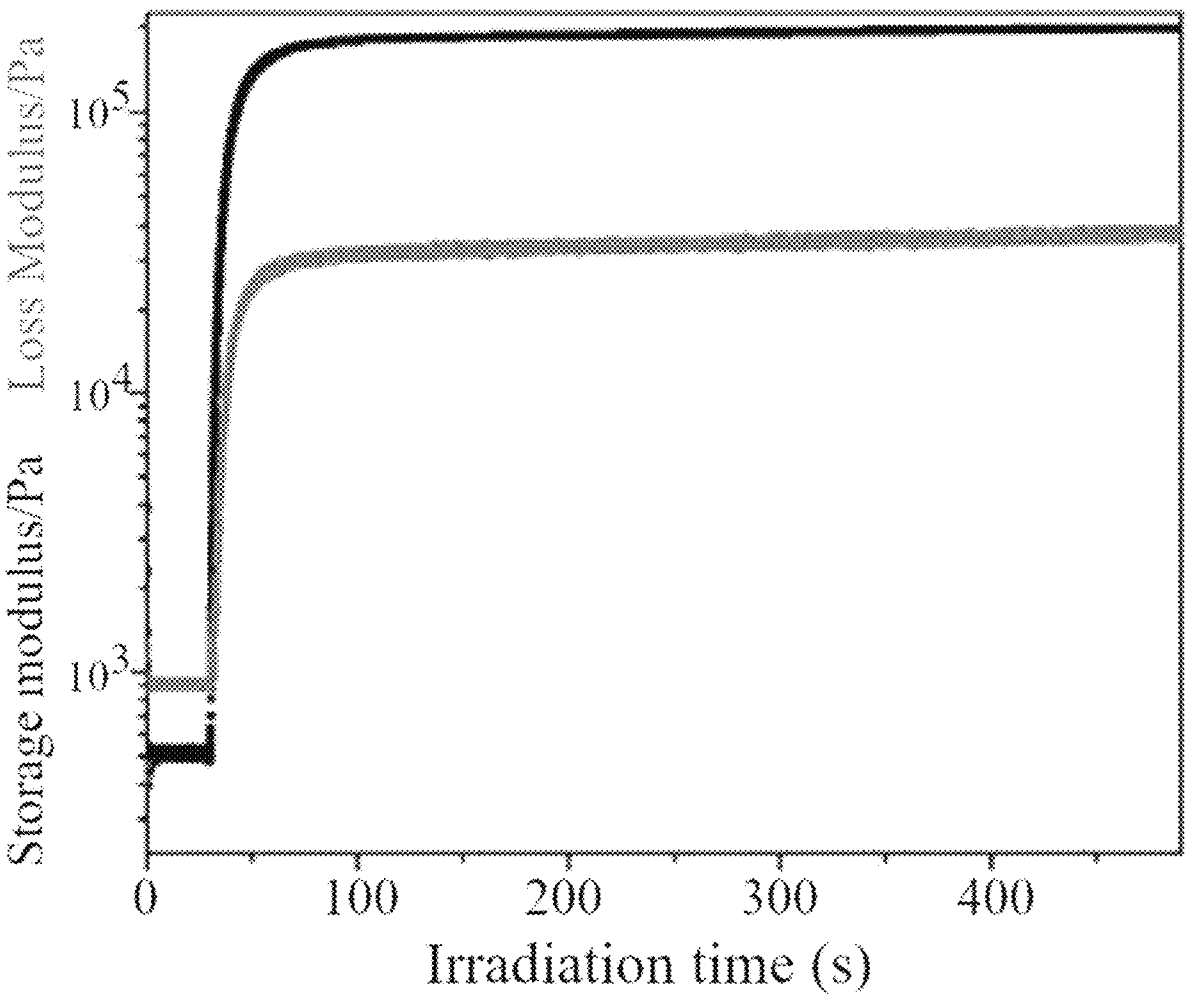
Figure 10A:
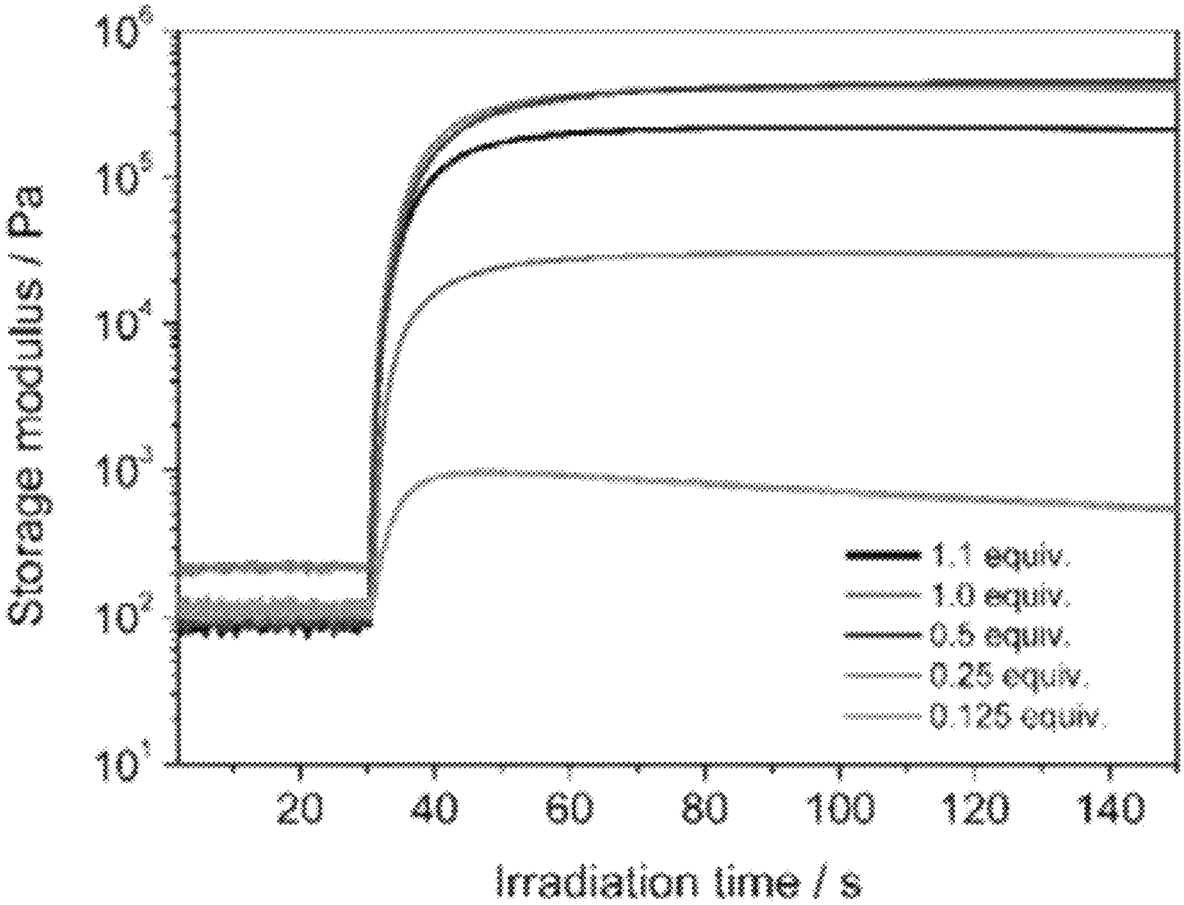
FIG. 10A is a graph of the storage modulus from photorheology measurements plotted versus irradiation time for PAA salts with varied DMAEA content DMAEA equivalents were calculated in respect lo the COOH group of the PAA. Irradiation starts at 30 sec. All measurements were performed at 25° C. with 20-25 wt. % solids of PAA salt in a NMP/H2O 13:1 mixture and 1.5 wt. % TPO as photoinitiator. Note that the PAA salt with 0.125 equiv. DMAEA showed no crossover.
Figure 10B:
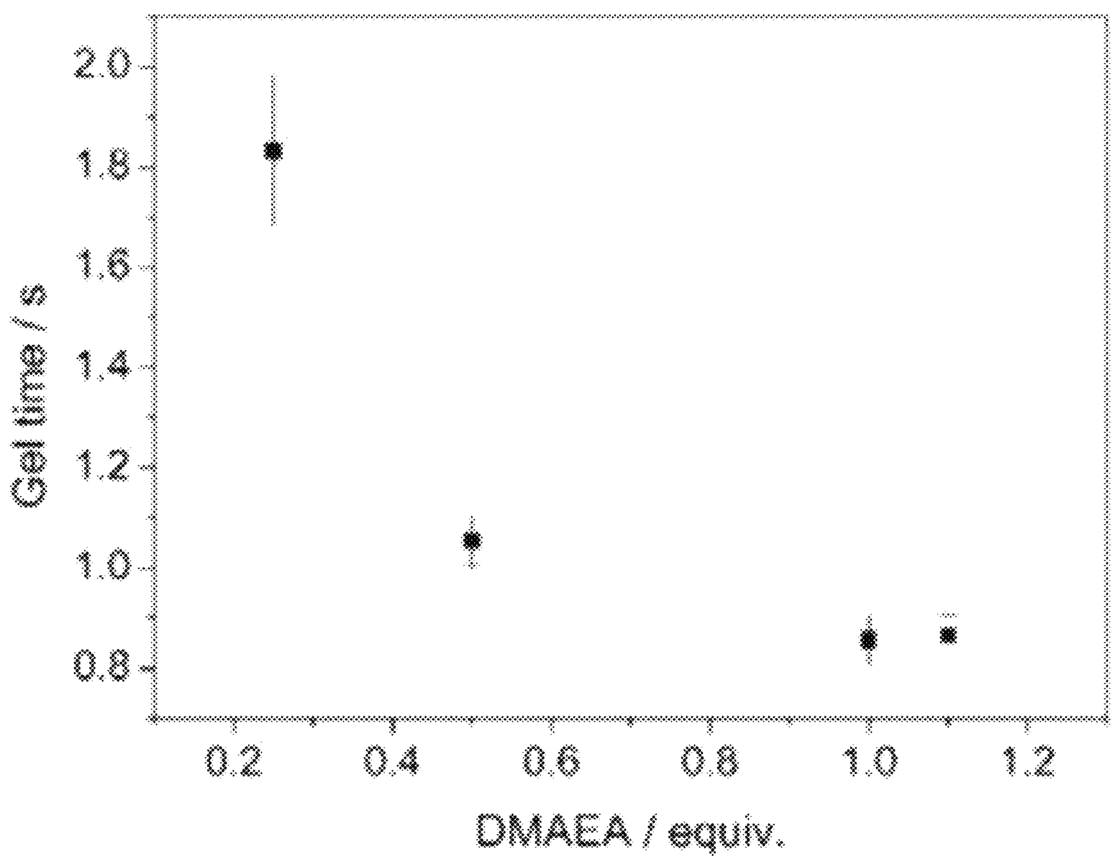
FIG. 10B is a plot of the respective crossover modulus versus DMAEA amount of PAA salt. DMAEA equivalents were calculated in respect to the COOH group of the PAA Measurements were repeated three times and errors were calculated from the standard deviation of the averaged values. The targeted molecular weight ($M_n$) of the PAA was 30 kDa.
Figure 11A:
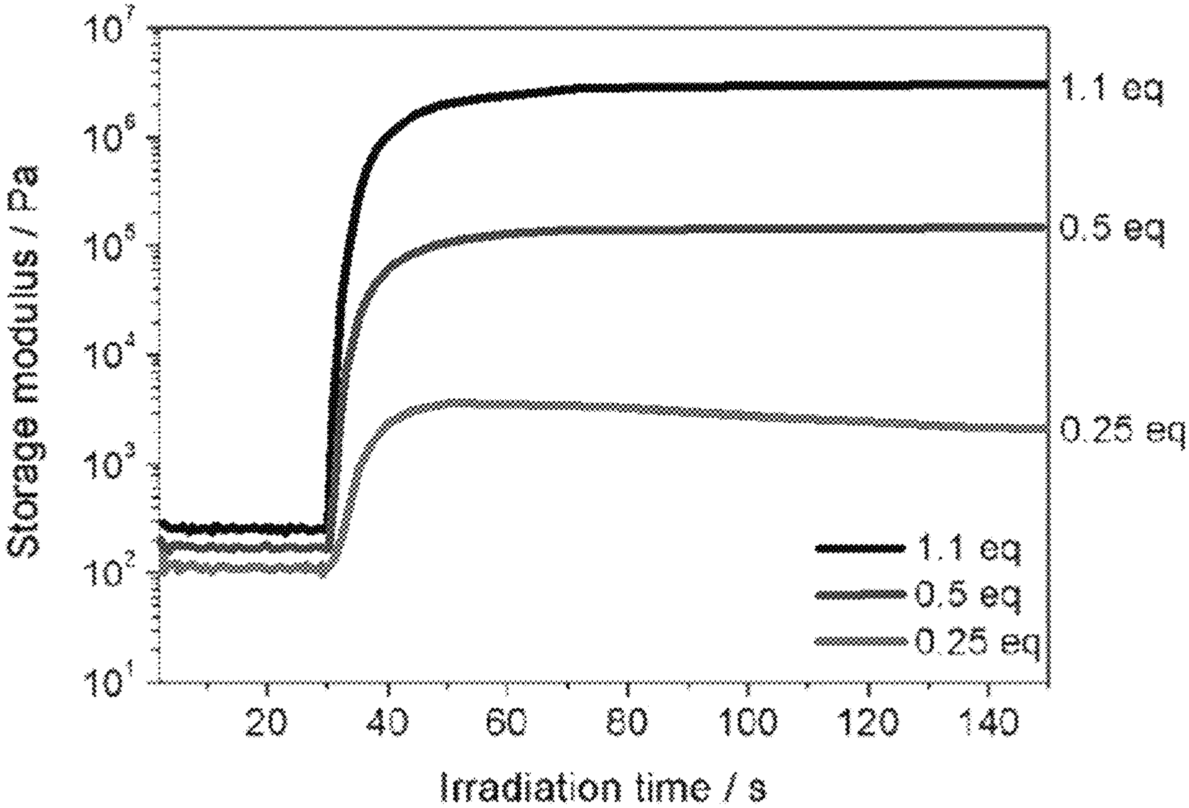
FIG. 11A is a graph of the storage modulus as a function of time during photopolymerization of PAA DMAEA salts. Irradiation starts at 30 s. Varied DMAEA amount of PAA DMAEA salts in NNIP/H2O mixture (7 v. % $H_2O$) with 1.5 wt. % TPO as photoinitiator. Commercial PAA (15 wt. %) served as starting material. DMAEA equivalents were calculated in respect to the COOH groups of PAA. The plateau modulus increases with increasing DMAEA equivalents.
Figure 11B:
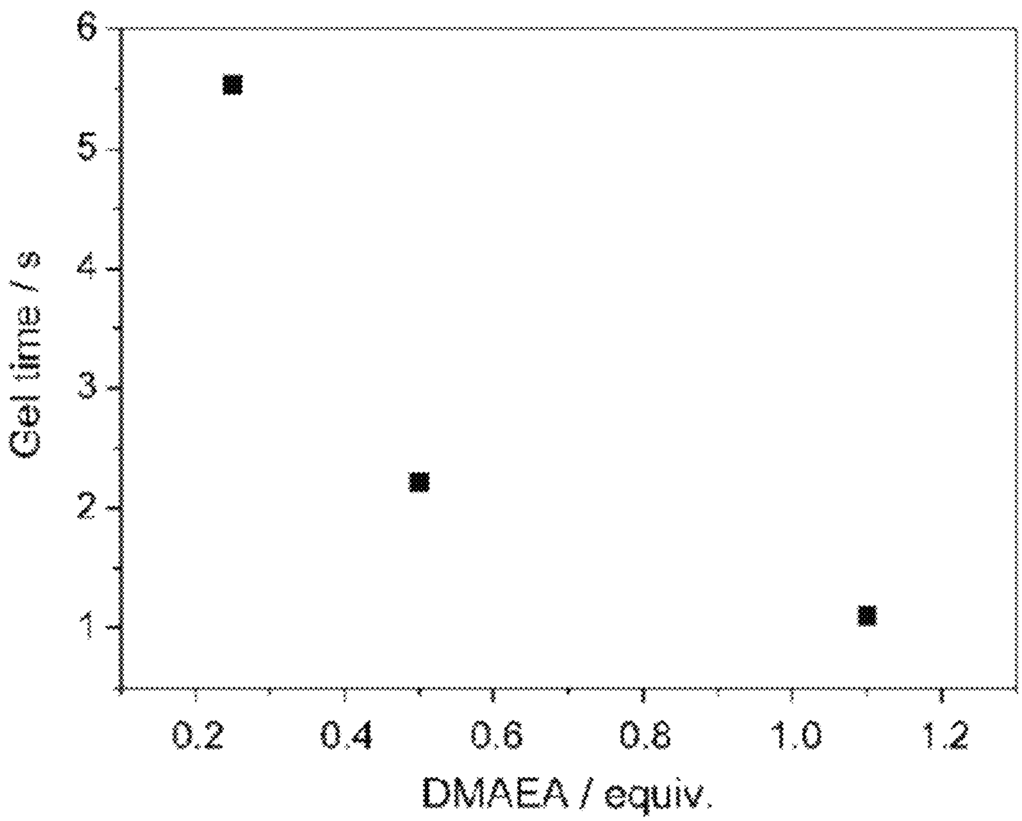
FIG. 11B is a plot of gel time versus DMAEA amount. The gel time was determined from photorheology studies, using the intersection of the loss and storage modulus. Measurements were performed in triplicates. Errors are calculated from the standard deviation of the averaged values.
Figure 12A:
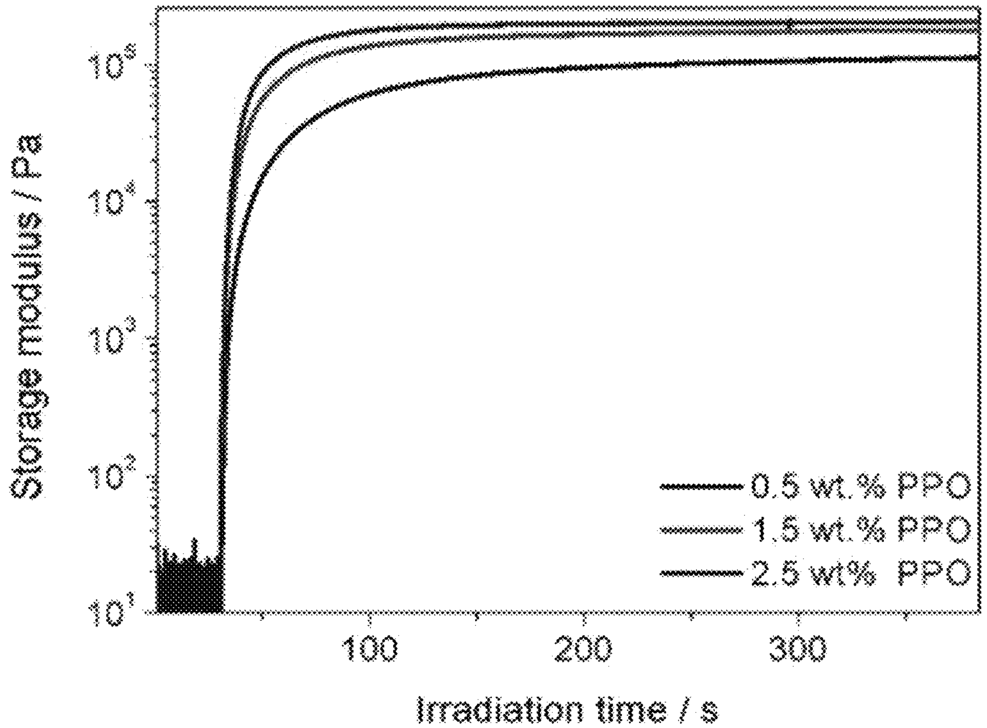
FIG. 12A is a graph of storage modulus as a function of time during photopolymerization of PAA 1.1 equiv. DMAEA salt solution (22 wt % in NNIP/H2O (13:1), Mn (PAA)=20 k·Da) with varied PPO amount. Irradiation starts after 30 s.
Figure 12B:
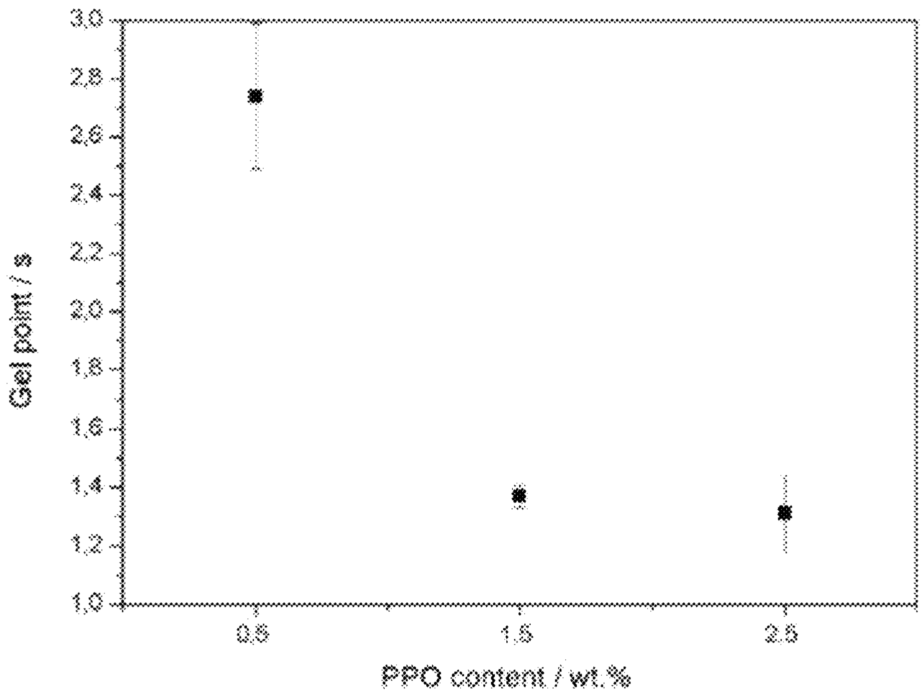
FIG. 12B is a plot of gel time versus PPO amount. Gel time was determined from the intersection of loss and storage modulus. PPO amount was calculated in respect to PAA+DMAEA.
Figure 13:
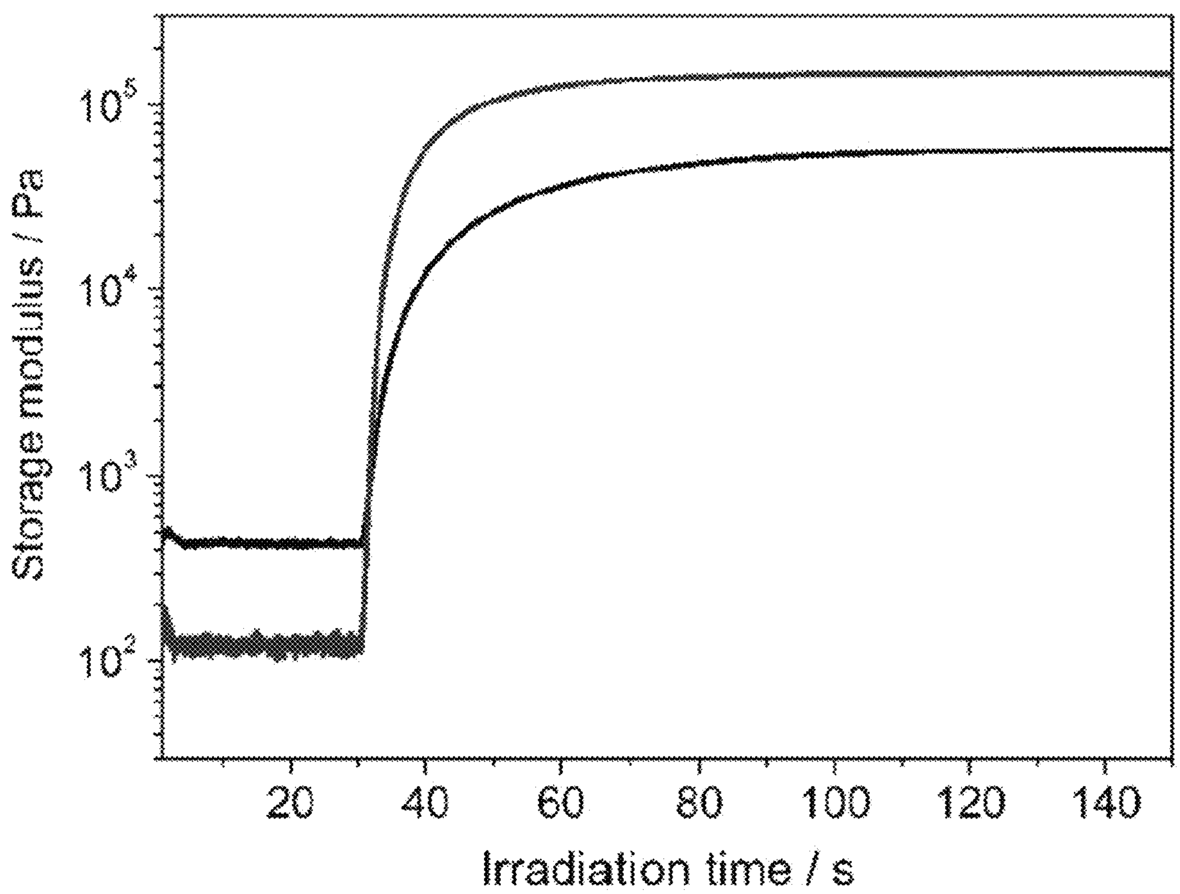
FIG. 13 is a graph of the storage modulus as a function of time during photopolymerization of PAA 0.5 equiv. DMAEA salt solution with 1.5 wt. % TPO. Irradiation starts after 30 s. Commercial PAA (15 wt. % in NMP) served as starting material Black trace: PAA O 0.5 equiv. DMAEA salt solution in NMP, Grey trace: PAA 0.5 equiv. DMAEA salt solution in a NMP/H2O mixture of 13:1.
Figure 14A:
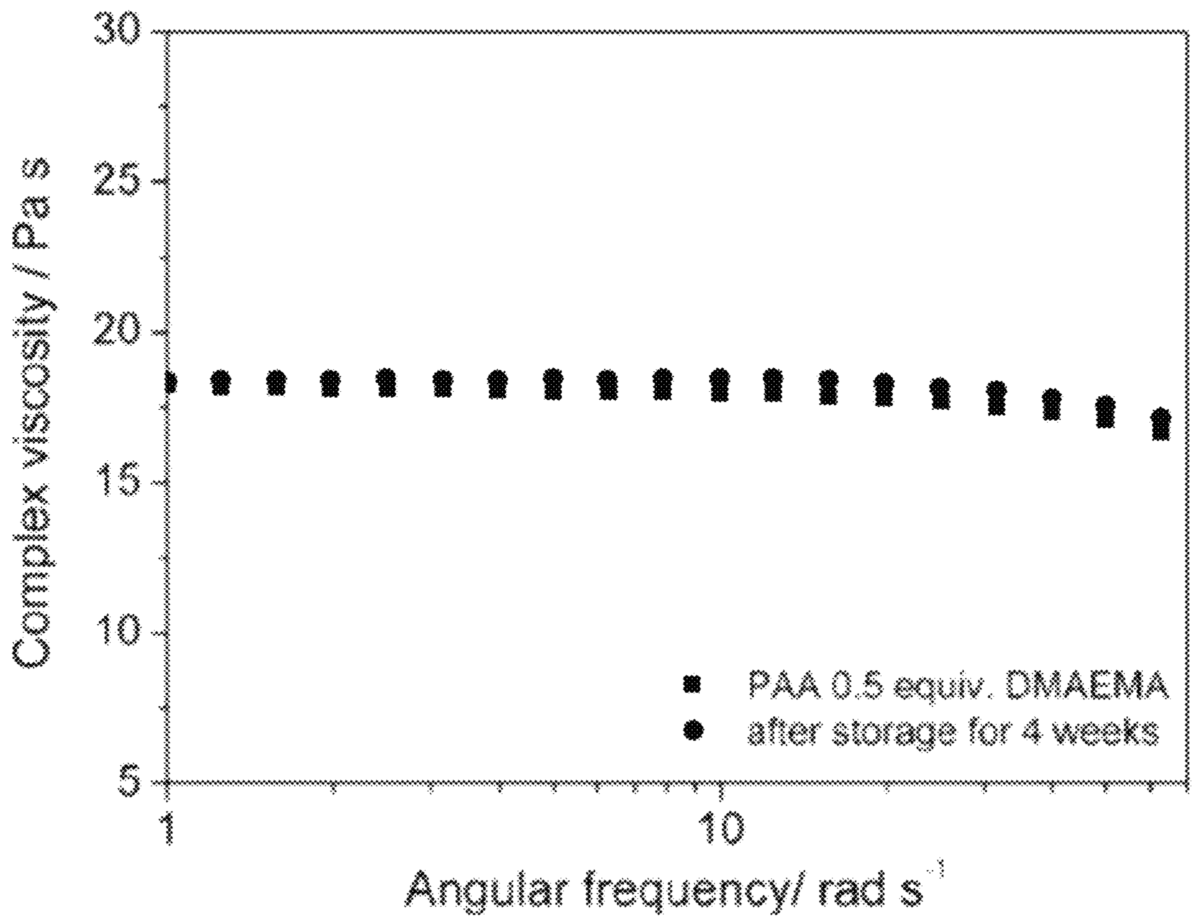
FIG. 14A is a graph of the complex viscosity (Pa·s) plotted versus angular frequency (rad·$s^{-1}$) for PAA 0.5 equiv. DMAEMA before (black trace) and after storage for 4 weeks (red trace).
Figure 14B:
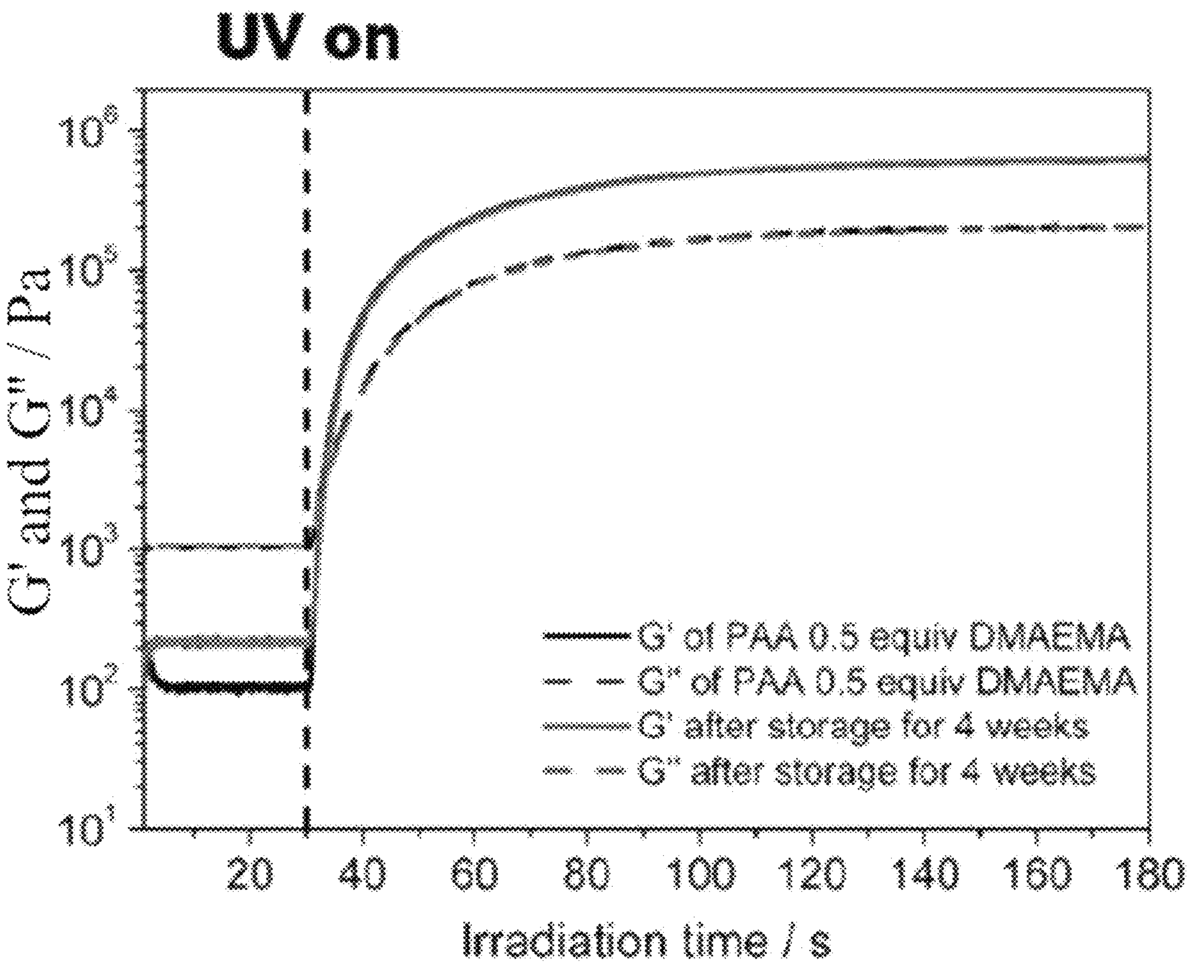
FIG. 14B is a graph of photorheology study of PAA 0.5 equiv. DMAEMA (1.5 wt. % TPO) before (black traces) and after storage for 4 weeks (grey traces). Irradiation starts at 30 s.
Figure 15:
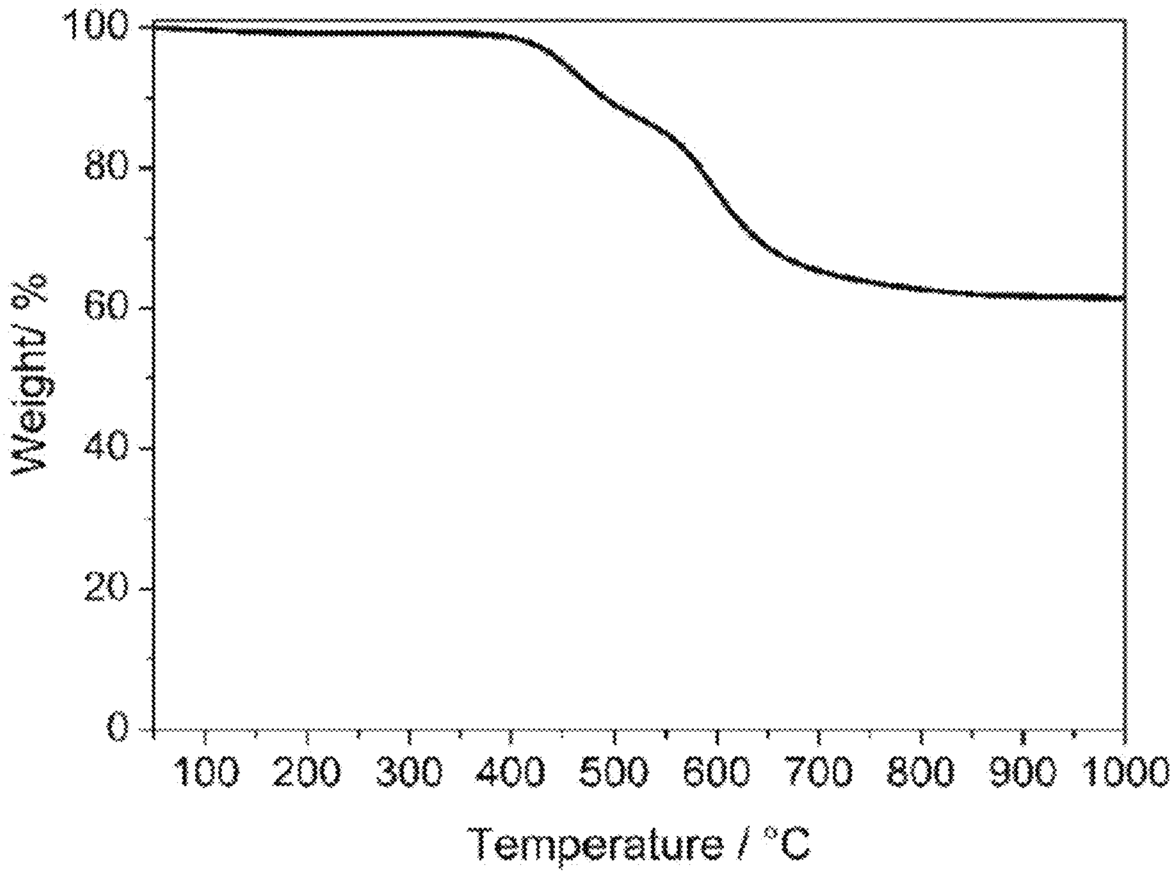
FIG. 15 is a TGA trace of imidized film from photorheology. Imidization was performed at 350° C. for 30 min under $N_2$.
Figure 16:
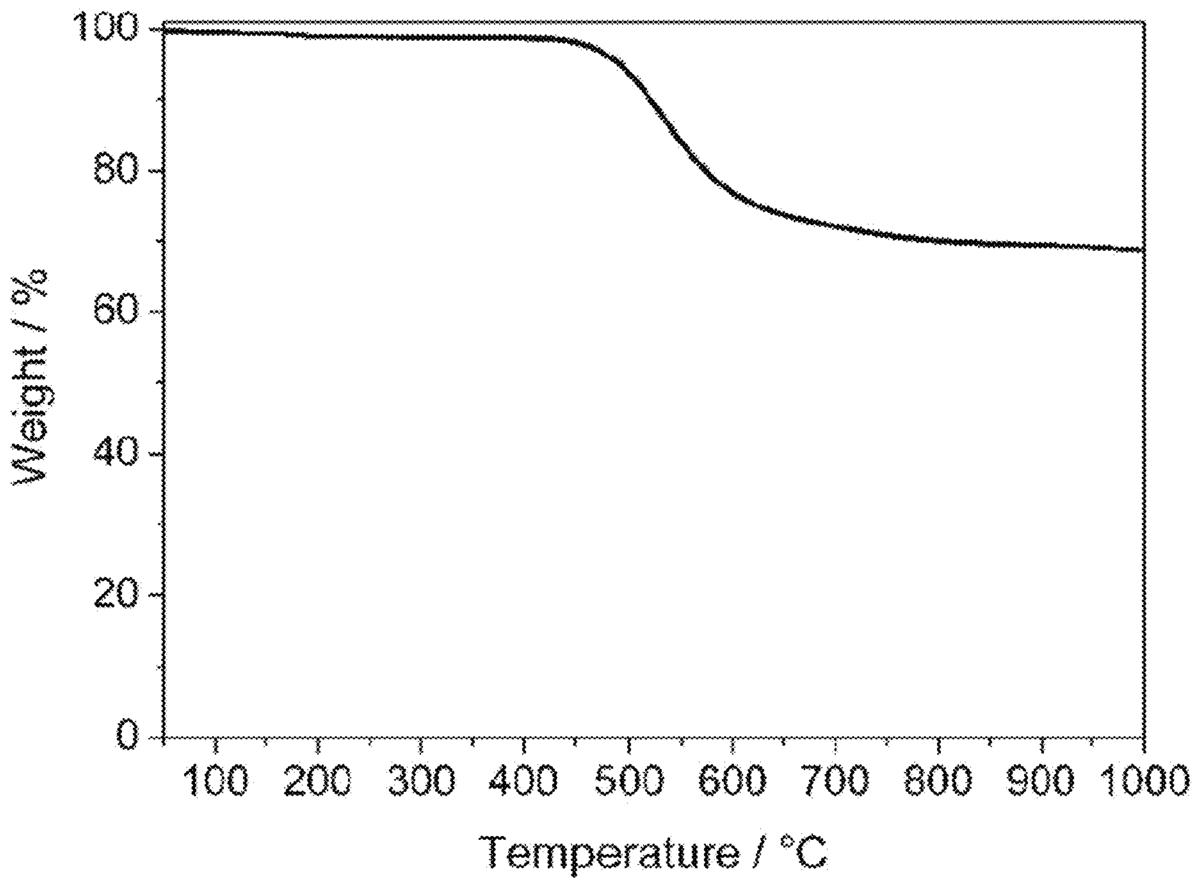
FIG. 16 is a TGA trace of imidized film from photorheology. Imidization was performed at 400° C. for 30 min under $N_2$.
Figure 17A:
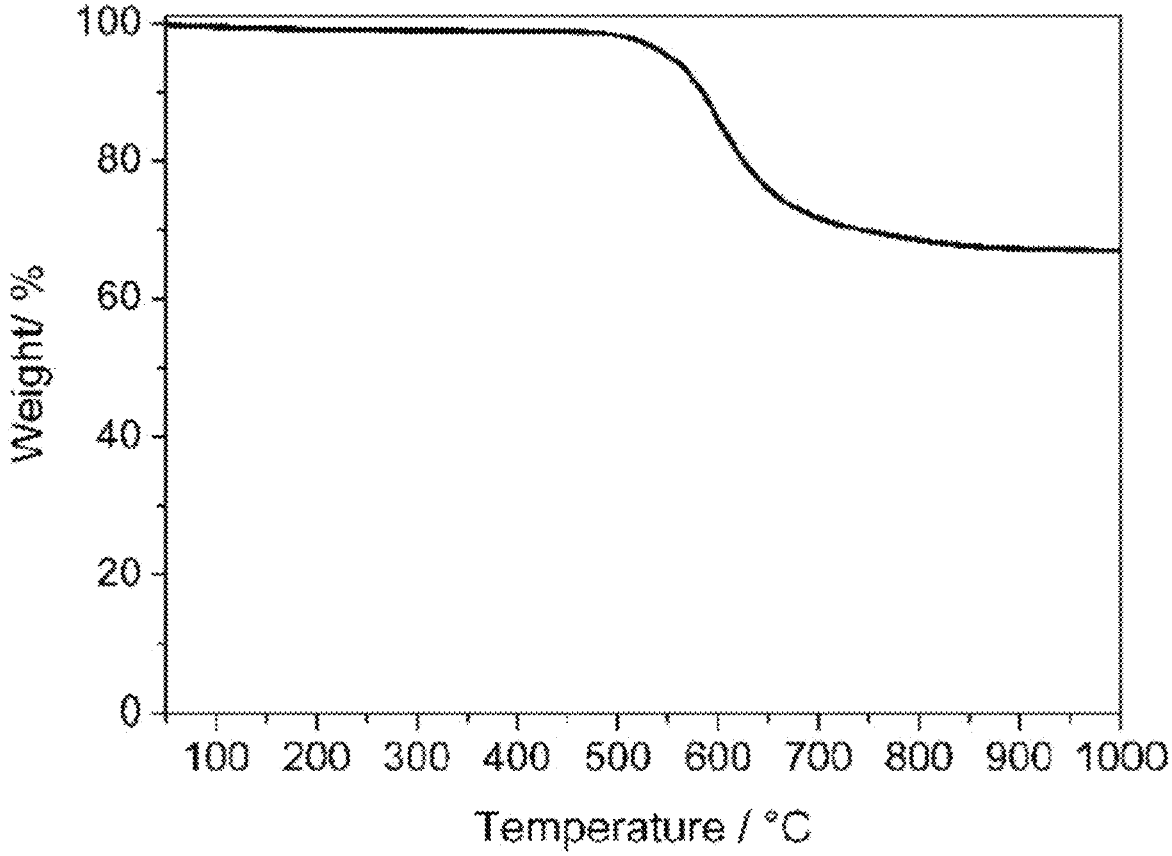
FIG. 17A is a TGA trace of imidized film from photorheology. Imidization was performed at 450° C. for 30 min under $N_2$. Thermal degradation $T_{d,5\,\%}$=550° C. is in analogy to PMDA-ODA polyimide.
Figure 17B:
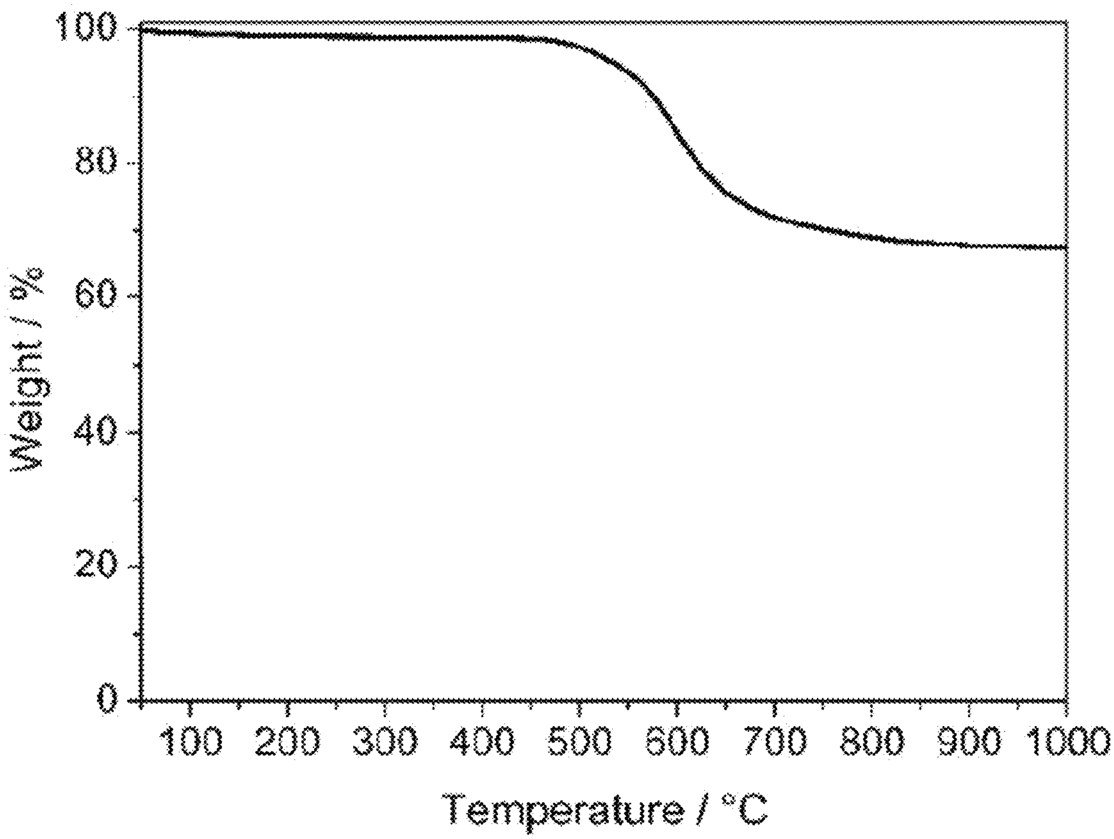
FIG. 17BA is a TGA trace of imidized film from photorheology. Imidization was performed at 425° C. for 30 min under $N_2$.
Figure 18:
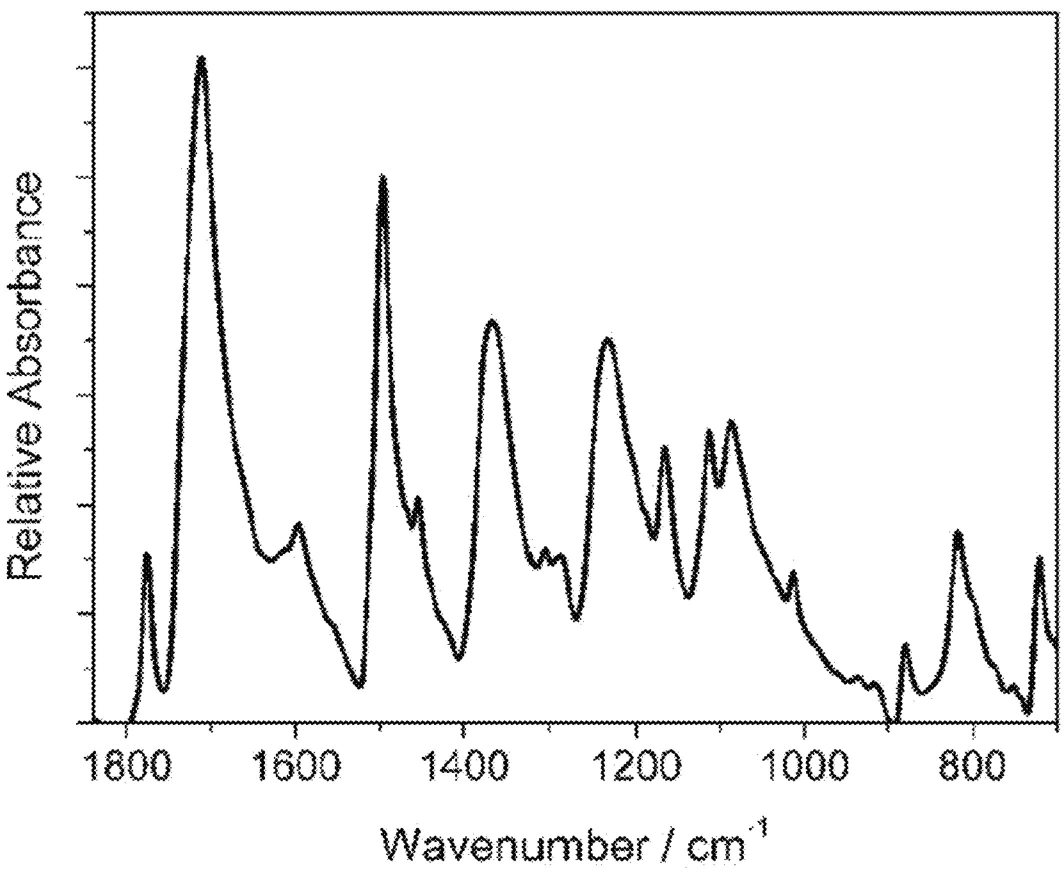
FIG. 18 is an FTIR of 3D printed polyimide after heating to 400° C. The spectrum shows the characteristic peaks of polyimides: 1774 $cm^{-1}$ (C═O stretch), 1712 $cm^{-1}$ (C═O stretch), 1496 $cm^{-1}$ (aromatic ring C═C stretch), 1367 $cm^{-1}$ (C—N stretch), 1230 $cm^{-1}$(C-0 stretch of di phenyl ether), 1086 $cm^{-1}$ and 720 $cm^{-1}$ (C—H bending and C═O bending, imide ring).

Only little is reported on SLA or UV-DIW of high-performance materials. One example is the 3D printing of ceramics. In particular, slurries of ceramic particles using a sacrificial photopolymer are prepared, 3D printed and post-processing sintering (>1000° C.) removes all polymeric material and generates the final object. [4] Regarding fully aromatic polyimides, traditional processing is based on a 2-step procedure, which restricts the geometry of the products to films (Scheme 1). In detail, a soluble polyamic acid is synthesized starting from a diamine and a dianhydride and subsequently casted on a substrate, followed by thermal imidization (–350° C.) to generate the final polyimide film/coating. Unfortunately, this method is not suitable for SLA or UV-DIW, due to the lack of photo-crosslinkable moieties.

Scheme 1. Conventional symthesis of an all-aromatic polyimide, exemplary shown for PMDA-ODA polyimide. 2-Step procedure allows for polyimide film and coatings.

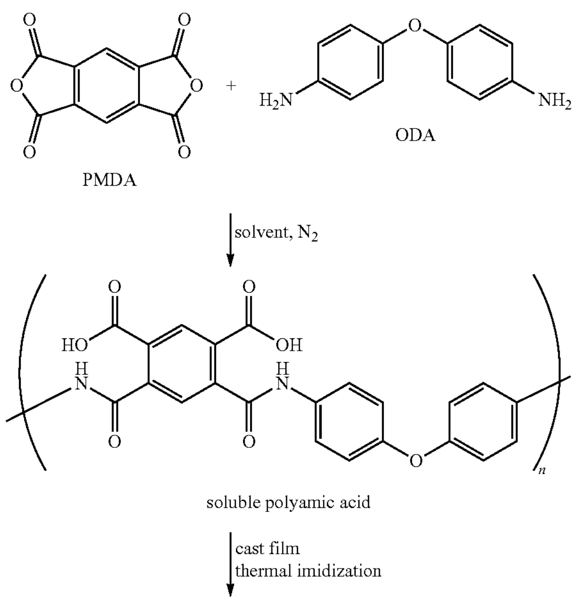

-continued

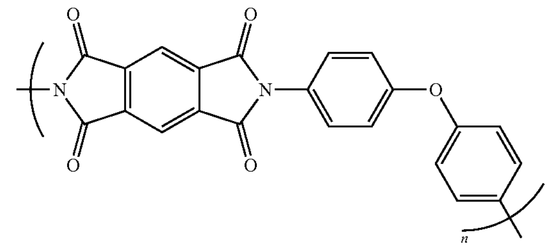

insoluble plolyimide (PMDA-ODA)

Recently, Long and co-workers reported the first homogenous 3D object made of Kapton, produced by SLA. [5] The authors prepared soluble acrylate-functional polyamic ester precursors as depicted in Scheme 2. The photo-curable acrylate groups enable 3D printing of the material using vat photopolymerization. After printing, a 3D organogel is obtained which is converted to a polyimide by drying and subsequent thermal treatment. In contrast, Guo et al. prepared soluble, fully imidized polyimide oligomers bearing acrylate groups along the polymer backbone as UV-crosslinkable precursors and printed the latter b direct light processing 3D printing.[6]

Scheme 2. Synthesis scheme of photo-crosslinkable polyamic ester precursor.[5]

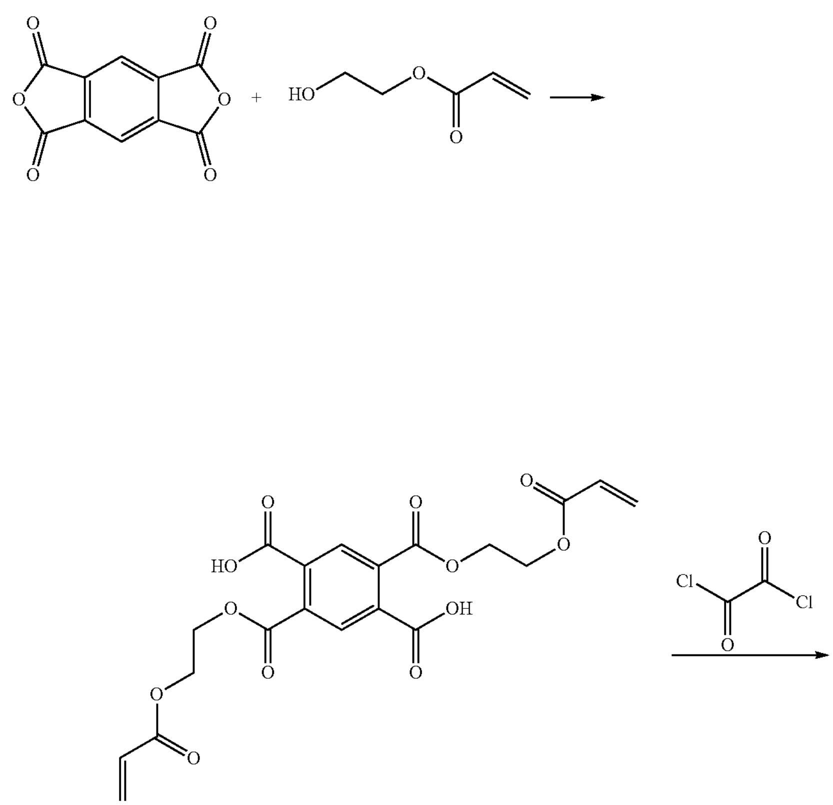

-continued

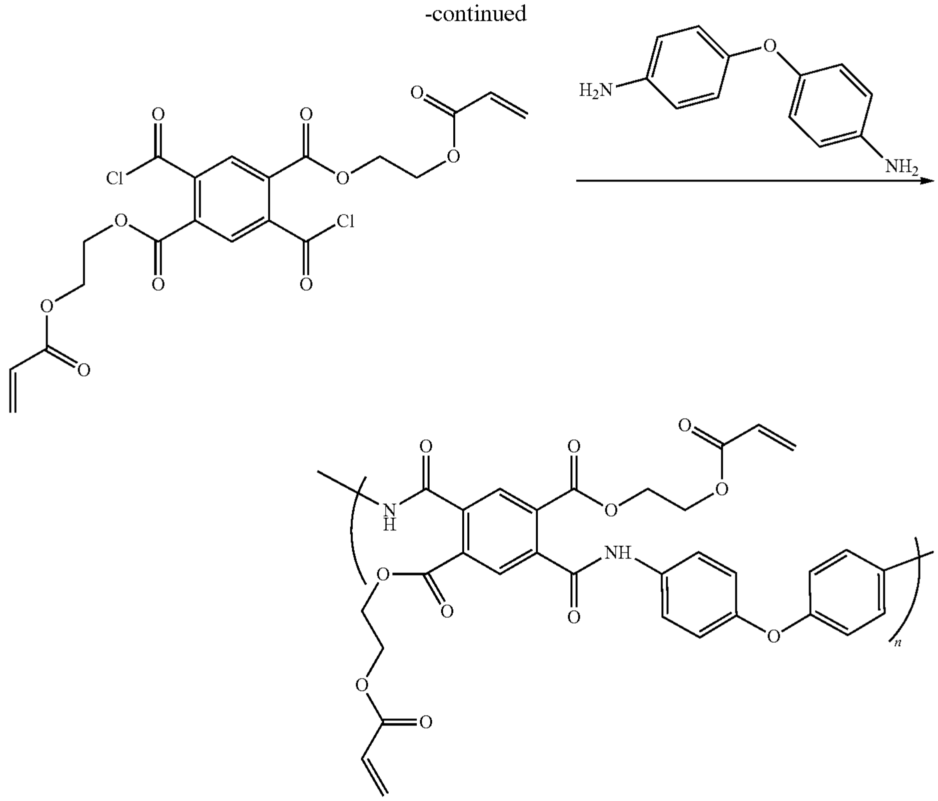

Presented herein are approaches and compositions that differ from the above-mentioned ones and avoids polyamic ester formation and does not require soluble polyimides. Here, the synthesis of soluble polyamic acid salts bearing crosslinkable units allows for photo-curing using SLA and generation of complex 3D shapes. Subsequent drying and thermal imidization of the 3D printed parts yield all-aromatic polyimides. By choosing the appropriate diamine monomers, polybenzoxazoles can also be synthesized using the same strategy. Similar approaches have been reported for 2D lithography, but have not been applied in SLA or to produce 3D objects. [7,8]

Although SLA is advantageous in some cases, there are some limitations to SLA. For example, SLA systems utilize vats filled with a resin that is subsequently selectively photo cured to produce a 3D object. Inherently, an excess of photocurable resin must be employed. Further, SLA does not readily allow for the production of multi-material parts. Ultraviolet-Assisted Direct Ink Write (UV-DIW) is an additive manufacturing method that is a subcategory of DIW, which utilizes UV-irradiation to cross-link extruded photopolymer resins during printing to induce gelation and shape retention after ink placement. Unlike SLA, UV-DIW does not use a vat of photo curable resin. Further, UV-DIW can utilize a wide range of viscoelastic materials with greater viscosities than can be utilized with inkjet material printing or SLA. However, there are relatively few available resins suitable of UV-DIW. Also described herein are the synthesis of soluble polyamic acid salts bearing crosslinkable units allows for photo-curing using UV-DIW and generation of complex 3D shapes.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting. The skilled artisan will recognize many variants and adaptations of the embodiments described herein. These variants and adaptations are intended to be included in the teachings of this disclosure.

All publications and patents cited in this specification are cited to disclose and describe the methods and/or materials in connection with which the publications are cited. All such publications and patents are herein incorporated by references as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant specification should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

Although any methods and materials similar or equivalent to those described herein can also be used in the practice or testing of the present disclosure, the preferred methods and materials are now described. Functions or constructions well-known in the art may not be described in detail for brevity and/or clarity. Embodiments of the present disclosure will employ, unless otherwise indicated, techniques of nanotechnology, organic chemistry, material science and engineering and the like, which are within the skill of the art. Such techniques are explained fully in the literature.

It should be noted that ratios, concentrations, amounts, and other numerical data can be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to about 5%" should be interpreted to include not only the explicitly recited values of about 0.1% to about 5%, but also include individual values (e.g., 1%, 2%, 3%, and 4%) and the sub-ranges (e.g., 0.5%, 1.1%, 2.2%, 3.3%, and 4.4%) within the indicated range. Where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In some embodiments, the term "about" can include traditional rounding according to significant figures of the numerical value. In addition, the phrase "about 'x' to 'y'", where 'x' and 'y' are numerical values, includes "about 'x' to about 'y'".

In some instances, units may be used herein that are non-metric or non-SI units. Such units may be, for instance, in U.S. Customary Measures, e.g., as set forth by the National Institute of Standards and Technology, Department of Commerce, United States of America in publications such as NIST HB 44, NIST HB 133, NIST SP 811, NIST SP 1038, NBS Miscellaneous Publication 214, and the like. The units in U.S. Customary Measures are understood to include equivalent dimensions in metric and other units (e.g., a dimension disclosed as "1 inch" is intended to mean an equivalent dimension of "2.5 cm"; a unit disclosed as "1 pcf" is intended to mean an equivalent dimension of 0.157 $kN/m^3$; or a unit disclosed 100° F. is intended to mean an equivalent dimension of 37.8° C.; and the like) as understood by a person of ordinary skill in the art.

Definitions

Unless defined otherwise, all technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

The articles "a" and "an," as used herein, mean one or more when applied to any feature in embodiments of the present invention described in the specification and claims. The use of "a" and "an" does not limit the meaning to a single feature unless such a limit is specifically stated. The article "the" preceding singular or plural nouns or noun phrases denotes a particular specified feature or particular specified features and may have a singular or plural connotation depending upon the context in which it is used.

The term "alkyl" refers to the radical of saturated aliphatic groups, including straight-chain alkyl groups, branched-chain alkyl groups, cycloalkyl (alicyclic) groups, alkyl-substituted cycloalkyl groups, and cycloalkyl-substituted alkyl groups.

In some embodiments, a straight chain or branched chain alkyl has 30 or fewer carbon atoms in its backbone (e.g., $C_1$-$C_{30}$ for straight chains, $C_3$-$C_{30}$ for branched chains), 20 or fewer, 12 or fewer, or 7 or fewer. Likewise, in some embodiments cycloalkyls have from 3-10 carbon atoms in their ring structure, e.g. have 5, 6 or 7 carbons in the ring structure. The term "alkyl" (or "lower alkyl") as used throughout the specification, examples, and claims is intended to include both "unsubstituted alkyls" and "substituted alkyls", the latter of which refers to alkyl moieties having one or more substituents replacing a hydrogen on one or more carbons of the hydrocarbon backbone. Such substituents include, but are not limited to, halogen, hydroxyl, carbonyl (such as a carboxyl, alkoxycarbonyl, formyl, or an acyl), thiocarbonyl (such as a thioester, a thioacetate, or a thioformate), alkoxyl, phosphoryl, phosphate, phosphonate, a hosphinate, amino, amido, amidine, imine, cyano, nitro, azido, sulfhydryl, alkylthio, sulfate, sulfonate, sulfamoyl, sulfonamido, sulfonyl, heterocyclyl, aralkyl, or an aromatic or heteroaromatic moiety.

Unless the number of carbons is otherwise specified, "lower alkyl" as used herein means an alkyl group, as defined above, but having from one to ten carbons, or from one to six carbon atoms in its backbone structure. Likewise, "lower alkenyl" and "lower alkynyl" have similar chain lengths. Throughout the application, preferred alkyl groups are lower alkyls. In some embodiments, a substituent designated herein as alkyl is a lower alkyl It will be understood by those skilled in the art that the moieties substituted on the hydrocarbon chain can themselves be substituted, if appropriate. For instance, the substituents of a substituted alkyl may include halogen, hydroxy, nitro, thiols, amino, azido, imino, amido, phosphoryl (including phosphonate and phosphinate), sulfonyl (including sulfate, sulfonamido, sulfamoyl and sulfonate), and silyl groups, as well as ethers, alkylthios, carbonyls (including ketones, aldehydes, carboxylates, and esters), —$CF_3$, —CN and the like. Cycloalkyls can be substituted in the same manner.

The term "heteroalkyl", as used herein, refers to straight or branched chain, or cyclic carbon-containing radicals, or combinations thereof, containing at least one heteroatom. Suitable heteroatoms include, but are not limited to, O, N, Si, P, Se, B, and S, wherein the phosphorous and sulfur atoms are optionally oxidized, and the nitrogen heteroatom is optionally quaternized. Heteroalkyls can be substituted as defined above for alkyl groups.

The term "alkylthio" refers to an alkyl group, as defined above, having a sulfur radical attached thereto. In some embodiments, the "alkylthio" moiety is represented by one of —S-alkyl, —S-alkenyl, and —S-alkynyl. Representative alkylthio groups include methylthio, and ethylthio. The term "alkylthio" also encompasses cycloalkyl groups, alkene and cycloalkene groups, and alkyne groups. "Arylthio" refers to aryl or heteroaryl groups. Alkylthio groups can be substituted as defined above for alkyl groups.

The terms "alkenyl" and "alkynyl", refer to unsaturated aliphatic groups analogous in length and possible substitution to the alkyls described above, but that contain at least one double or triple bond respectively.

The terms "alkoxyl" or "alkoxy" as used herein refers to an alkyl group, as defined above, having an oxygen radical attached thereto. Representative alkoxyl groups include methoxy, ethoxy, propyloxy, and tert-butoxy. An "ether" is two hydrocarbons covalently linked by an oxygen. Accordingly, the substituent of an alkyl that renders that alkyl an ether is or resembles an alkoxyl, such as can be represented by one of —O-alkyl, —O-alkenyl, and —O-alkynyl. Aroxy can be represented by —O-aryl or O-heteroaryl, wherein aryl and heteroaryl are as defined below. The alkoxy and aroxy groups can be substituted as described above for alkyl.

The terms "amine" and "amino" are art-recognized and refer to both unsubstituted and substituted amines, e.g., a moiety that can be represented by the general formula:

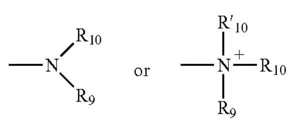

wherein $R_9$, $R_{10}$, and $R'_{10}$ each independently represent a hydrogen, an alkyl, an alkenyl, $—(CH_2)_m—R_8$ or $R_9$ and $R_{10}$ taken together with the N atom to which they are attached complete a heterocycle having from 4 to 8 atoms in the ring structure; $R_8$ represents an aryl, a cycloalkyl, a cycloalkenyl, a heterocycle or a polycycle; and m is zero or an integer in the range of 1 to 8. In some embodiments, only one of $R_9$ or $R_{10}$ can be a carbonyl, e.g., $R_9$, $R_{10}$ and the nitrogen together do not form an imide. In still other embodiments, the term "amine" does not encompass amides, e.g., wherein one of $R_9$ and $R_{10}$ represents a carbonyl. In additional embodiments, $R_9$ and $R_{10}$ (and optionally $R'_{10}$) each independently represent a hydrogen, an alkyl or cycloakly, an alkenyl or cycloalkenyl, or alkynyl. Thus, the term "alkylamine" as used herein means an amine group, as defined above, having a substituted (as described above for alkyl) or unsubstituted alkyl attached thereto, i.e., at least one of $R_9$ and $R_{10}$ is an alkyl group.

The term "amido" is art-recognized as an amino-substituted carbonyl and includes a moiety that can be represented by the general formula:

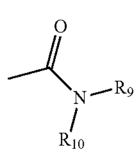

wherein $R_9$ and $R_{10}$ are as defined above.

"Aryl", as used herein, refers to $C_5$-$C_{10}$-membered aromatic, heterocyclic, fused aromatic, fused heterocyclic, biaromatic, or bihetereocyclic ring systems. Broadly defined, "aryl", as used herein, includes 5-, 6-, 7-, 8-, 9-, and 10-membered single-ring aromatic groups that may include from zero to four heteroatoms, for example, benzene, pyrrole, furan, thiophene, imidazole, oxazole, thiazole, triazole, pyrazole, pyridine, pyrazine, pyridazine and pyrimidine, and the like. Those aryl groups having heteroatoms in the ring structure may also be referred to as "aryl heterocycles" or "heteroaromatics". The aromatic ring can be substituted at one or more ring positions with one or more substituents including, but not limited to, halogen, azide, alkyl, aralkyl, alkenyl, alkynyl, cycloalkyl, hydroxyl, alkoxyl, amino (or quaternized amino), nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, $—CF_3$, —CN; and combinations thereof.

The term "aryl" also includes polycyclic ring systems having two or more cyclic rings in which two or more carbons are common to two adjoining rings (i.e., "fused rings") wherein at least one of the rings is aromatic, e.g., the other cyclic ring or rings can be cycloalkyls, cycloalkenyls, cycloalkynyls, aryls and/or heterocycles. Examples of heterocyclic rings include, but are not limited to, benzimidazolyl, benzofuranyl, benzothiofuranyl, benzothiophenyl, benzoxazolyl, benzoxazolinyl, benzthiazolyl, benztriazolyl, benztetrazolyl, benzisoxazolyl, benzisothiazolyl, benzimidazolinyl, carbazolyl, 4aH carbazolyl, carbolinyl, chromanyl, chromenyl, cinnolinyl, decahydroquinolinyl, 2H,6H-1,5,2-dithiazinyl, dihydrofuro[2,3 b]tetrahydrofuran, furanyl, furazanyl, imidazolidinyl, imidazolinyl, imidazolyl, 1H-indazolyl, indolenyl, indolinyl, indolizinyl, indolyl, 3H-indolyl, isatinoyl, isobenzofuranyl, isochromanyl, isoindazolyl, isoindolinyl, isoindolyl, isoquinolinyl, isothiazolyl, isoxazolyl, methylenedioxyphenyl, morpholinyl, naphthyridinyl, octahydroisoquinolinyl, oxadiazolyl, 1,2,3-oxadiazolyl, 1,2,4-oxadiazolyl, 1,2,5-oxadiazolyl, 1,3,4-oxadiazolyl, oxazolidinyl, oxazolyl, oxindolyl, pyrimidinyl, phenanthridinyl, phenanthrolinyl, phenazinyl, phenothiazinyl, phenoxathinyl, phenoxazinyl, phthalazinyl, piperazinyl, piperidinyl, piperidonyl, 4-piperidonyl, piperonyl, pteridinyl, purinyl, pyranyl, pyrazinyl, pyrazolidinyl, pyrazolinyl, pyrazolyl, pyridazinyl, pyridooxazole, pyridoimidazole, pyridothiazole, pyridinyl, pyridyl, pyrimidinyl, pyrrolidinyl, pyrrolinyl, 2H-pyrrolyl, pyrrolyl, quinazolinyl, quinolinyl, 4H-quinolizinyl, quinoxalinyl, quinuclidinyl, tetrahydrofuranyl, tetrahydroisoquinolinyl, tetrahydroquinolinyl, tetrazolyl, 6H-1,2,5-thiadiazinyl, 1,2,3-thiadiazolyl, 1,2,4-thiadiazolyl, 1,2,5-thiadiazolyl, 1,3,4-thiadiazolyl, thianthrenyl, thiazolyl, thienyl, thienothiazolyl, thienooxazolyl, thienoimidazolyl, thiophenyl and xanthenyl. One or more of the rings can be substituted as defined above for "aryl".

The term "aralkyl", as used herein, refers to an alkyl group substituted with an aryl group (e.g., an aromatic or heteroaromatic group).

The term "carbocycle", as used herein, refers to an aromatic or non-aromatic ring in which each atom of the ring is carbon.

"Heterocycle" or "heterocyclic", as used herein, refers to a cyclic radical attached via a ring carbon or nitrogen of a monocyclic or bicyclic ring containing 3-10 ring atoms, and preferably from 5-6 ring atoms, consisting of carbon and one to four heteroatoms each selected from the group consisting of non-peroxide oxygen, sulfur, and N(Y) wherein Y is absent or is H, O, ($C_1$-$C_{10}$) alkyl, phenyl or benzyl, and optionally containing 1-3 double bonds and optionally substituted with one or more substituents. Examples of heterocyclic ring include, but are not limited to, benzimidazolyl, benzofuranyl, benzothiofuranyl, benzothiophenyl, benzoxazolyl, benzoxazolinyl, benzthiazolyl, benztriazolyl, benztetrazolyl, benzisoxazolyl, benzisothiazolyl, benzimidazolinyl, carbazolyl, 4aH-carbazolyl, carbolinyl, chromanyl, chromenyl, cinnolinyl, decahydroquinolinyl, 2H,6H-1,5,2-dithiazinyl, dihydrofuro[2,3-b]tetrahydrofuran, furanyl, furazanyl, imidazolidinyl, imidazolinyl, imidazolyl, 1H-indazolyl, indolenyl, indolinyl, indolizinyl, indolyl, 3H-indolyl, isatinoyl, isobenzofuranyl, isochromanyl, isoindazolyl, isoindolinyl, isoindolyl, isoquinolinyl, isothiazolyl, isoxazolyl, methylenedioxyphenyl, morpholinyl, naphthyridinyl, octahydroisoquinolinyl, oxadiazolyl, 1,2,3-oxadiazolyl, 1,2,4-oxadiazolyl, 1,2,5-oxadiazolyl, 1,3,4-oxadiazolyl, oxazolidinyl, oxazolyl, oxepanyl, oxetanyl, oxindolyl, pyrimidinyl, phenanthridinyl, phenanthrolinyl, phenazinyl, phenothiazinyl, phenoxathinyl, phenoxazinyl, phthalazinyl, piperazinyl, piperidinyl, piperidonyl, 4-piperidonyl, piperonyl, pteridinyl, purinyl, pyranyl, pyrazinyl, pyrazolidinyl, pyrazolinyl, pyrazolyl, pyridazinyl, pyridooxazole, pyridoimidazole, pyridothiazole, pyridinyl, pyridyl, pyrimidinyl, pyrrolidinyl, pyrrolinyl, 2H-pyrrolyl, pyrrolyl, quinazolinyl, quinolinyl, 4H-quinolizinyl, quinoxalinyl, quinuclidinyl, tetrahydrofuranyl, tetrahydroisoquinolinyl, tetrahydropyranyl, tetrahydroquinolinyl, tetrazolyl, 6H-1,2,5-thiadiazinyl, 1,2,3-thiadiazolyl, 1,2,4-thiadiazolyl, 1,2,5-thiadiazolyl, 1,3,4-thiadiazolyl, thianthrenyl, thiazolyl, thienyl, thienothiazolyl, thienooxazolyl, thienoimidazolyl, thiophenyl and xanthenyl. Heterocyclic groups can optionally be substituted with one or more substituents at one or more positions as defined above for alkyl and aryl, for example, halogen, alkyl, aralkyl, alkenyl, alkynyl, cycloalkyl, hydroxyl, amino, nitro, sulfhydryl, imino, amido, phosphate, phosphonate, phosphinate, carbonyl, carboxyl, silyl, ether, alkylthio, sulfonyl, ketone, aldehyde, ester, a heterocyclyl, an aromatic or heteroaromatic moiety, —CF3, and —CN.

The term "carbonyl" is art-recognized and includes such moieties as can be represented by the general formula:

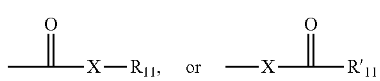

wherein X is a bond or represents an oxygen or a sulfur, and $R_{11}$ represents a hydrogen, an alkyl, a cycloalkyl, an alkenyl, an cycloalkenyl, or an alkynyl, $R'_{11}$ represents a hydrogen, an alkyl, a cycloalkyl, an alkenyl, an cycloalkenyl, or an alkynyl. Where X is an oxygen and $R_{11}$ or $R'_{11}$ is not hydrogen, the formula represents an "ester". Where X is an oxygen and $R_{11}$ is as defined above, the moiety is referred to herein as a carboxyl group, and particularly when $R_{11}$ is a hydrogen, the formula represents a "carboxylic acid". Where X is an oxygen and $R'_{11}$ is hydrogen, the formula represents a "formate". In general, where the oxygen atom of the above formula is replaced by sulfur, the formula represents a "thiocarbonyl" group. Where X is a sulfur and $R_{11}$ or $R'_{11}$ is not hydrogen, the formula represents a "thioester." Where X is a sulfur and $R_{11}$ is hydrogen, the formula represents a "thiocarboxylic acid." Where X is a sulfur and $R'_{11}$ is hydrogen, the formula represents a "thioformate." On the other hand, where X is a bond, and $R_{11}$ is not hydrogen, the above formula represents a "ketone" group. Where X is a bond, and $R_{11}$ is hydrogen, the above formula represents an "aldehyde" group.

The term "monoester" as used herein refers to an analogue of a dicarboxylic acid wherein one of the carboxylic acids is functionalized as an ester and the other carboxylic acid is a free carboxylic acid or salt of a carboxylic acid. Examples of monoesters include, but are not limited to, to monoesters of succinic acid, glutaric acid, adipic acid, suberic acid, sebacic acid, azelaic acid, oxalic and maleic acid.

The term "heteroatom" as used herein means an atom of any element other than carbon or hydrogen. Examples of heteroatoms are boron, nitrogen, oxygen, phosphorus, sulfur and selenium. Other heteroatoms include silicon and arsenic.

As used herein, the term "nitro" means $—NO_2$; the term "halogen" designates —F, —Cl, —Br or —I; the term "sulfhydryl" means —SH; the term "hydroxyl" means —OH; and the term "sulfonyl" means $—SO_2—$.

The term "substituted" as used herein, refers to all permissible substituents of the compounds described herein. In the broadest sense, the permissible substituents include acyclic and cyclic, branched and unbranched, carbocyclic and heterocyclic, aromatic and nonaromatic substituents of organic compounds. Illustrative substituents include, but are not limited to, halogens, hydroxyl groups, or any other organic groupings containing any number of carbon atoms, preferably 1-14 carbon atoms, and optionally include one or more heteroatoms such as oxygen, sulfur, or nitrogen grouping in linear, branched, or cyclic structural formats. Representative substituents include alkyl, substituted alkyl, alkenyl, substituted alkenyl, alkynyl, substituted alkynyl, phenyl, substituted phenyl, aryl, substituted aryl, heteroaryl, substituted heteroaryl, halo, hydroxyl, alkoxy, substituted alkoxy, phenoxy, substituted phenoxy, aroxy, substituted aroxy, alkylthio, substituted alkylthio, phenylthio, substituted phenylthio, arylthio, substituted arylthio, cyano, isocyano, substituted isocyano, carbonyl, substituted carbonyl, carboxyl, substituted carboxyl, amino, substituted amino, amido, substituted amido, sulfonyl, substituted sulfonyl, sulfonic acid, phosphoryl, substituted phosphoryl, phosphonyl, substituted phosphonyl, polyaryl, substituted polyaryl, $C_3$-$C_{20}$ cyclic, substituted $C_3$-$C_{20}$ cyclic, heterocyclic, substituted heterocyclic, aminoacid, peptide, and polypeptide groups.

Heteroatoms such as nitrogen may have hydrogen substituents and/or any permissible substituents of organic compounds described herein which satisfy the valences of the heteroatoms. It is understood that "substitution" or "substituted" includes the implicit proviso that such substitution is in accordance with permitted valence of the substituted atom and the substituent, and that the substitution results in a stable compound, i.e. a compound that does not spontaneously undergo transformation such as by rearrangement, cyclization, elimination, etc.

In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. The heteroatoms such as nitrogen may have hydrogen substituents and/or any permissible substituents of organic compounds described herein which satisfy the valencies of the heteroatoms.

In various aspects, the substituent is selected from alkoxy, aryloxy, alkyl, alkenyl, alkynyl, amide, amino, aryl, arylalkyl, carbamate, carboxy, cyano, cycloalkyl, ester, ether, formyl, halogen, haloalkyl, heteroaryl, heterocyclyl, hydroxyl, ketone, nitro, phosphate, sulfide, sulfinyl, sulfonyl, sulfonic acid, sulfonamide, and thioketone, each of which optionally is substituted with one or more suitable substituents. In some embodiments, the substituent is selected from alkoxy, aryloxy, alkyl, alkenyl, alkynyl, amide, amino, aryl, arylalkyl, carbamate, carboxy, cycloalkyl, ester, ether, formyl, haloalkyl, heteroaryl, heterocyclyl, ketone, phosphate, sulfide, sulfinyl, sulfonyl, sulfonic acid, sulfonamide, and thioketone, wherein each of the alkoxy, aryloxy, alkyl, alkenyl, alkynyl, amide, amino, aryl, arylalkyl, carbamate, carboxy, cycloalkyl, ester, ether, formyl, haloalkyl, heteroaryl, heterocyclyl, ketone, phosphate, sulfide, sulfinyl, sulfonyl, sulfonic acid, sulfonamide, and thioketone can be further substituted with one or more suitable substituents.

Examples of substituents include, but are not limited to, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, thioketone, ester, heterocyclyl, —CN, aryl, aryloxy, perhaloalkoxy, aralkoxy, heteroaryl, heteroaryloxy, heteroarylalkyl, heteroaralkoxy, azido, alkylthio, oxo, acylalkyl, carboxy esters, carboxamido, acyloxy, aminoalkyl, alkylaminoaryl, alkylaryl, alkylaminoalkyl, alkoxyaryl, arylamino, aralkylamino, alkylsulfonyl, carboxamidoalkylaryl, carboxamidoaryl, hydroxyalkyl, haloalkyl, alkylaminoalkylcarboxy, aminocarboxamidoalkyl, cyano, alkoxyalkyl, perhaloalkyl, arylalkyloxyalkyl, and the like. In some embodiments, the substituent is selected from cyano, halogen, hydroxyl, and nitro.

The term "copolymer" as used herein, generally refers to a single polymeric material that is comprised of two or more different monomers. The copolymer can be of any form, such as random, block, graft, etc. The copolymers can have any end-group, including capped or acid end groups.

The terms "mean particle size" and "average particle size," as used interchangeably herein, generally refer to the statistical mean particle size (diameter) of the particles in the composition.

The terms "mean pore size" and "average pore size," as used interchangeably herein, generally refer to the statistical mean pore size (diameter) of the pores in a porous material.

The terms "monodisperse" and "homogeneous size distribution", as used interchangeably herein, describe a population of particles or pores all having the same or nearly the same size. As used herein, a monodisperse distribution refers to distributions in which 90% of the particles or pores in the distribution have a size that lies within 5% of the mean size for the distribution.

As used herein, the term "linker" refers to a carbon chain that can contain heteroatoms (e.g., nitrogen, oxygen, sulfur, etc.) and which may be 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50 atoms long. Linkers may be substituted with various substituents including, but not limited to, hydrogen atoms, alkyl, alkenyl, alkynl, amino, alkylamino, dialkylamino, trialkylamino, hydroxyl, alkoxy, halogen, aryl, heterocyclic, aromatic heterocyclic, cyano, amide, carbamoyl, carboxylic acid, ester, thioether, alkylthioether, thiol, and ureido groups. Those of skill in the art will recognize that each of these groups may in turn be substituted. Examples of linkers include, but are not limited to, pH-sensitive linkers, protease cleavable peptide linkers, nuclease sensitive nucleic acid linkers, lipase sensitive lipid linkers, glycosidase sensitive carbohydrate linkers, hypoxia sensitive linkers, photo-cleavable linkers, heat-labile linkers, enzyme cleavable linkers (e.g., esterase cleavable linker), ultrasound-sensitive linkers, and x-ray cleavable linkers.

Polymer Resins

A variety of compositions are provided suitable for additive manufacturing, e.g. stereolithographic printing, resin printing, 3D printing, vat photopolymerization or UV-DIW as the terms are used essentially interchangeably herein. In particular a variety of polymeric resins are provided suitable for the stereolithographic printing of thermoplastics, e.g. aromatic and insoluble thermoplastics with exceptional thermal stability and mechanical properties.

In some aspects, a polymer resin for vat photopolymerization or UV-DIW is provided including a polyamic acid salt comprising repeat units having a structure according to the following formula

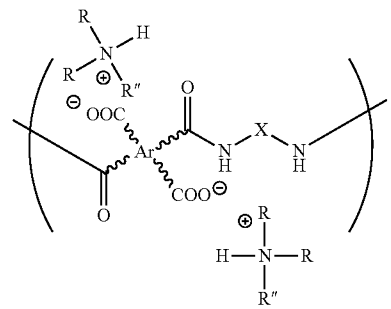

where each occurrence of R" comprises a photocrosslinkable group; where each occurrence of R is independently selected from the group consisting of H, substituted and unsubstituted alkyl, substituted and unsubstituted heteroalkyl, and substituted and unsubstituted alkenyl; where each occurrence of Ar is independently selected from the group

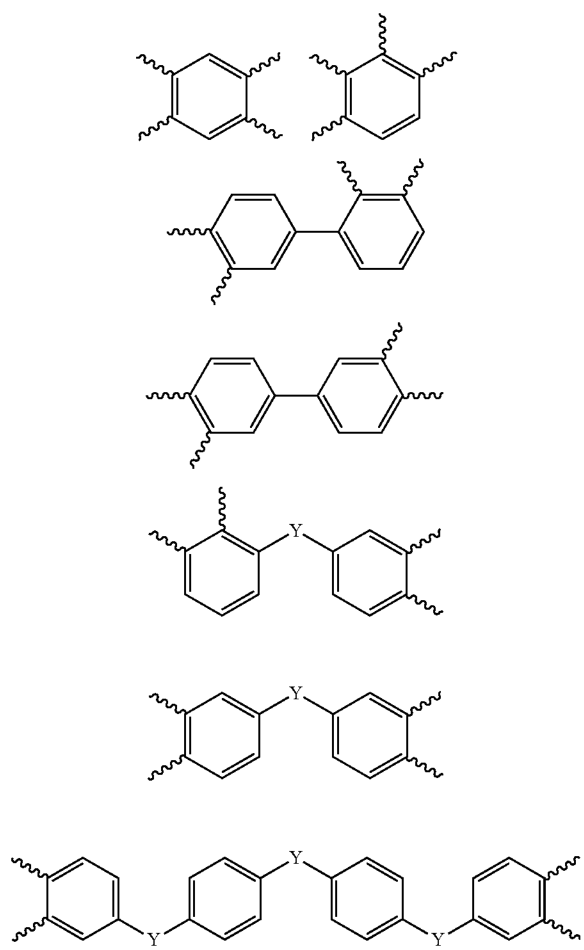

-continued

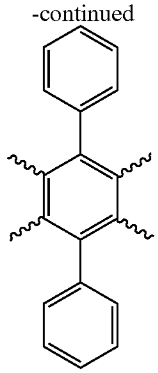

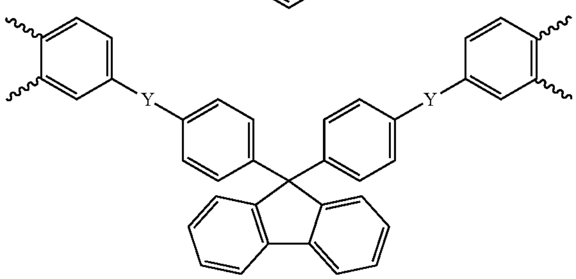

In some aspects, each occurrence of X is a substituted or unsubstituted aryl or heteroaryl group. In some aspects, each occurrence of Y is independently selected from the group consisting of O, S, C═O, $C(CF_3)_2$, $C(CH_3)_2$, $SO_2$, and C≡C.

The resin composition can include a photoinitiator suitable for initiating crosslinking of the photocrosslinkable groups when exposed to a light source of a suitable wavelength and intensity and a suitable solvent.

In some aspects, each occurrence of X is selected from the group

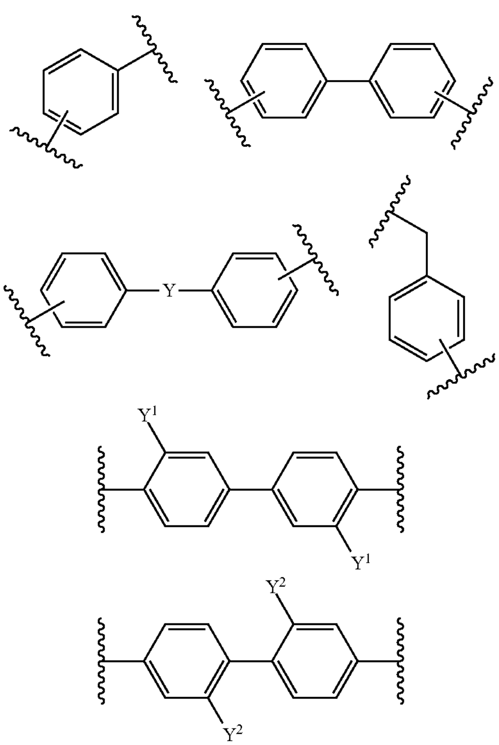

-continued

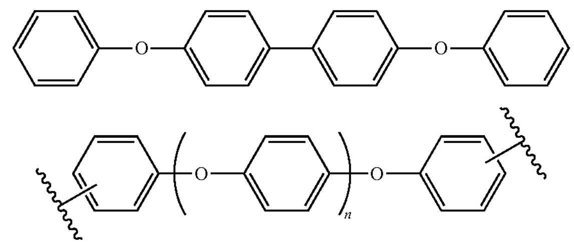

In some aspects, each occurrence of R" is selected from the group

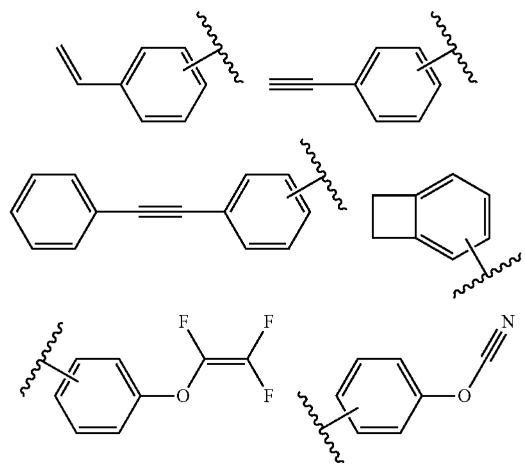

In some aspects, a polymer resin for vat photopolymerization is provided including (i) a polyamic acid salt formed from the addition of a photocrosslinkable amine to a polyamic acid; (ii) a photoinitiator suitable for initiating crosslinking of the photocrosslinkable amine when exposed to a light source of a suitable wavelength and intensity; and (iii) a suitable solvent.

In some aspects, the photocrosslinkable amine is selected from the following group where each occurrence of $R_1$ is independently —H or —$CH_3$; where each occurrence of $R_2$ is independently —H, —$CH_3$, or —$CH_2CH_3$; and where each occurrence of $R_3$ and $R_4$ is independently —H, an aliphatic group, or an aromatic group.

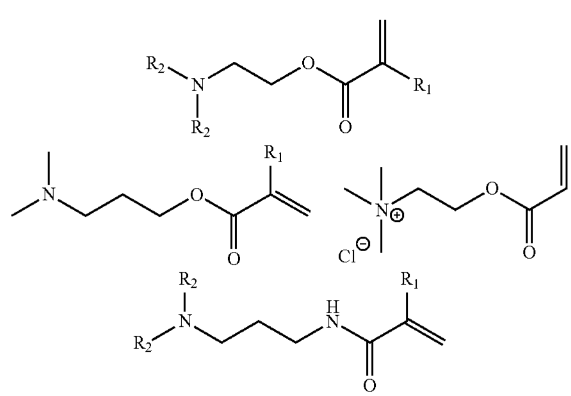

-continued

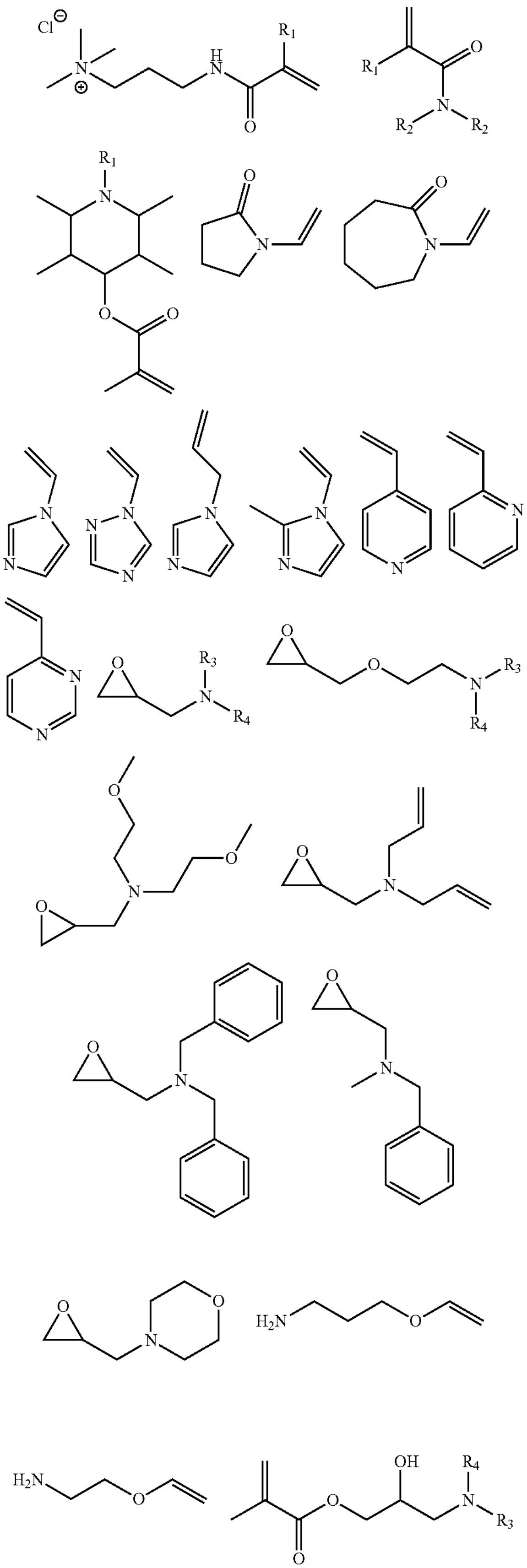

-continued

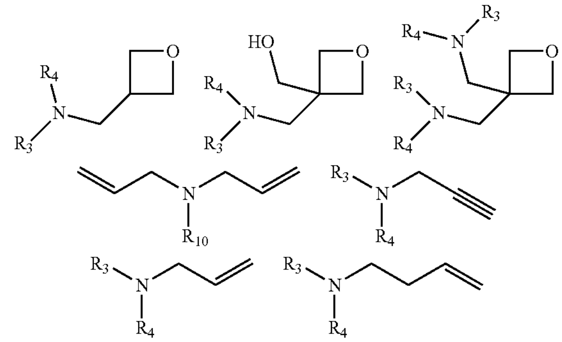

In some aspects, the polyamic acid is formed by the addition of a diamine to a dianhydride in a suitable precursor solvent. In some aspects, the polyamic acid is an isolated polyamic acid. An isolated polyamic acid can be one that isolated from the solvent in which it is formed prior to using it to from the polyamic acid salt. The formed polyamic acid can be isolated from the precursor solvent by precipitating the formed polyamic acid into a nonsolvent, filtering off the formed polyamic acid, drying the formed polyamic acid, and redissolving the formed polyamic acid in a suitable solvent. In some aspects, the polyamic acid is a non-isolated polyamic acid. A non-isolated polyamic acid is one that is not isolated from the suitable precursor solvent prior to being used to form the polyamic acid salt described herein. The viscosity of the polyamic acid, and thus the viscosity of the resulting polymer resin described herein can be altered by the synthetic history of the polyamic acid. Isolating the polyamic acid prior to its use to form a polymer resin described herein results in a lower viscosity polyamic acid and lower viscosity polymeric resin then if the polyamic acid is not isolated prior to its use to form a polymeric resin described herein. The isolated polyamic acid can be suitable for use in forming polymeric resins having viscosities suitable for vat printing or SLA. The non-isolated polyamic acid can be suitable for use in forming polymeric resins having viscosities suitable for direct ink writing techniques such as UV-DIW, which utilize higher viscosity inks.

In some aspects, the polyamic acid is formed from the addition of a diamine to a dianhydride in a suitable precursor solvent, where the polyamic acid is isolated from the suitable solvent prior to forming the polyamic acid salt. In some aspects, the polyamic acid salt formed from the isolated polyamic acid salt is used to form a polymer resin for SLA or other vat 3D printing techniques. The viscosity of the isolated polyamic acid can range from about 1 Pa·s to 100 Pa·s In some aspects, the polyamic acid is formed from the addition of a diamine to a dianhydride in a suitable precursor solvent, where the polyamic acid is not isolated from the suitable solvent prior to forming the polyamic acid salt. In some aspects, the polyamic acid salt formed from the non-isolated polyamic acid salt is used to form a polymer resin for UV-DIW or other direct-writing 3D printing techniques. The viscosity of the non-isolated polyamic acid can range from about 200 Pa·s to 400 Pa·s The diamine used during formation of a polyamic acid (whether subsequently isolated or not) can be one selected from the group

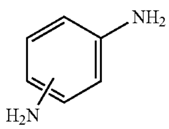
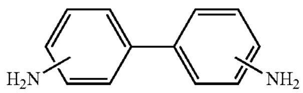
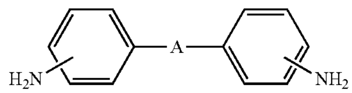
where A = O, $CH_2$, $CH_2CH_2$, $SO_2$, $C(CF_3)_2$, $C(CH_3)_2$, S, S—S, CH═CH, C═O, NH
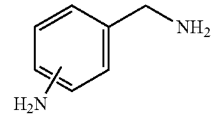
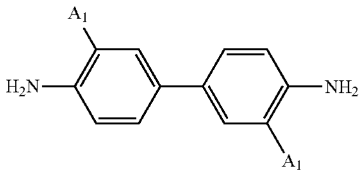
where $A_1$ = Cl, CH, $OCH_3$, $CH_3$, $CH_2CH_3$ or aliphatic or aromatic
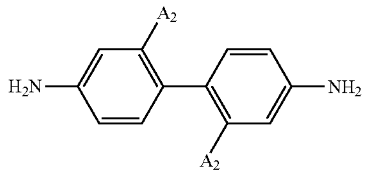
$A_2$ = $CH_3$, $CF_3$, $SO_3H$, $SO_3Na$, tert-butyl or aliphatic or aromatic
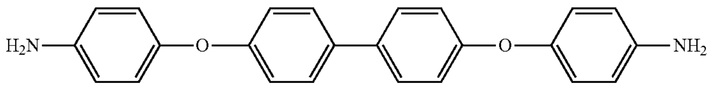
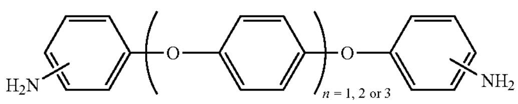
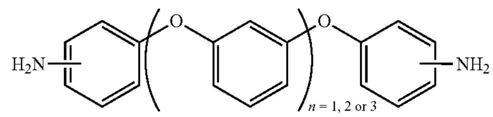
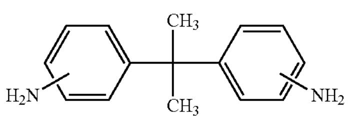
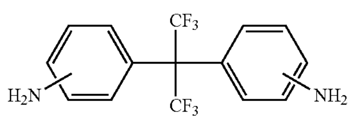
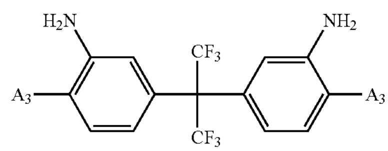
where $A_3$ = $CH_3$, $OCH_3$ or OH
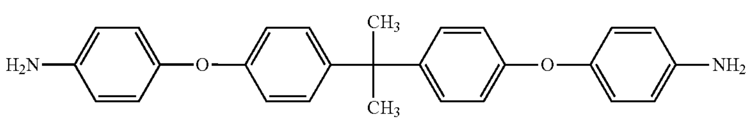
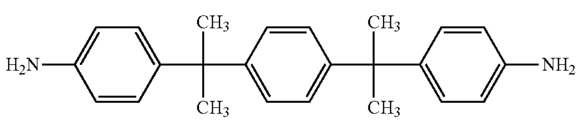
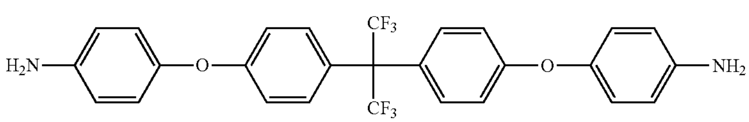
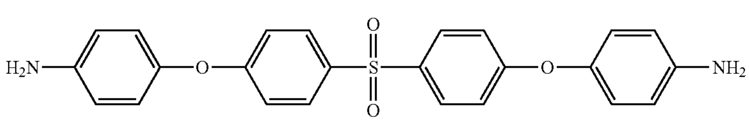
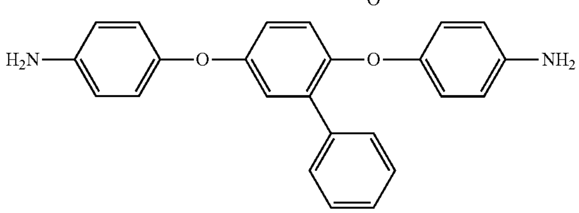
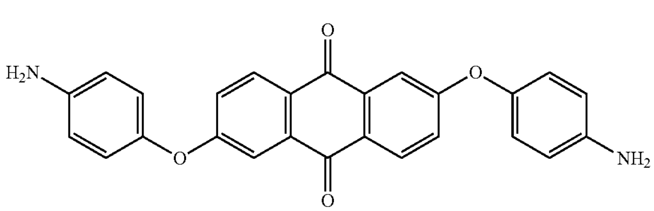
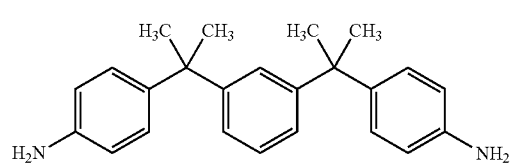

-continued
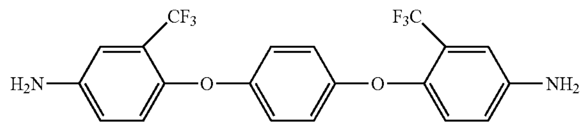
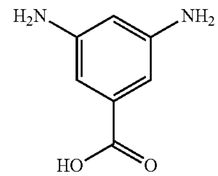
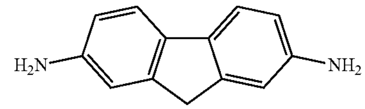
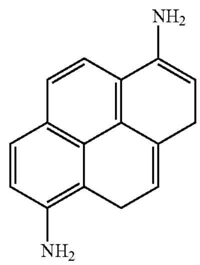
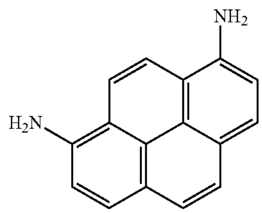
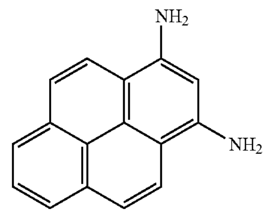
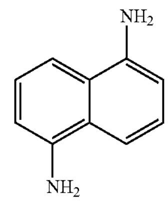
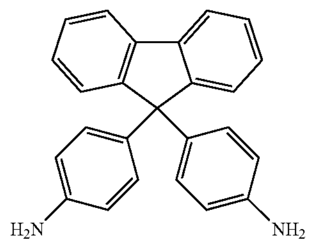
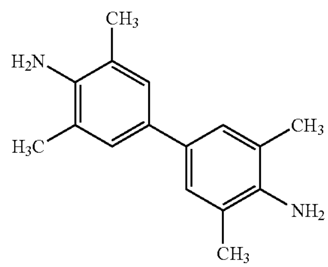
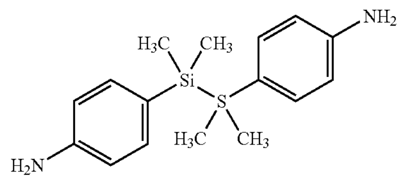
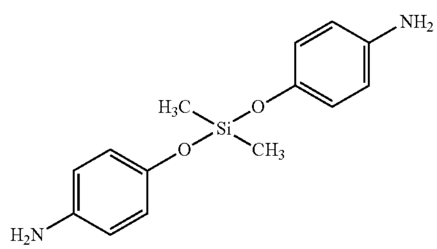
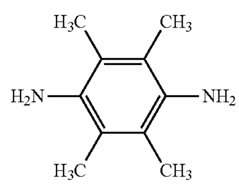
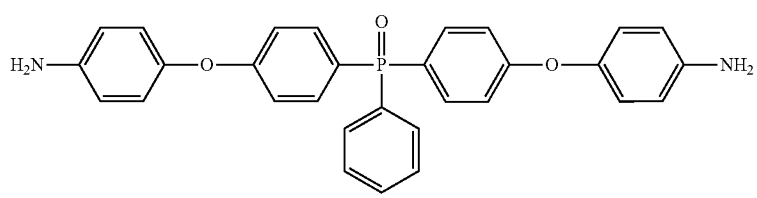
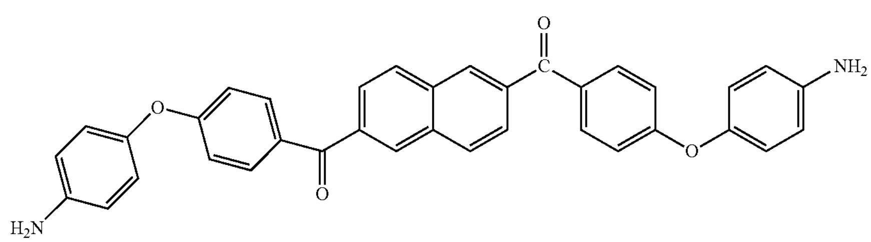
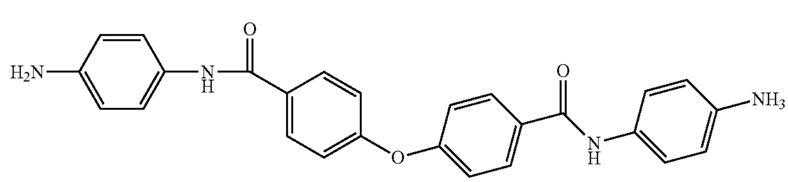
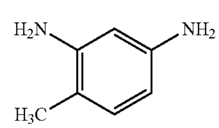

-continued
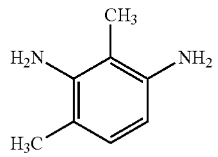
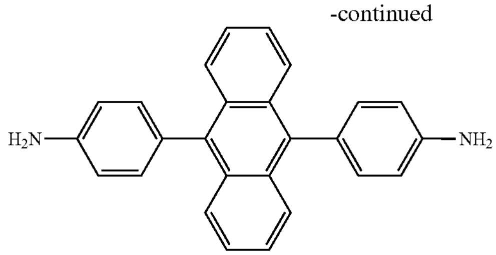
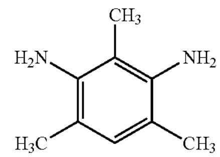
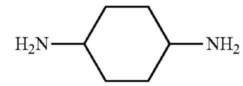
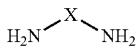
where X is either aliphatic or aromatic
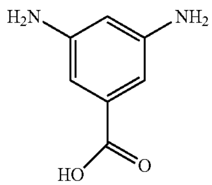
The dianhydride used during formation of a polyamic acid (whether subsequently isolated or not) can be selected from the group
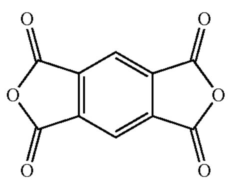
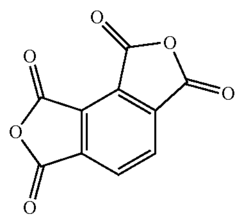
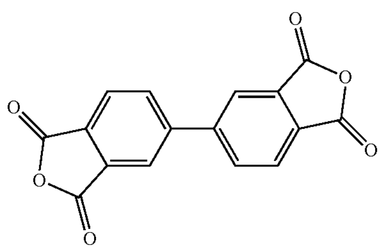
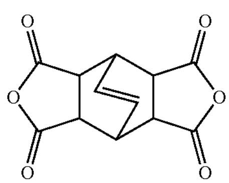
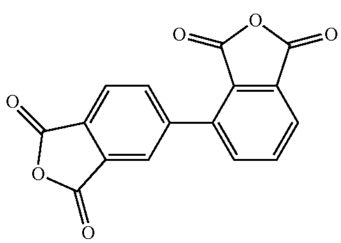
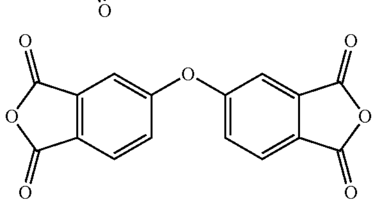
-continued
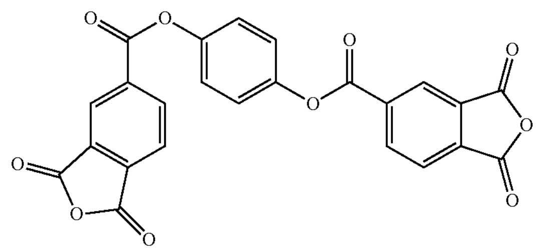
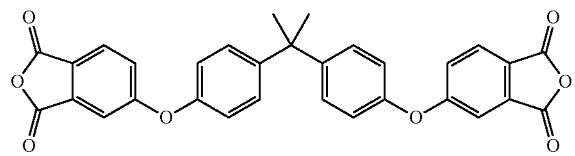
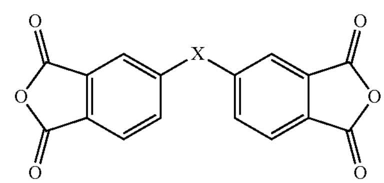
where Y is C═O, C(CH$_3$), C(CH$_3$)$_2$, SO$_2$ or C≡C
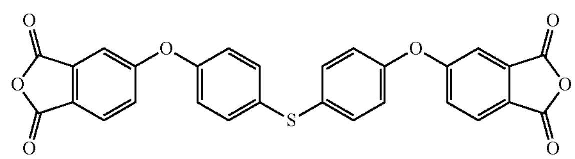
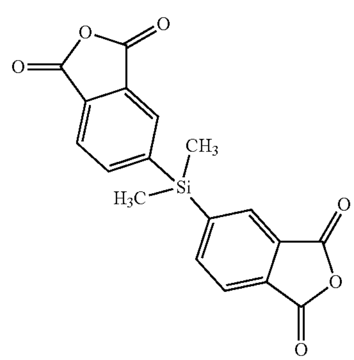

-continued

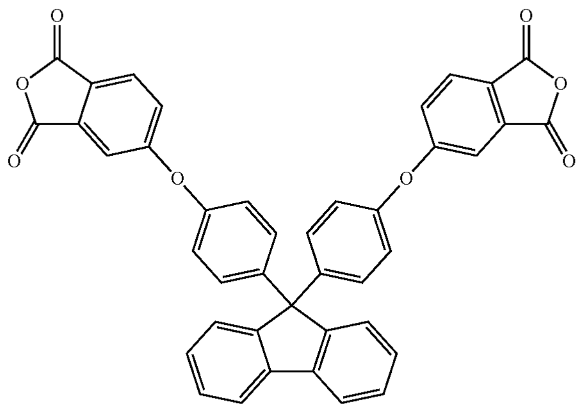

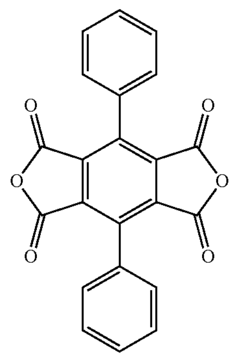

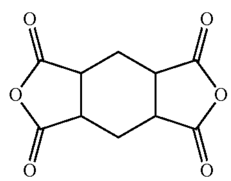

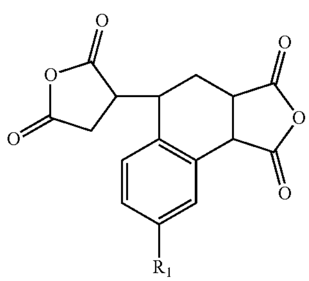

where $R_1$ is either F, $CH_2Cl$, $CH_2Br$, $CH_3F$, H, or $CH_3$

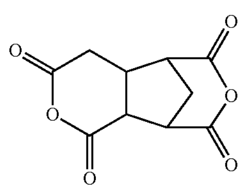

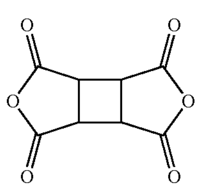

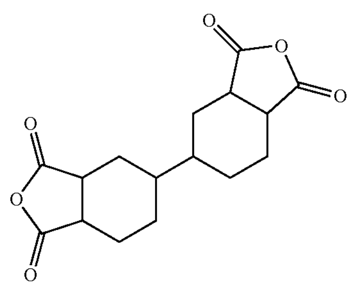

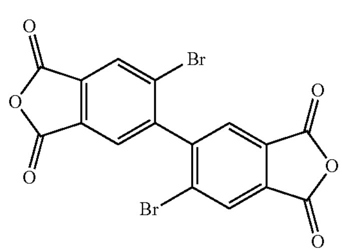

-continued

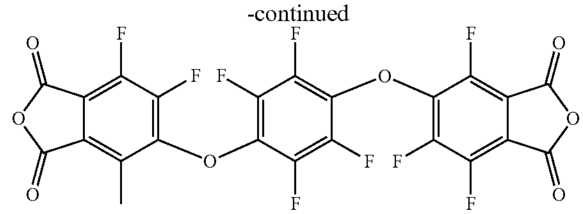

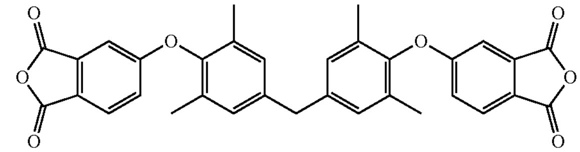

The suitable precursor solvent can be selected from the group of: N-methyl-2-pyrrolidone (NMP), dimethylacetamide (DMAC), dimethylformamide (DMF), y-butyrolactone, mixtures with hydrocarbon solvents/aromatic hydrocarbon solvents, water, ammonia, and mixtures thereof. In some aspects, the suitable precursor solvent is N-methyl-2-pyrrolidone (NMP).

The polymer resin can include a polyamic acid salt, having a number average molecular weight of about 20000 g/mol to about 100000 g/mol, about 20000 g/mol to about 80000 g/mol, about 40000 g/mol to about 80000 g/mol, about 40000 g/mol to about 60000 g/mol, about 20000 g/mol to about 60000 g/mol, or about 30000 g/mol to about 70000 g/mol. In some aspects, the polyamic acid salt thereof has a polydispersity of about 3, about 2.5, about 2, about 1.8, about 1.6, or less. In some aspects, the photocrosslinkable groups have a thermal decomposition temperature of about 400° C., about 350° C., about 300° C., about 250° C., or less. In some aspects, the photocrosslinkable groups include an acrylate, a methacrylate, or a combination thereof. In some aspects, upon drying the resin and heating to a temperature of about 200° C. to 350° C. the polyamic diacrylate ester or salt thereof undergoes thermal imidization to form a polyimide. In some aspects, the polyamic diacrylate ester or salt thereof is present at an amount of about 5 wt % to about 50 wt %, about 5 wt % to about 40 wt %, about 10 wt % to about 40 wt %, about 10 wt % to about 50 wt %, about 20 wt % to about 40 wt %, or about 20 wt % to about 50 wt % based upon a total weight of the polymer resin.

In some aspects, the photoinitiator is a phosphine oxide such as phenylbis(2,4,6-trimethylbenzoyl)phosphine. The suitable wavelength can include, for example about 300 nm to 500 nm, about 350 nm to 500 nm, about 350 nm to 450 nm, or about 300 nm to 450 nm. In some instances, the photoinitiator is present in an amount from about 1.5 wt % to about 5 wt % based upon a total weight of the polymer resin.

The resins can also include a suitable UV blocker. For example, the UV blocker can include UV blockers such as benzophenones, benzotriazoles, diazines and triazines, benzoates, oxalanilide, azobenzones, metal oxides (zinc oxide, titanium dioxide). In some aspects, the UV blocker is present in an amount from 0.1% to 3% by weight based upon the total weight of the polymer resin. In some aspects, the UV blocker is present in an amount from 0% to 3% by weight based upon the total weight of the polymer resin. Examples of UV blockers can include 4-nitrophenol, 2,5-Bis(5-tert-butyl-benzoxazol-2-yl)thiophene, 2-hydroxy-4-methoxy benzophenone, 1-(4-Methoxyphenyl)-3-(4-tert-butylphenyl) propane-1,3-dione, disodium 2,2'-(1,4-phenylene)bis(6-sulfo-1H-benzimidazole-4-sulfonate), Hexyl 2-[4-(diethylamino)-2-hydroxybenzoyl]benzoate, Menthyl-o-aminobenzoate, 2,2'-[6-(4-methoxyphenyl)-1,3,5-triazine-2,4-diyl] bis{5-[(2-ethylhexyl)oxy]phenol}, 2,4-dihydroxybenzophenone, 2,2',4,4'-tetrahydroxybenzophenone, 4-Hydroxy-2-methoxy-5-(oxo-phenylmethyl)benzenesulfonic acid, 2,2'-dihydroxy-4,4'-dimethoxybenzophenone, 5-chloro-2-hydroxybenzophenone, (2-Hydroxy-4-methoxyphenyl)-(2-hydroxyphenyl)methanone, sodium 2,2'-dihydroxy-4,4'-di methoxybenzophenone-5,5'-disulfonate, (2-Hydroxy-4-methoxyphenyl)(4-methylphenyl)methanone, “(2-hydroxy-4-octoxy-phenyl)-phenyl-methanone, 2-(1,2,3-Benzotriazol-2-yl)-4-methyl-6-[2-methyl-3-(2,2,4,6,6-pentamethyl-3,5-dioxa-2,4,6-trisilaheptan-4-yl)propyl]phenol, Terephthalylidene dicamphor sulfonic acid, 2-ethylhexyl 2-cyano-3,3-diphenyl-2-propenoate, Diethylhexyl butamido triazone, 2-Ethoxyethyl 3-(4-methoxyphenyl)propenoate, Isopentyl 4-methoxycinnamate, 2,2'-methanediylbis[6-(2H-benzotriazol-2-O-4-(2,4,4-trimethylpentan-2-yl)phenol], 2-(2H-Benzotriazol-2-yl)-4-(1,1,3,3-tetramethylbutyl)phenol, 2,2'-Methylenebis[6-(2H-benzotriazol-2-yl)-4-(1,1,3,3-tetramethylbutyl)phenol], 2-Hydroxy-4-(octyloxy)benzophenone, 2-ethyl-, 2-[4-(4,6-diphenyl-1,3,5-triazin-2-yl)-3-hydroxyphenoxy]ethyl ester, 2-tert-Butyl-6-(5-chloro-2H-benzotriazol-2-yl)-4-methylphenol, 2-(2-Hydroxy-5-methylphenyl)benzotriazole, 2,4-dinitrophenylhydrazine, N-(4-ethoxycarbonylphenyl)-N'-methyl-N'-phenylformamidine, Hexadecyl 3,5-bis-tert-butyl-4-hydroxybenzoate, and 2-Ethyl-2'-ethoxy-oxalanilide.

The viscosity of the polymer resin for vat printing or SLA can be less than 100 Pa·s, less than 50 Pa·s, less than 25 Pa·s, less than 20 Pa·s, less than 18 Pa·s, less than 15 Pa·s, less than 10 Pa·s, or less than 5 Pa·s. The viscosity of the polymer resin for UV-DIW can be greater than 400 Pa·s. The viscosity of the polymer resin for UV-DIW can be between 400 and 1,000 Pa·s. The viscosity of the polymer resin core UV-DIW between 700 and 1,000 Pa·s.

Synthetic Strategies

Photo-crosslinkable moieties can be introduced by addition of photo-crosslinkable amines to polyamic acids, forming photo-curable polyamic acid salts. Importantly, this strategy has no limit regarding the molecular weight range of the polyamic acid. A general synthetic strategy is presented in the following scheme (Scheme 3). Note that for clarity, a 1:I ratio of crosslinkable amine to COOH of the polyamic acid is shown in Scheme 3. However, UV-crosslinkable amines can also be applied in excess or alternatively, COOH groups can be present in excess. Suitable solvents are typical solvents for polyamic acids/polyimides such as NMP, DMAC (dimethylacetamide), DMF (dimethylformamide), ybutyrolactone, mixtures of such or mixtures with hydrocarbon solvents/aromatic hydrocarbon solvents (e.g. xylene, trichlorobenzene). Alternatively, water or ammonia (aq.) can be used as solvent.

Scheme 3. Synthesis of polyamic acid salts. Crosslinkable groups are introducted by addition of photocurable amine to the polyamic acid.

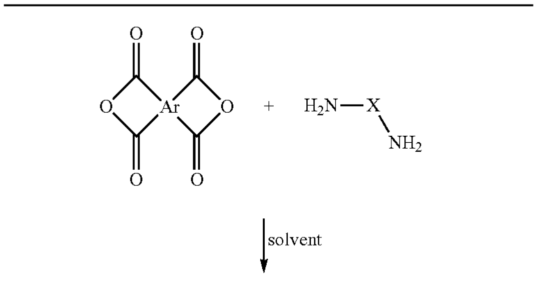

-continued

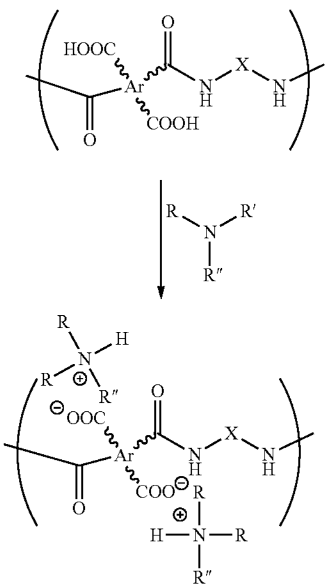

In some aspects, Ar can be one or more combinations of the following dianhyd1ides:

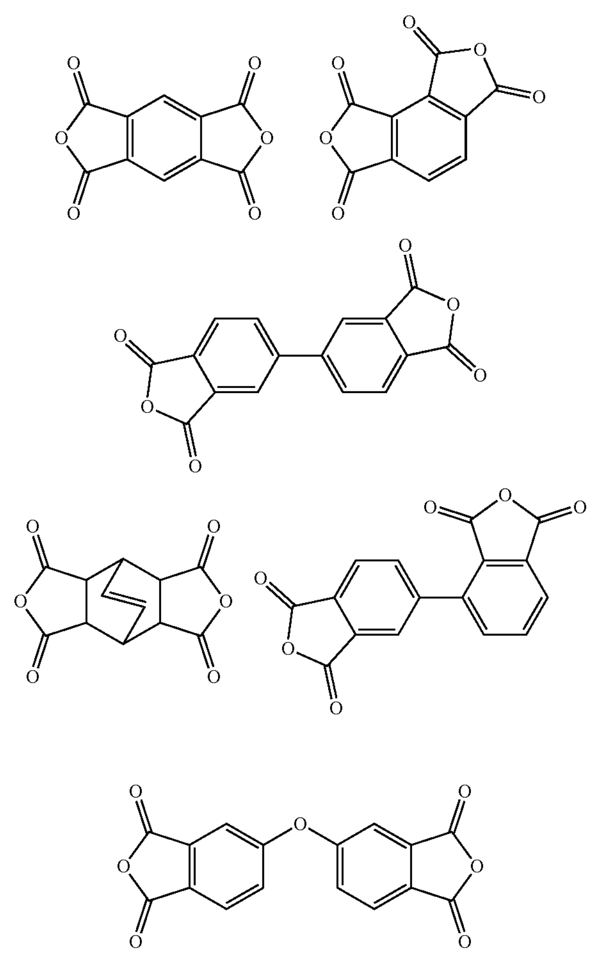

-continued
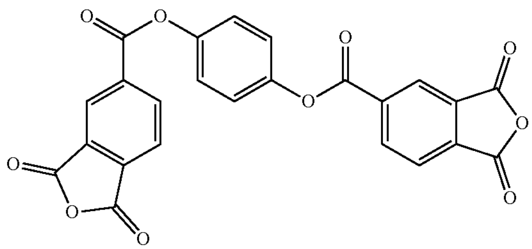
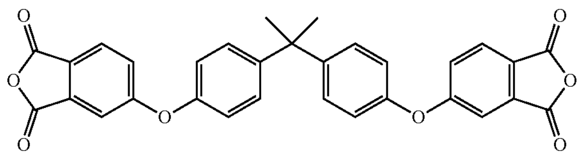
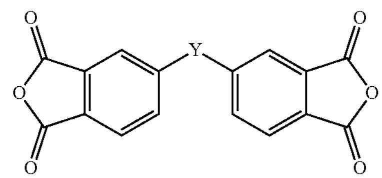
where Y is C═O, $C(CF_3)$, $SO_2$, or C≡C
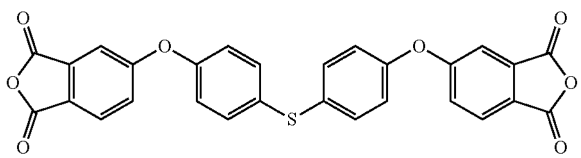
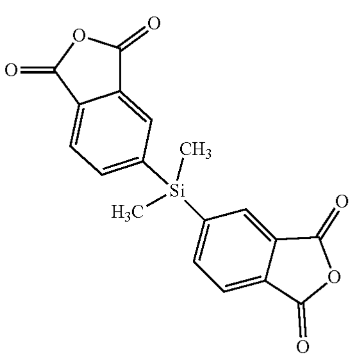
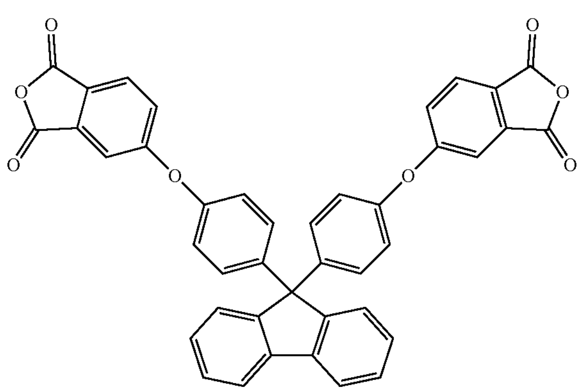
-continued
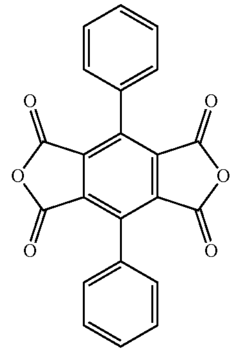
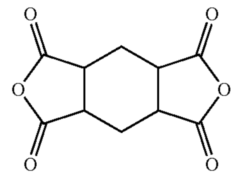
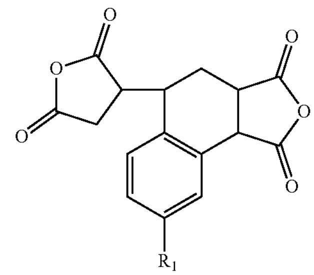
where $R_1$ is either F, $CH_2Cl$, $CH_2Br$, $CH_3F$, H, or $CH_3$
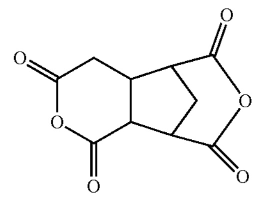
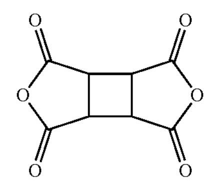
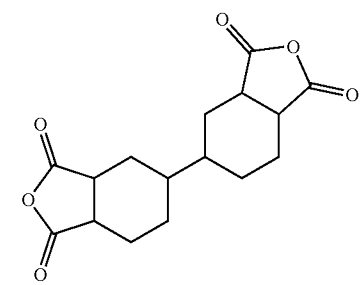
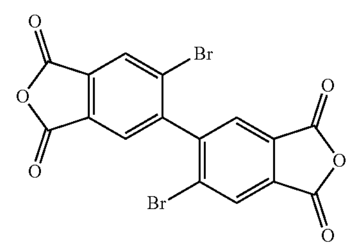
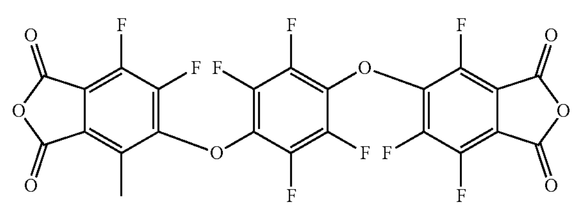

-continued
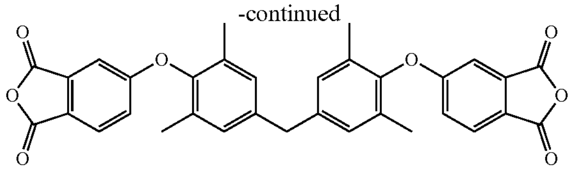
In some aspects, X can be one or more combinations of the following diamines
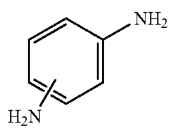
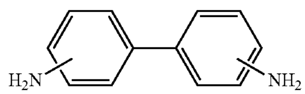
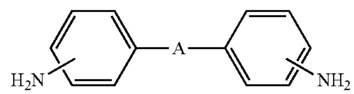
where A = O, $CH_2$, $CH_2CH_2$, $SO_2$, $C(CF_3)_2$, $C(CH_3)_2$, S, S—S, CH═CH, C═O, NH
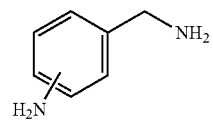
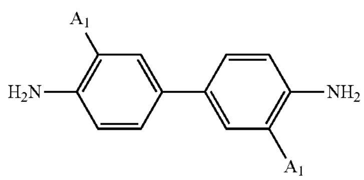
where $A_1$ = Cl, OH, $OCH_3$, $CH_3$, $CH_2CH_3$ or aliphatic or aromatic
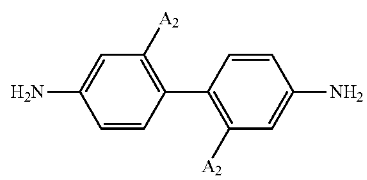
$A_2$ = $CH_3$, $CF_3$, $SO_3H$, $SO_3Na$, tert-butyl or alphatic or aromatic
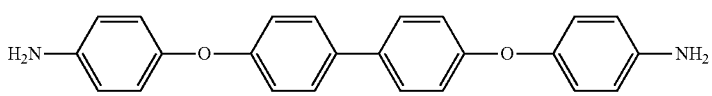
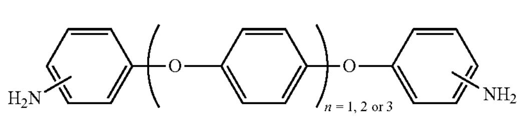
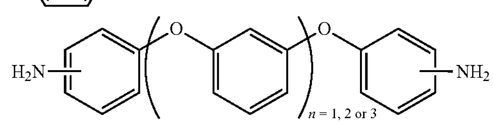
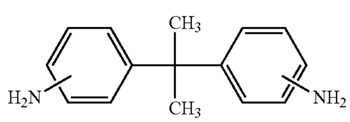
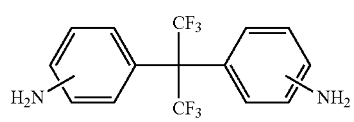
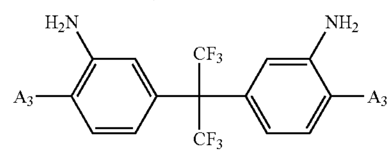
where $A_3$ = $CH_3$, $OCH_3$ or OH
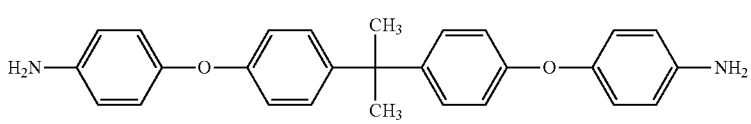
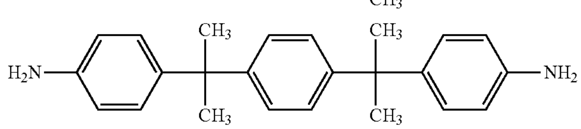
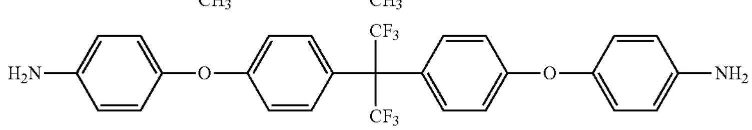
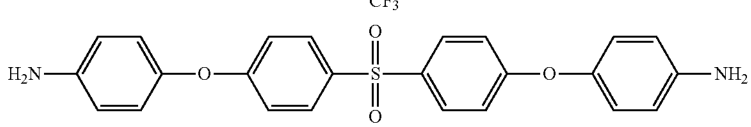
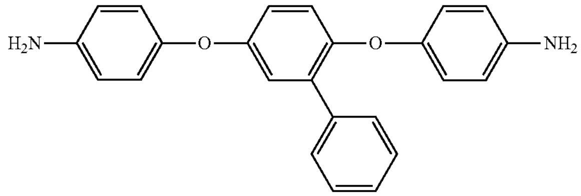

-continued
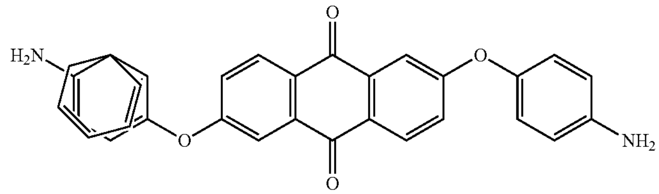
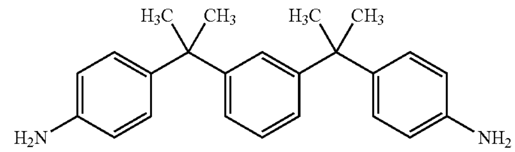
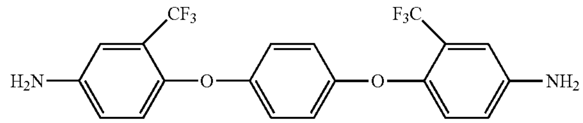
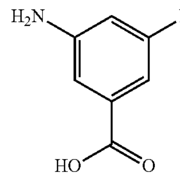
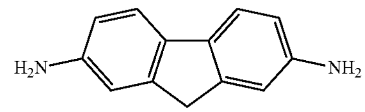
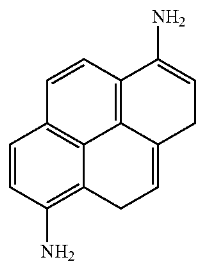
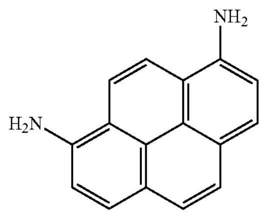
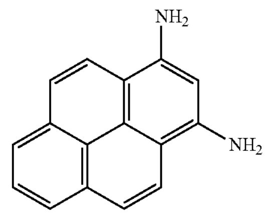
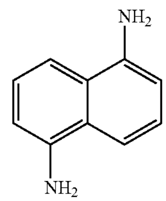
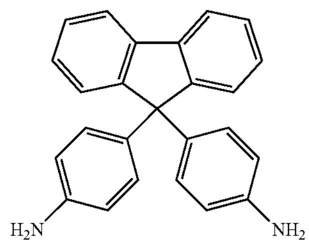
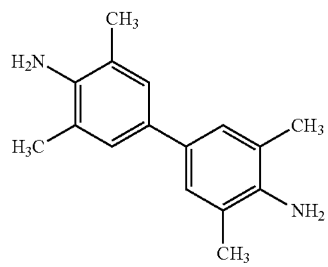
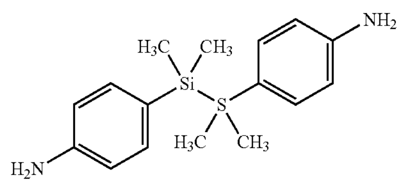
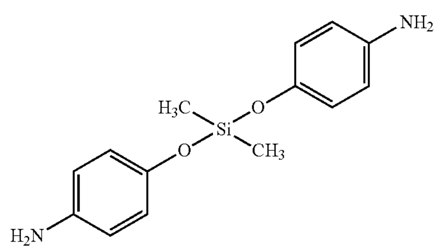
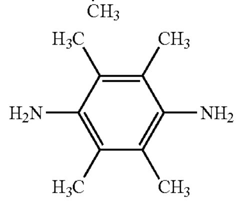
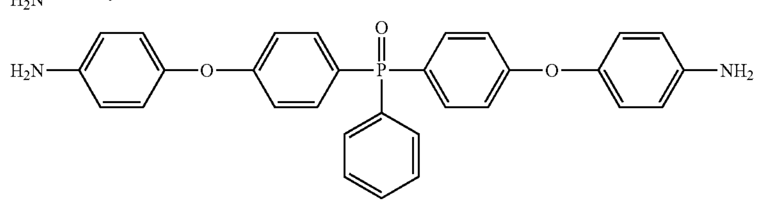
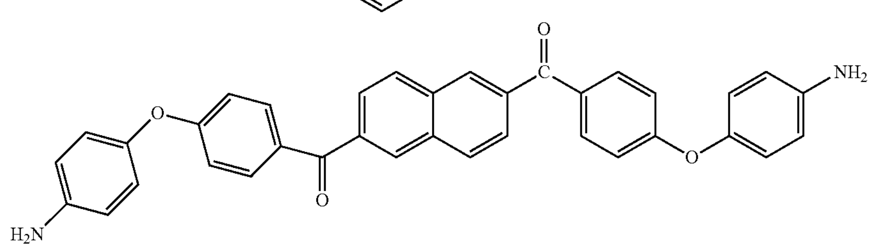
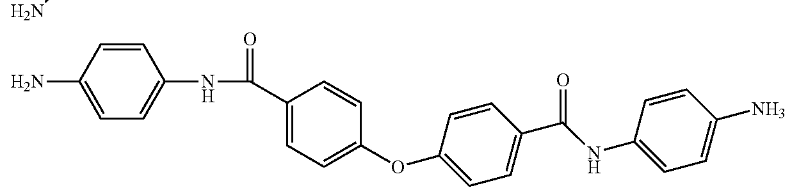
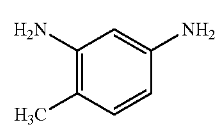

-continued

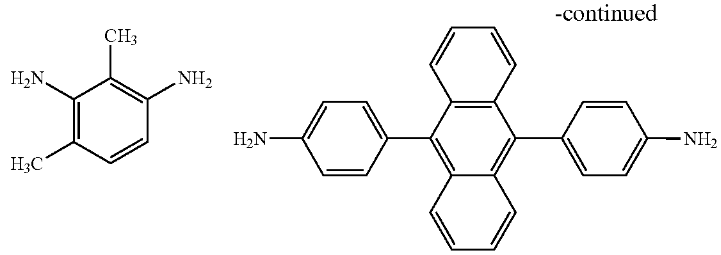

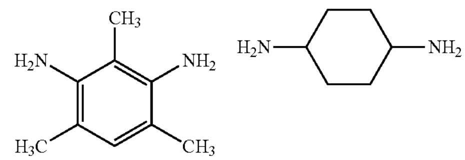

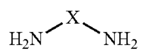

where X is either aliphatic or aromatic

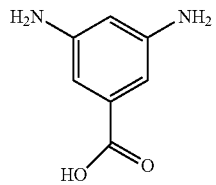

In some instances, the molecular weight can be controlled by stochiometric imbalance, meaning using excess of dianhydride or diamine or by using mono-functional anhydrides or amines of the following structure:

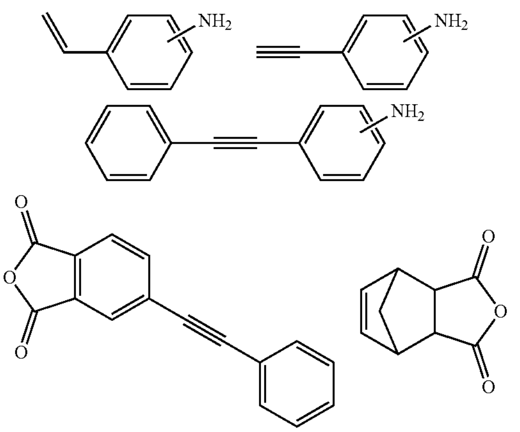

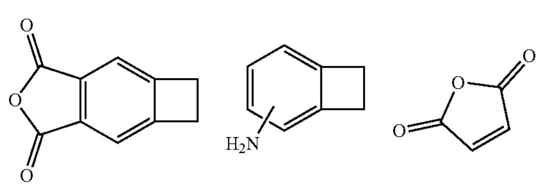

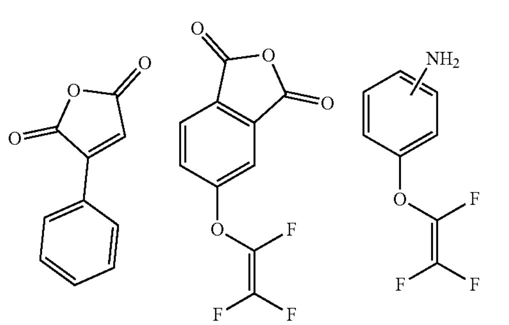

-continued

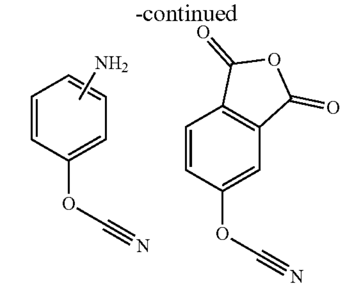

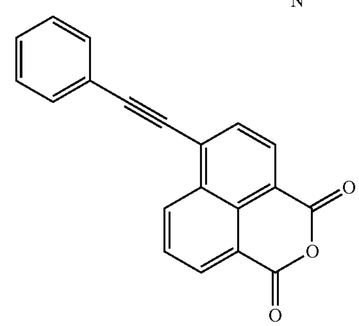

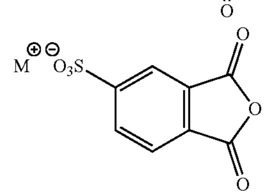

where M⊕ is a H or a metal counterion where the amines (NRR'R") bearing a photo-curable unit can be one or more combinations of the following or a mixture of the following and non-reactive amines, such as aliphatic amines or aromatic amines, e.g. triethylamine, ethanolamine or ammonia. In general, any photo-curable amine can result in a suitable reaction, ranging from vinyl ethers, epoxides, oxetanes, (meth)acrylates to vinyl-compounds.

Significantly, amines bearing allyl or alkyne groups are suitable in combination with thiols, enabling light-initiated crosslinking via thiol-ene or thiol-yne reaction. In addition, a 1:1 ratio of COOH groups in the polyamic acid to UV-curable amine is not necessary. Amines can be applied in excess or COOH groups can be in excess.

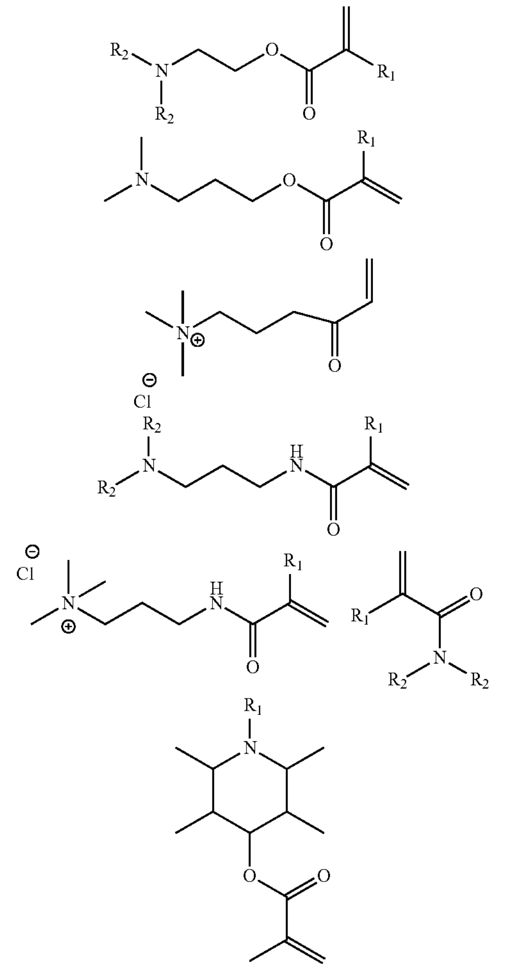

$R_1$ = H or $CH_3$
$R_2$ = H, $CH_3$, $CH_2CH_3$

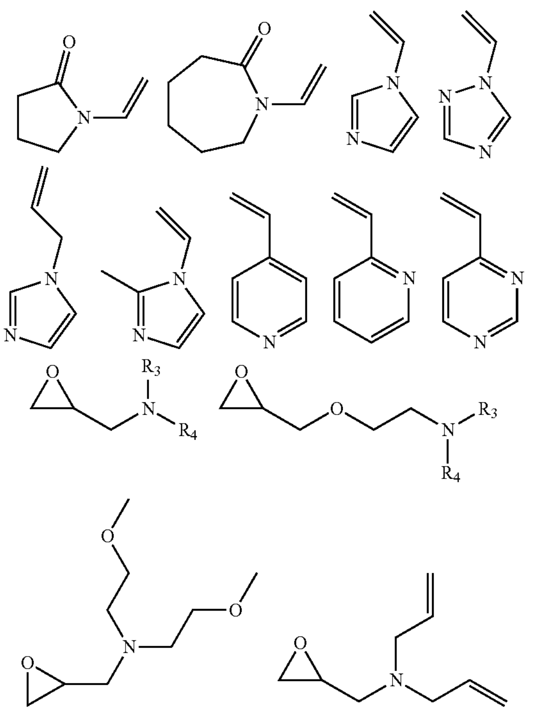

-continued

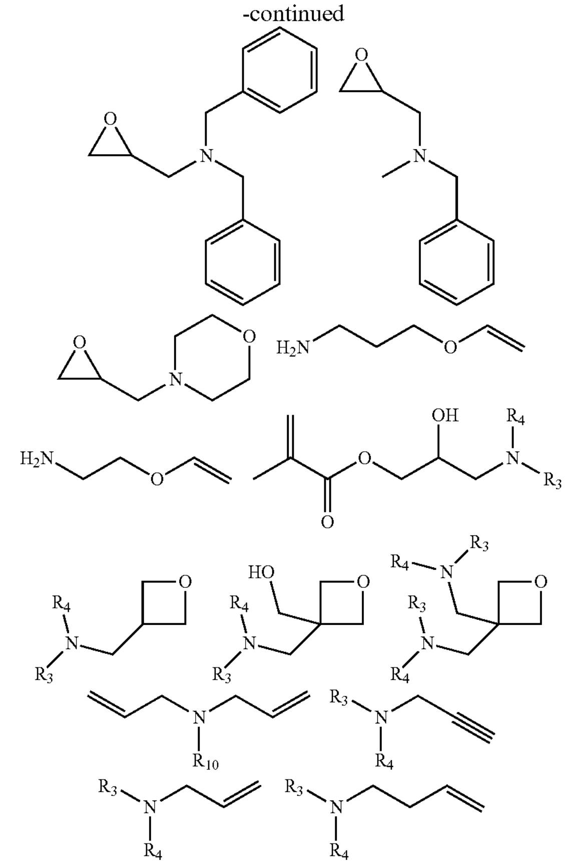

where are $R_3$ and $R_4$ are either the same or different and are aliphatic or aromatic Suitable photoinitiators absorb light at the irradiation wavelength and can be of Type I or Type II, while Type II photoinitiators require a co-initiator. In particular, TPO and PPO are suitable photoinitiators. Alternative examples are TPO Li (lithium phenyl-2,4,6-trimethylbenzoylphosphinate)$_9$ or thioxanthone based photoinitiators. Suitable initiators for amino-functional epoxides, oxetanes or vinyl ethers are photoacid generators which are well-known to enable cationic photopolymerization, e.g. aryl iodonium photoacids. The latter can also be combined with a suitable dye to extend the workable wavelength.

The photo-induced crosslinking of the polyamic acid salt solution in the vat of the SLA converts the solution into a solid part at the sections where it is exposed to the light source. After washing the printed part in an appropriate solvent or solvent mixture to remove non-crosslinked polymer (e.g. NMP or ybutyrolactone), post-processing of the 3D printed part by thermal or chemical imidization converts the crosslinked precursor to the polyimide which is schematically shown for an acrylate containing crosslinking agent (Scheme 4). Importantly, aliphatic crosslinkers can be completely removed/released by heating the polymer to high enough temperatures. However, the polymer can also be heated to lower temperatures, enabling imidization but the crosslinker remains partially in the polymer. The latter can be beneficial for certain applications or materials properties.

In aspects where a polymer resin suitable for UV-DIW is used, photo-induced crosslinking of the polyamic acid salt solution occurs as the solution is exposed to an appropriate wavelength of light as the polyamic acid salt solution is disposed on a printing surface or another layer. As discussed and demonstrated elsewhere herein, post-processing of the 3D printed part by thermal or chemical imidization converts the crosslinked precursor to the polyimide which is schematically shown for an acrylate containing crosslinking agent (Scheme 10). Importantly, aliphatic crosslinkers can be completely removed/released by heating the polymer to high enough temperatures. However, the polymer can also be heated to lower temperatures, enabling imidization but the crosslinker remains partially in the polymer. The latter can be beneficial for certain applications or materials properties.

Scheme 4. Schematic for 3D printing of reactive precursors using SLA and post-processing to convert to polyimide. Reaction is exemplary shown for amine bearing a UV crosslinkable double bond and using thermal post-treatment.

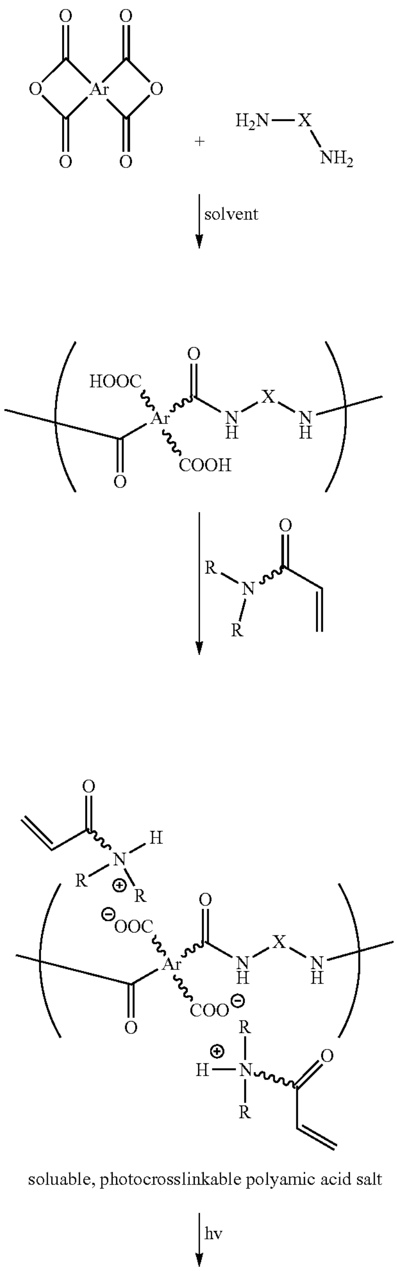

-continued

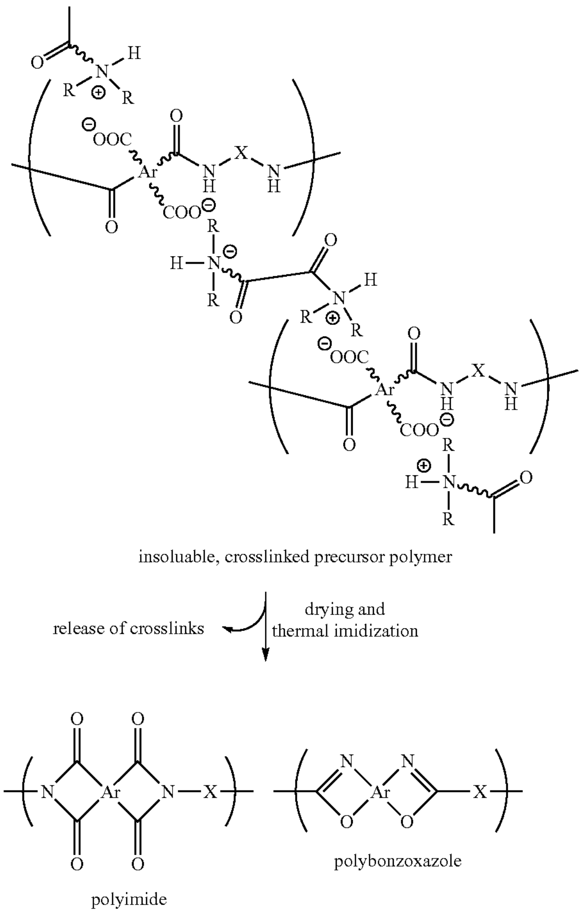

Significantly, this reaction is not limited to polyamic acids but is rather applicable to any polymer bearing an acidic or negatively charged functional group, e.g. sulfonic acid or carboxylic acid groups. The photo-curable molecule does not have to be an amine, but can be consisting of any functional group which interacts electrostatically with the negatively charged polymer and which also contains a photocurable group. In addition, it is possible to exchange both functionalities, meaning a polymer bearing a cationic or alkaline functional group and utilizing a negatively charged photo-curable molecule which interacts electrostatically with the positively charged polymer backbone. The following shows a few examples of suitable photo-curable units.

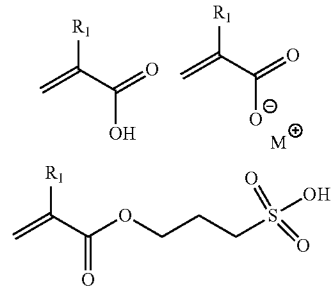

-continued

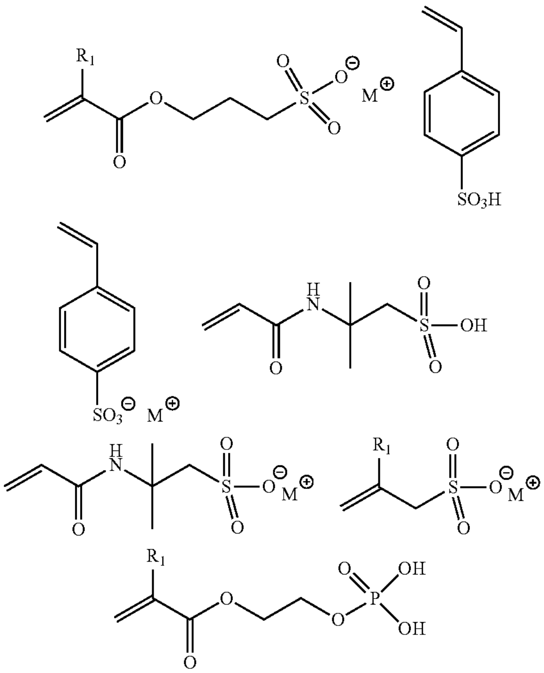

where $R_1$ is either H or $CH_3$ where $M^{\oplus}$ is an counterion

Overall, this strategy is valid for any polymeric system which interacts electrostatically with a photosensitive small molecule, or a photo-sensitive oligomer/polymer. The following shows examples of suitable polymers, including sulfonated polyether ether ketone, sulfonated polystyrene or polyallylamine.

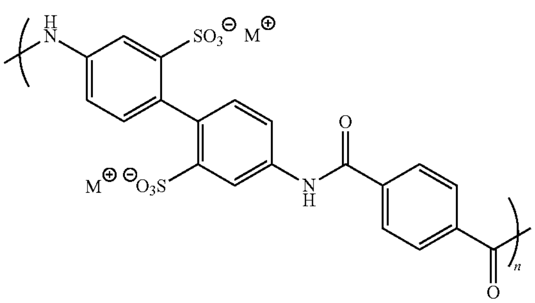

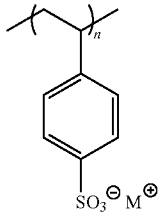

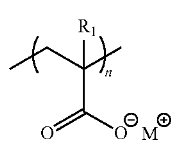

where $R_1$ is either H or $CH_3$ $CH_2CH_3$

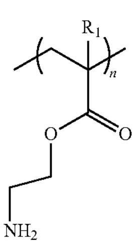

-continued

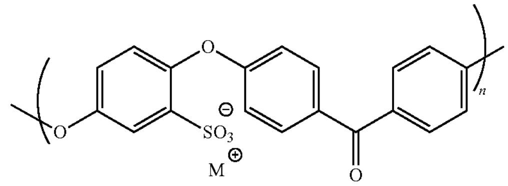

where $M^{\oplus}$ is either H or a metal counterion

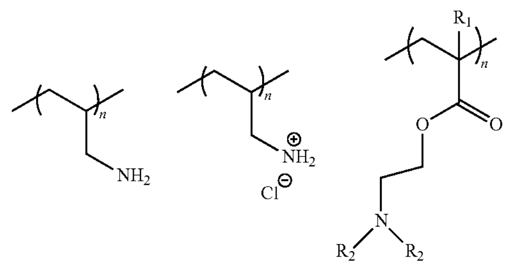

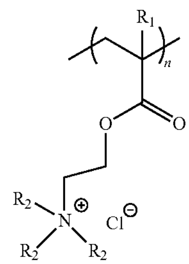

where $R_2$ is either H or $CH_3$ $CH_2CH_3$

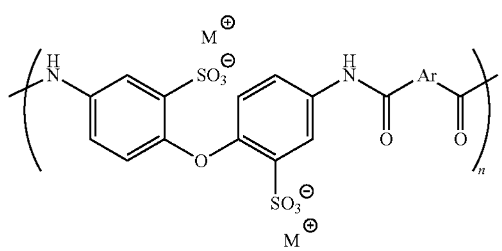

where Ar is any aromatic group

Most important, the crosslinks do not have to be removed from the polymer network and can remain in the latter. One having ordinary skill in the art can prepare these polymers using step-growth polymerization or chain-growth polymerization.

Extension of the Strategy to the 3D Printing of Polybenzoxazoles

Polyimides can be used as precursor polymers and thermally rearranged to form polybenzoxazoles.12 This thermal rearrangement only occurs if aromatic diamine monomers having hydroxyl groups adjacent to the amino groups. For example, 3,3'-dihydroxy-4,4'-diamines are utilized in the synthesis of the polyimide. The conversion of a polyimide to polybenzoxazole occurs upon heating the polyimide to −400° C. (Scheme 5).

Scheme 5. Synthetic strategy for the synthesis of polybenzoxazoles.[12]

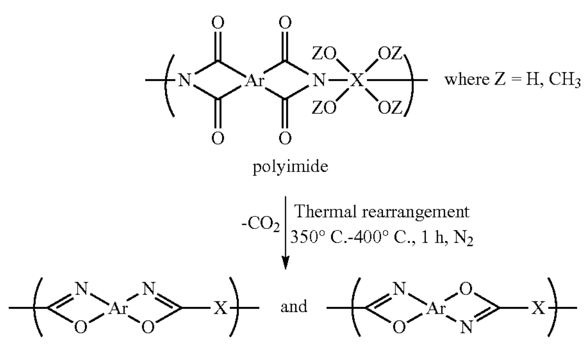

Polybenzoxazoles obtained from thermally rearranged polyimides are generally utilized in the field of gas separation and permeation due to a combination of their superior mechanical properties, high chemical thermal stabilities and high selectivity for specific gases. Thermal rearrangement of the 3D printed polyimide offers an easy route for preparing polybenzoxazoles.

While the various aspects described herein are exemplary, variations to these aspects can include (but are not limited to) individual elements or combinations of the following:

1. Use of a light source with different UV wavelengths
2. Use of coherent source of light (Laser, LED)
3. Top-Down fabrication setup (as demonstrated) or bottom-up setup
4. Recoating with the use of a blade, Zephyr Blade, spraying/controlled deposition of resin by inducing relative motion between the build-substrate and the resin (can be in the same chamber or a disconnected chamber)
5. Use of Stationary Mask projection stereolithography or holographic projection techniques.
6. Use of any optical/digital magnification during part fabrication
7. Use of other dynamic masking devices i.e. Liquid Crystal based dynamic mask, Liquid Crystal over Silicon, Digital Micro-mirror devices of any size and actuation strategy 8. Use of other actuation strategies such as belt driven gantry, electro-magnetic actuators, pneumatic and hydraulic actuators and galvanometers for moving the projected light and resin relative to each other.
9. Use of heated, ventilated or controlled environments during fabrication, e.g. argon or nitrogen atmosphere.

EXAMPLES

Now having described the embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure.

Materials.

Pyromellitic dianhydride (PMDA), 4,4'-oxydianiline (ODA), 2-(dimethylamino)ethyl acrylate (DMAEA), 2-(dimethylamino)ethyl macrylate (DMAEMA) and diphenyl(2,4,6-trimethylbenzoyl) phosphine oxide (TPO) and phenylbis(2,4,6-trimethylbenzoyl)phosphine oxide (PPO) were purchased from Sigma-Aldrich. 4,4'-oxydianiline (ODA) was sublimed before use. N-methyl pyrrolidinone (anhydrous) was received from Acros. Poly(pyromellitic dianhydride-co-4,4'-oxydianiline) amic acid solution (Pyre-M.L.® RC-5019) in NMP (15-16 wt. %) was purchased from Sigma Aldrich and used without further purification. TPO Li was synthesized in analogy to a literature procedure.9 All PAA salts were stored in the dark at −20° C.

Instrumentation.

$^{1}$H NMR spectra (400 MHz) were recorded using an Agilent U4-DD2 spectrometer equipped with a 96 sample robot. All spectra are referenced internally to residual proton signals of the deuterated solvent. Viscosities of PAA and PAA salt solutions were determined using a TA Instruments DHR-2 rheometer. Frequency sweeps were conducted using 40 mm parallel plates (aluminum), 1.25% oscillatory strain, and frequencies between 0.1 and 70 Hz with a gap set to 1000 μm. Photo-rheology of the solutions was performed using a TA Instruments DHR-2 rheometer equipped with a Omnicure S2000 photo-accessory (320-500 nm), Smart Swap™ UV geometry and 20 mm quartz parallel plate (bottom) and 20 mm aluminum parallel plate (top). The samples were subjected to 0.3% oscillatory strain and 10 Hz frequency. The gap distance was set to 500 μm. The samples were equilibrated for a period of 60 s, with the axial force set to ON. Irradiation started after 30 s. The intensity of the photo source was set to 250 mW/cm$^2$. The gel time and the crossover modulus were determined from the intersection of the loss and storage modulus. 3

FTIR measurements were conducted on a Varian-670 IR spectrometer with Attenuated Total Reflectance (ATR) attachment. A Jeol NeoScope JCM-5000 Scanning Electron Microscope was used to analyze the surface and the cross-section of 3D printed parts. For higher resolution, a LEO (Zeiss) 1550 microscope equipped with Schottky field-emission gun and in-lens secondary electron detector operated at 5 keV was used. Before imaging, samples were directly mounted on sample holders and sputter-coated with a 10 nm thick coating of Pt—Pd metal.

A custom scanning-mask projection vat-photopolymerization (S-MPVP) machine was used with a build size of 250×250 mm and a feature resolution of 70 μm (FIG. 1). In the S-MPVP system, the projection device traverses over the resin surface while simultaneously projecting a continuous bitmap movie. The bitmap movie is a 1:4.2 scale representation of the features in a single slice of the desired part. The scan speed of the projection device and the bitmap movie are synchronized to provide each projected pixel with the necessary energy for curing up to the desired layer thickness only.

The STL file of a honeycomb lattice was sliced into bitmaps of 200 μm layer thickness using Netfabb®. A custom MATLAB program generated a moving mask for each layer and the corresponding scan speed based on the exposure time estimated from the working curves. A glass vat filled with resin was loaded into the build area. Glass slides were attached to the build platform to enhance the adhesion between the printed parts and the substrate. The projector traversed over the resin surface while projecting the moving mask over the resin. Recoating was performed by lowering the build stage into the resin vat. After a brief pause for resin settling, a recoating blade smoothened meniscus over the build platform, ensuring a smooth and level resin surface for fabrication of the consequent layers. This process continued until the entire part was fabricated. During fabrication, the linear stages, the projector and the recoating mechanism are actively monitored and controlled using a custom Lab VIEW program. Printing can be conducted under Argon or N2 atmosphere or under air. The printed parts, extracted from the build platform, were rinsed with an appropriate solvent (e.g. y-butyrolactone or NMP) and placed on a metal mesh to ensure uniform drying.

A Blue Wave® 75 UV spot curing lamp (Dymax: 40078) with intensity adjustment was selected as the source of ultraviolet light. A single pole lightguide (Dymax: 5721) was used to transmit light from the UV light source to the projector. A UV mirror (Thor Labs: PFSQ20-03-F01) was seated inside the projector to relay the light from the light guide to the dynamic mask. The projector was equipped with a Texas Instruments DLP™ 0.65 DMD with a rectangular array of 1920×1080 square micro-mirrors with a pitch and side of 7.56 μm. Imaging lenses (Thor Labs: LA4078-UV, LA4545-UV) were suitable placed in the projection path to achieve a magnification of 4.2, producing a projection area of size 61×34 mm at the surface of the resin. The projection system was mounted on cross-mounted high-load, high-precision linear stages (Zaber: A-LST0500A-E01) for traversing in the XY plane. A high-precision linear stage (Zaber: A-LST0250A-E01) was used for the Z motion. The build platform was fabricated using thermoplastic filament extrusion and attached to the Z-stage. A custom glass vat of size 150×150 mm contained the resin and built platform during part manufacturing. A recoating blade, attached to the X-Y linear stage, ensured uniform coating of resin on the build platform.

Example 1. One-Pot Synthesis of Photo-Crosslinkable Polyamic Acid Salt (PAA Salt). PMDA-ODA Polyamic Acid Salt Containing 2-(Dimethyl)Aminoethyl Acrylate (DMAEA) as Photo-Curable Amine (Scheme 6)

Synthesis of PMDA-ODA Salt

The following example describes the synthesis of a PMDA-ODA polyamic acid with targeted molecular weight of $M_n$=30000 g·mol$^{-1}$. A 500 mL three-neck round bottom flask was equipped with a mechanical stirrer, a septum and a nitrogen inlet. Under nitrogen atmosphere, 150 mL anhydrous NMP and 17.00 g 4,4'-ODA (0.085 mol) were added to the flask. After ODA was fully dissolved, 18.79 g PMDA (0.086 mol) were added and the mixture was stirred for 8 h at RT under nitrogen atmosphere. Afterwards, additional NMP (170 mL), $H_2O$ (25 mL) and 28.8 mL N,N-(Dimethyl) aminoethyl acrylate (1.1 equiv. per COOH, 0.189 mol) were added and the mixture was stirred overnight.

Scheme 6. Synthesis scheme of PAA salt starting from PMDA and ODA, using DMAEA as salt forming amine.

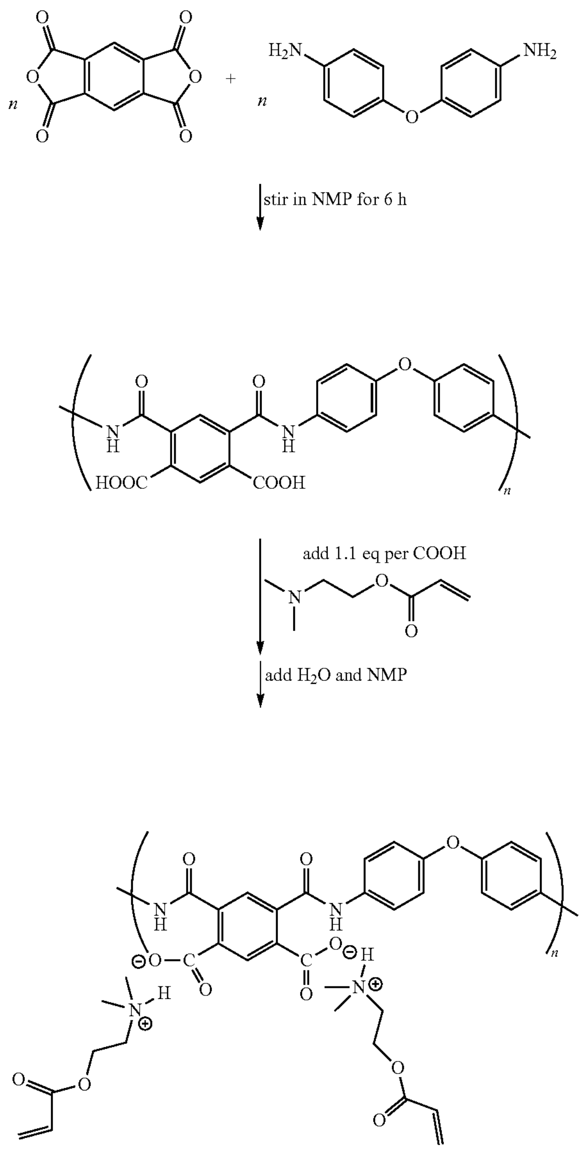

3D Printing Using SLA 0.5 g TPO photo-initiator (1.5 wt. %) was dissolved in 1 mL NMP, added to 220 mL of the polyamic acid salt solution and stirred until complete dissolution. The mixture was transferred to the vat of the SLA printer. The print was conducted at room temperature and under air.

Post-Printing Treatment and Imidization

The printed 3D objects were placed on a metal mesh, air-dried at room temperature for 24 h, followed by drying in the vacuum oven for 24 h at room temperature. Afterwards, the following heating profile was applied: 2 h-24 h at 60° C. (heating rate of 1.5° C. per min), heating to 100° C. and hold for 30 min, heating to 150° C. and hold for 30 min and then heating to 200° C. and hold for 30 min. Subsequently, the part was transferred to a different oven and heated to 350° C. (hold for 30 min) under $N_2$ atmosphere.

Scheme 7. Schematic of chemical reaction of PAA salt when exposed to UV light in SLA set-up in the presence of TPO photoinitiator and post-processing to form PMDA-ODA polyimide.
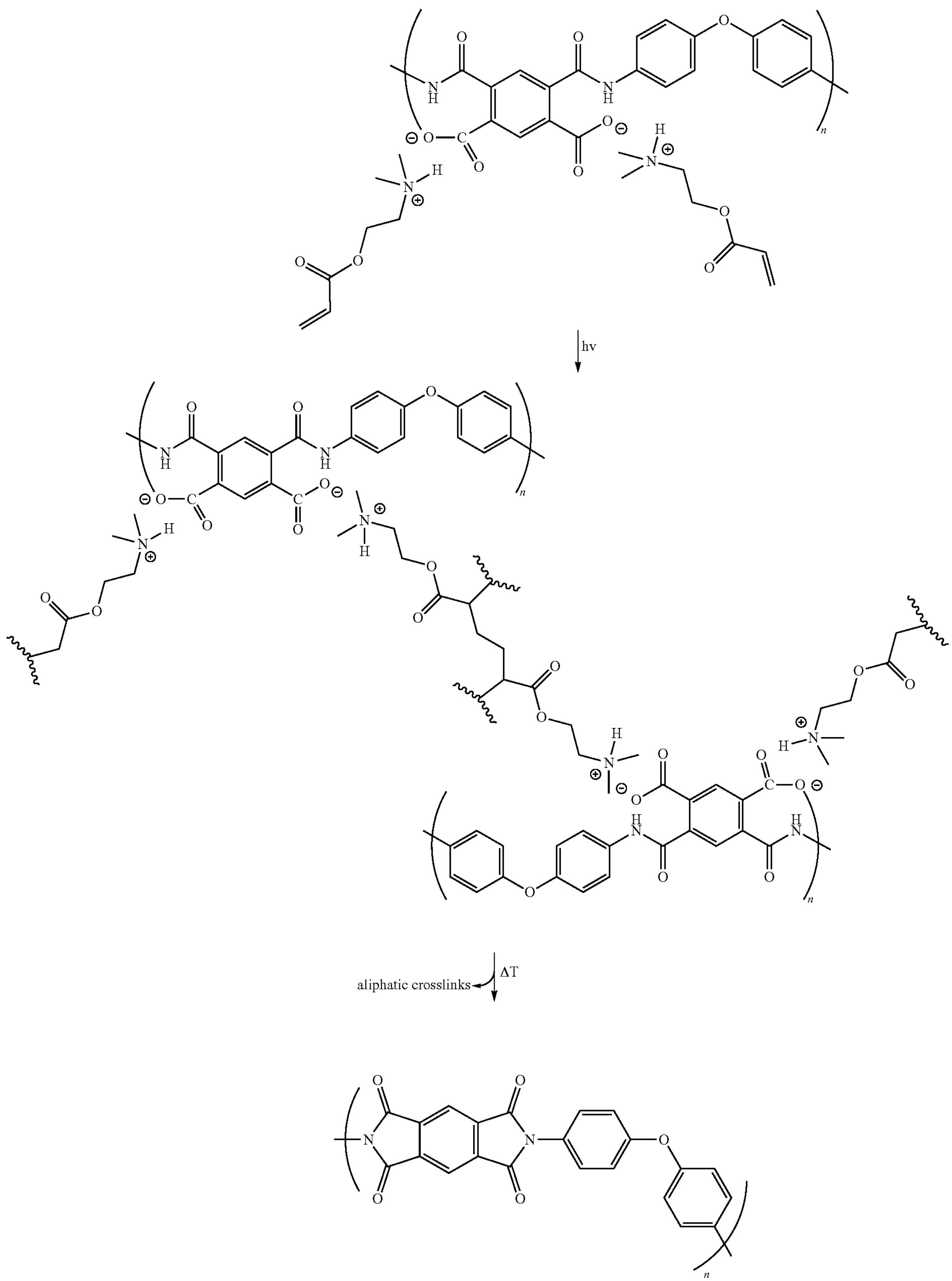

Example 2. Two-Step Synthesis of Photo-Crosslinkable Polyamic Acid Salt. PMDA-ODA Polyamic Acid Salt Containing 2-(Dimethyl)Aminoethyl Acrylate (DMAEA) as Photo-Curable Amine, Dissolved in NMP/$H_2O$ Mixture Synthesis of PMDA-ODA Polyamic Acid The synthesis of PI\1DA-ODA polyamic acid was performed as described in Example 1. However, after 12 h polymerization time, the polyamic acid was isolated by precipitation in an ice-cold mixture of methanol/water (50:50). A blender was used to break apart larger polymeric clumps. Subsequently, the PMDA-ODA polyamic acid was filtered off and washed three times with a methanol/water mixture. Afterwards, the product was dried in a vacuum oven for 24-72 h at 60° C. and stored in a desiccator.

Preparation of PMDA-ODA Polyamic Acid Salt

For SLA, dried polyamic acid was dissolved in NMP. Subsequently, DMAEA (1.1 eq per COOH group of polyamic acid) and water were added and the mixture was stirred overnight. The NMP/water ratio was 13:1 and polyamic acid/DMAEA content in solution was 15 wt. %.

3D Printing Using SLA

Photoinitiator (1.5 wt. % dissolved in NMP) was added to the mixture and after complete dissolution, the solution was transferred to the vat of the SLA set-up.

Post-Printing Treatment and Imidization

Post-processing was conducted in analogy to Example 1.

Example 3. Use of Commercially-Available Poly (Pyromellitic Dianhydride-Co-4,4'-Oxydianiline) Amic Acid Solution in NMP (15-16 wt. %, Pyre-M.L.® RC-5019) as Precursor Polymer Synthesis of PMDA-ODA Polyamic Acid Salt The PAA solution in NMP was added to a round bottom flask. Subsequently, water and DMAEA (0.5 eq per COOR-group in the precursor polymer) were added and the mixture was stirred until a homogeneous solution was obtained (12 h).

3D Printing Using SLA 3D printing using SLA was performed as described in Example 1.

Post-Printing Treatment and Imidization

Post-processing was conducted in analogy to Example 1.

Example 4. Varying the Amount of DMAEA in PAA DMAEA Salts

Synthesis of PMDA-ODA Salt

PMDA-ODA polyamic acid was synthesized as described in Example 1, Example 2 or Example 3. But, only 0.5 equiv. DMAEA (0.5 equiv. per COOH of PAA) was added to the solution, followed by the respective amount of $H_2O$.

3D Printing and post-printing treatment was conducted in analogy to Example 1.

Example 5. Using Different Solvents for PAA DMAEA Salts. Avoiding Water as Co-Solvent Synthesis of PMDA-ODA Salt PMDA-ODA polyamic acid was synthesized as described in Example 1, Example 2 or Example 3. Then, 0.5 equiv. DMAEA was added to the solution and no water was added. Consequently, a PAA DMAEA solution in NMP was obtained.

3D Printing and post-printing treatment was conducted in analogy to Example 1.

Example 6. Using Different Photoinitiators

Synthesis of PMDA-ODA Salt

PMDA-ODA polyamic acid was synthesized as described in Example 1, Example, Example 3. Then, 0.5 equiv. DMAEA was added to the solution and the respective amount of water (NMP/H2O 13:1). 3D Printing and post-printing treatment was conducted in analogy to Example 1. However, instead of TPO, 1.5 wt. % PPO was utilized as photoinitiator (calculated on PAA+DMAEA).

Example 7. Use of Different Photocurable Amine, N,N-(Dimethylamino)Ethyl Methacrylate Synthesis of PMDA-ODA Salt PMDA-ODA polyamic acid was synthesized as described in Example 1, Example 2 or Example 3. For example, 281.2 g commercially-available PAA solution in NMP (15 wt. %) was added to a three-neck round bottom flask, equipped with a mechanical stirrer and a N2 inlet. Subsequently, 18.6 mL DMAEMA (0.5 eq per COOR-group in the PAA polymer) and 0.89 g TPO (1.5 wt. %, calculated on PAA+DMAEMA, dissolved in 0.7 mL NMP) were added to the mixture and the mixture was stirred under $N_2$ atmosphere until a homogeneous solution was obtained (12 h). Total solids were 20 wt. %. The synthesis scheme is illustrated in Scheme 8.

Scheme 8. Synthesis scheme of PAA 0.5 equiv. DMAEMA solution in NMP.

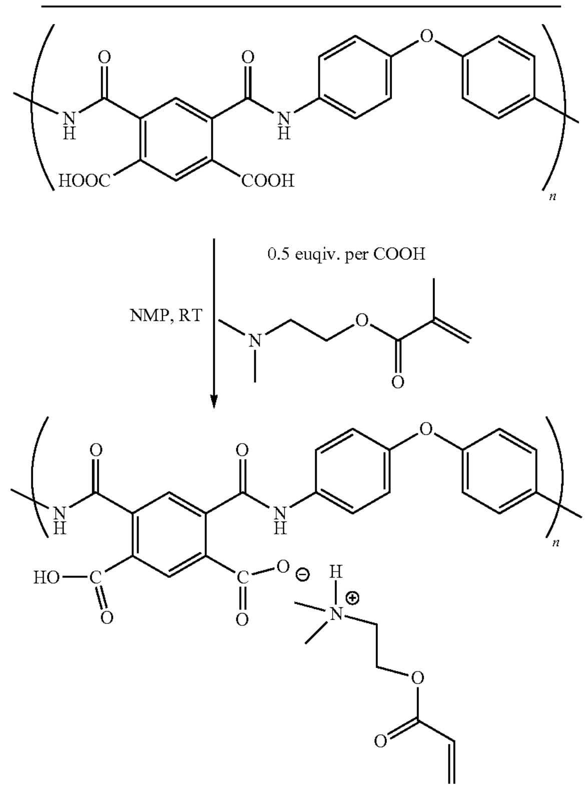

3D Printing and post-printing treatment was conducted in analogy to Example 1.

Example 8. PAA-DMAEMA Salts. Variation of Solvent

Synthesis of PMDA-ODA Polyamic Acid Salt

The PAA DMAEMA (0.5 quiv.) solution was prepared as described in Example 7. However, in addition, water was added to the solution to obtain a NMP/H2O ratio of 13:1. In particular, 289.5 g commercial PAA solution in NMP (15 wt. %) was added to a three-neck round bottom flask, equipped with a mechanical stirrer and a $N_2$ inlet. Subsequently, 19.16 mL DMAEMA (0.5 eq per COOH-group in the PAA polymer), 0.92 g TPO (1.5 wt. %, calculated on PAA+DMAEMA, dissolved in 0.7 mL NMP) and 19 mL $H_2O$ were added to the mixture and the mixture was stirred under $N_2$ atmosphere until a homogenous solution was obtained (12 h). Total solids were 19 wt. %.

3D Printing and post-printing treatment was conducted in analogy to Example 1.

Example 9. PAA-DMAEMA Salts. Variation of DMAEMA Amount

Synthesis of PMDA-ODA Polyamic Acid Salt

The PAA DMAEMA solution was prepared as described in Example 7. However, instead of adding 0.5 equiv. DMAEMA to the PAA solution in NMP, 1 equiv. DMAEMA was added. For example, 300 g commercial PAA solution in NMP (15 wt. %) was added to a three-neck round-bottomed flask, equipped with a mechanical stirrer and a $N_2$ inlet. Subsequently, 39.7 mL DMAEMA (1 eq per COOR-group in the PAA polymer) and 1.23 g TPO (1.5 wt. %, calculated on PAA+DMAEMA, dissolved in 1 mL NMP) were added to the mixture and the mixture was stirred under N2 atmosphere until a homogenous solution was obtained (12 h). Total solids were 24.5 wt. %. 3D Printing and post-printing treatment was conducted in analogy to Example 1.

Example 10. PAA Salt Formation and Isolation of the Salt

Synthesis of PMDA-ODA Polyamic Acid

PMDA-OD A polyamic acids can be synthesized as described in Examples 1-9. After the PMDA-OD A PAA salt is formed, it is precipitated into acetone. The precipitated PMDA-ODA salt is filtered-off, washed three times with acetone and dried in vacuum for 24 h. The material was stored in a desiccator at room temperature. Before 3D printing, the precipitated PMDA-OD A salt was re-dissolved in NMP and the respective amount of photoinitiator (TPO) was added to the solution.

3D Printing and post-printing treatment was conducted in analogy to Example 1.

Example 11. Two-Step Synthesis of Photo-Crosslinkable Polyamic Acid Salt. PMDA-ODA Polyamic Acid Salt Containing 2-(Dimethyl)Aminoethyl Methacrylate as Photo-Curable Amine and Ammonia (Aq.) as Nonreactive Amine, Soluble in H2O (Scheme 9)

Synthesis of PMDA-ODA Polyamic Acid

PMDA-OD A polyamic acid synthesis was performed as described in Example 2.

Preparation of PMDA-ODA Polyamic Acid Salt

Per carboxyl-group in the precursor polymer, 0.6 eq DMAEMA and 0.5 eq NH·OH were added to a round bottom flask and dissolved in water. Subsequently the dried polyamic acid was added and the mixture was stirred until complete dissolution. Polyamic acid/NH·OH/DMAEMA content in water was 15 wt. %.

Scheme 9. Synthesis scheme of water-soluble PAA salt starting from polyamic acid and DMAEMA and NILOH to form salt.

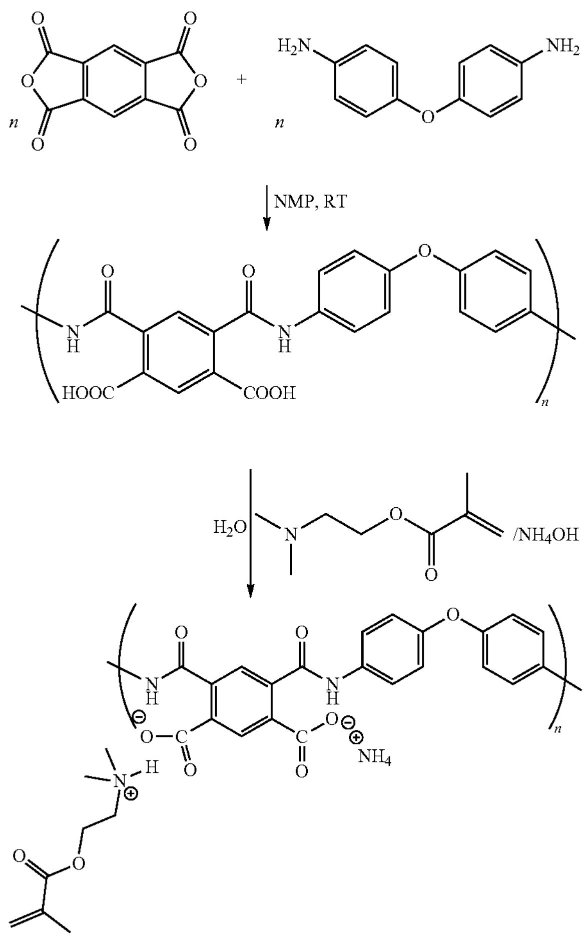

3D Printing Using SLA and Post-Treatment of 3D Printed Parts

Photoinitiator (1.5 wt % TPO Li) was added to the mixture and after complete dissolution, the solution was transferred to the vat of the SLA set-up.

Post-Printing Treatment and Imidization

Post-processing was conducted in analogy to Example 1.

Example 12. Two-Step Synthesis of Photo-Crosslinkable Polyamic Acid Salt. PMDA-OD a Polyamic Acid Salt Containing 2-(Dimethyl)Aminoethyl Acrylate as Photo-Curable Amine and Ammonia (Aq.) as Nonreactive Amine, Soluble in $H_2O$ Preparation of PMDA-ODA Polyamic Acid Salt The PAA salt solution was prepared as described in Example 11, but instead of DMAEMA, DMAEA was utilized as UV-curable amine.

3D Printing Using SLA and Post-Treatment of 3D Printed Parts

Photoinitiator (1.5 wt % TPO Li) was added to the mixture and after complete dissolution, the solution was transferred to the vat of the SLA set-up.

Post-Printing Treatment and Imidization

Post-processing was conducted in analogy to Example 1.

Example 13. Printing Under Inert Gas Atmosphere

Preparation of PMDA-ODA Polyamic Acid Salt

PAA salt solutions were prepared as described in Examples 1-12.

3D Printing Using SLA

3D Printing was conducted as described in Examples 1-12. However, instead of printing under air, this time, the printing was conducted under argon atmosphere using a constant argon flow during the print.

Post-Printing Treatment and Imidization.

Post-printing treatment and imidization was conducted as described in Example 1.

Example 14. Increasing Imidization Temperature

Preparation of PMDA-ODA Polyamic Acid Salt

PAA salt solutions were prepared as described in Examples 1-13.

3D Printing Using SLA 3D printing was conducted as described in Examples 1-13.

Post-Printing Treatment and Imidization

Post-printing was conducted as described in Example 1, but after heating the sample to 350° C., the temperature was raised to 450° C. and held for another 30 min under $N_2$ atmosphere. The sample was removed from the oven after the oven was cooled down to room temperature.

Example 15. Increasing Imidization Temperature

Preparation of PMDA-ODA Polyamic Acid Salt

PAA salt solutions were prepared as described in Examples 1-13.

3D Printing Using SLA 3D printing was conducted as described in Examples 1-13.

Post-Printing Treatment and Imidization

Post-printing was conducted as described in Example 1, but after heating the sample to 350° C., the temperature was raised to 400° C. and held for another 30 min under N2 atmosphere. The sample was removed from the oven after the oven was cooled down to room temperature.

Example 16. Studying Solution Stability of PAA DMAEMA Salts

Preparation of PMDA-ODA Polyamic Acid Salt

PAA DMAEMA salt solutions were prepared as described in Examples 7. The solution was stored at −20° C. in the dark for 1 month before 3D printing.

3D Printing Using SLA 3D printing was conducted as described in Examples 1-13.

Post-Printing Treatment and Imidization.

Post-printing treatment and imidization was conducted as described in Example 15.

References for Examples 1-16 and Specification Unless Otherwise Specified

1. Choi, J.-W.; Lu, Y.; Wicker, R., Projection Microstereolithography as a Micro-Additive Manufacturing Technology: Processes, Materials, and Applications. 2015, 101-129.
2. Sirrine, J. M.; Pekkanen, A. M.; Nelson, A. M.; Chartrain, N. A.; Williams, C. B.; Long, T. E., 3DPrintable Biodegradable Polyester Tissue Scaffolds for Cell Adhesion. *Australian Journal of Chemistry* 2015, 68 (9), 1409.
3. Melchels, F. P.; Feijen, J.; Grijpma, D. W., A review on stereolithography and its applications in biomedical engineering. *Biomaterials* 2010, 31 (24), 6121-30.
4. Halloran, J. W., Ceramic Stereolithography: Additive Manufacturing for Ceramics by Photopolymerization. *Annual Review of Materials Research* 2016, 46 (1), 19-40.
5. Hegde, M.; Meenakshisundaram, V.; Chartrain, N.; Sekhar, S.; Tafti, D.; Williams, C. B.; Long, T. E., 3D Printing All-Aromatic Polyimides using Mask-Projection Stereolithography: Processing the Non processable. *Adv Mater* 2017.
6. Guo, Y.; Ji, Z.; Zhang, Y.; Wang, X.; Zhou, F., Solvent-free and photocurable polyimide inks for 3D printing. *J. Mater. Chem. A* 2017.
7. Yoda, N., Recent Development of Advanced Functional Polymers for Semiconductor Encapsulants of Integrated Circuit Chips and High-temperature Photoresist for Electronic Applications. *Polymers for Advanced Technologies* 8 (4), 215-226.
8. Fukushima, T.; Oyama, T.; Tomoi, M., Ionic-bonded negative photosensitive polyimides having pendant aminoalkyl (meth)acrylamide groups. *Reactive and Functional Polymers* 2003, 56 (1), 59-73.
9. Fairbanks, B. D.; Schwartz, M. P.; Bowman, C. N.; Anseth, K. S., Photoinitiated polymerization of PEG-diacrylate with lithium phenyl-2,4,6-trimethylbenzoylphosphinate: polymerization rate and cytocompatibility. *Biomaterials* 2009, 30 (35), 6702-7.
10. Balta, D. K.; Temel, G.; Aydin, M.; Arsu, N., Thioxanthone based water-soluble photoinitiators for acrylamide photopolymerization. *European Polymer Journal* 2010, 46 (6), 1374-1379.
11. Aydin, M.; Arsu, N.; Yagci, Y., One-Component Bimolecular Photoinitiating Systems, 2. *Macromolecular Rapid Communications* 2003, 24 (12), 718-723.
12. Tullos, G. L.; Powers, J. M.; Jeskey, S. J.; Mathias, L. J., Thermal Conversion of Hydroxy-Containing Imides to Benzoxazoles: Polymer and Model Compound Study. *Macromolecules* 1999, 32 (11), 3598-3612.

Example 17

Additive manufacturing (AM), or 3D printing processes create customized, complex three-dimensional components via a layer-wise fabrication approach.[1] Although rapidly growing, industrial adoption of AM is stymied by a limited selection of processable high-temperature engineering polymers.[2] The current library of polymers were optimized for traditional manufacturing processes (e.g., molding and extrusion processes), but are not necessarily well-suited for the unique physics of the layer-by-layer nature of AM processes and their rapid nonhomogeneous kinetics. As such, polymers must be adapted to work within the physics of AM processes. In particular, high-performance polymers need to be modified to be utilized in AM due to their high or nonexistent flow temperatures and low solubility. While researchers developed strategies to 3D print high-performance polymers, such as poly(ether ether ketone) (PEEK),[3] poly(phenylene sulfide),[4] and thermoplastic poly(ether imide)s,[5] sparse attention has been devoted to the AM of all-aromatic, nonmelt processable PIs.[6-8]

Poly(4,4'-oxidiphenylene pyromellitimide) (PMDA-ODA) PI has been developed in the 1960s and is commercially known by the trade name Kapton. It is one of the highest performing polymers due to its excellent mechanical strength over a temperature range of −269° C. to +400° C.[9] Its all-aromatic chemical structure provides chemical and UV-irradiation resistance and nonflammability, which render it attractive for aerospace and defense applications.[9] Its low dissipation factors and low dielectric constant also make it well-suited for electronic applications.[9] Although the all-aromatic structure imparts outstanding properties to PMDA-ODA PI, its lack of sufficient melt flow and insolubility in organic solvents precludes traditional manufacturing (e.g., molding, casting, extrusion). Traditionally, PMDA-ODA PI is processed in the nonimidized polyamic acid (PAA) form. PAA is dissolved in an aprotic polar solvent, casted on a substrate and thermally imidized to yield the nonsoluble PI.[10] This solvent-based fabrication pairs the PI parts with an inherent 2D form factor. Three-dimensional PMDA-ODA PI parts are accessible, but require high-temperature sintering processes, which restricts part of the design.[10,11]

These challenges have made AM of all-aromatic PIs elusive. To date, only few reports have addressed AM of PMDA-ODA PI. One utilized inkjet printing to manufacture thin insulating layers for capacitors, but the process was incapable of forming 3D structures.[8] Modified PMDA-ODA PAA for vat photopolymerization (VP). has been generated[6,7] VP, also known as stereolithography, utilizes a vat that is filled with a liquid photoresin. Subsequent patterned UV irradiation selectively cures the photoresin, to create a 3D part layer-by-layer.[12] Inspired by photosensitive polyimides used in photolithographic processes to produce thin patterned films for the microelectronics industry,13 our group synthesized a resin consisting of a photo cross-linkable polyimide precursor, polyamic diacrylate ester (PADE).[6] Leveraging VP to produce 3D parts, selective UV-irradiation of the PADE solution induced cross-linking of the acrylate groups and yielded an organogel. Subsequent drying and heating removed the solvent, promoted thermal degradation of the aliphatic cross-links, and converted the PADE to PMDA-ODA PI. Because of the rather time-consuming synthesis of PADE, we also successfully demonstrated photocurable PAA 2-(dimethylamino)ethyl methacry-late (DMAEMA) salt solutions as alternative photoresins for use in VP.[7] However, viscosity limitations imposed by VP restricted resin rheology, and thus solids loading of the polymer precursor.[14,15] To circumvent the viscosity constraints imposed by VP, afford the opportunity to print multiple materials in a single part, and reduce the amount of resin required to print, the authors look to direct ink write (DIW).

DIW is an additive manufacturing technique that selectively extrudes material by applying pressure to an ink, forcing it through a nozzle and onto a substrate to create a three-dimensional part.[12] For successful 3D printing via DIW, the material must be extrudable through a nozzle and, once deposited, rapidly solidify to retain its shape.[12] Several solidification mechanisms exist: (i) inks possessing a yield stress, meaning that the ink rapidly solidifies upon release of shear-stress,[16] (ii) solvent evaporation,[17] and (iii) gelation.[18] Ultraviolet-assisted direct ink write (UV-DIW) is a subcategory of DIW, which utilizes UV-irradiation to cross-link the extruded photopolymer resins during printing to induce gelation and shape retention after ink placement.19 One advantage of UV-DIW over VP and inkjet material jetting AM processes is the ability to deposit a wide range of viscoelastic materials with viscosities in excess of 10 000 Pa·s.[14,16] In addition, integration of multiple DIW systems into one printer enables simultaneous deposition of multiple materials into a single printed part, which enables manufacture of complex devices, such as soft robots and batteries.[20,21]

Figure 19:
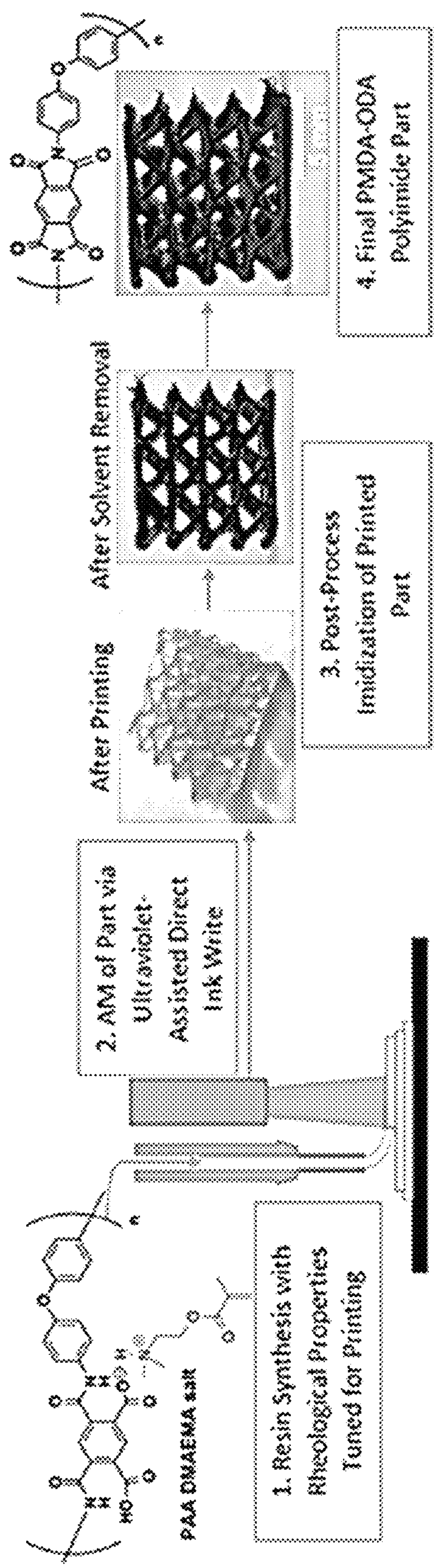
FIG. 19 shows a process summary of printing PMDA-ODA PI parts starting with the synthesis of a tailored UV-Curable Ink (PAA DMAEMA Salt Solution). Printing using UV-DIW produced a self-supporting 3D organogel structure. Thermal treatment released the solvent, promoted thermal degradation of the PDMAEMA crosslinks, and imidized the ink to yield all-aromatic PMDA-ODA PI parts.

This work exploits UV-DIW to additively manufacture PMDA-ODA polyimide parts (FIG. 19). The tailored synthesis of a PAA 2-(dimethylamino)ethyl methacrylate (DMAEMA) salt solution yielded a UV-curable photoresin with a zero-shear rate viscosity of 770 Pa·s. The high photoreactive resin viscosity and shear thinning behavior enabled extrusion using DIW, and subsequent UV-irradiation to yield a self-supporting organogel. A short gel time and high gel state modulus enabled printing of freeform 3D structures This Example can demonstrate, inter alia, UV-DIW to additively manufacture PMDA-ODA polyimide parts (FIG. 19). The tailored synthesis of a PAA 2-(dimethylamino)ethyl methacrylate (DMAEMA) salt solution yielded a UV-curable photoresin with a zero-shear rate viscosity of 770 Pa·s. The high photoreactive resin viscosity and shear thinning behavior enabled extrusion using DIW, and subsequent UV-irradiation to yield a self-supporting organogel. A short gel time and high gel state modulus enabled printing of freeform 3D structures without need for support material. Finally, postprocess thermal treatment yielded PM DA-ODA PI with similar thermome-chanical properties as commercial Kapton film.

The strategy to AM PMDA-ODA PI using VP leveraged the solubility of PMDA-ODA polyamic acid (PAA).[7] The addition of an amino-functional methacrylate (DMAEMA) to a PAA solution rendered a photo-cross-linkable PAA DMAEMA salt solution (15 wt % PI solids), where the protonated DMAEMA interacted electro-statically with the partially deprotonated PAA. Selective layer-wise photocuring in VP system produced an organogel. Drying and heating released the solvent, promoted thermal degradation of the aliphatic cross-links and induced imidization to convert the organogel to the all-aromatic PMDA-ODA PI. The VP systems used low solution viscosities of the resins, thus limiting their synthesis and formulation. In addition, the VP systems need a vat filled with resin, which increases the amount of material required and does not readily enable the deposition of multimaterial parts.

Figure 23:
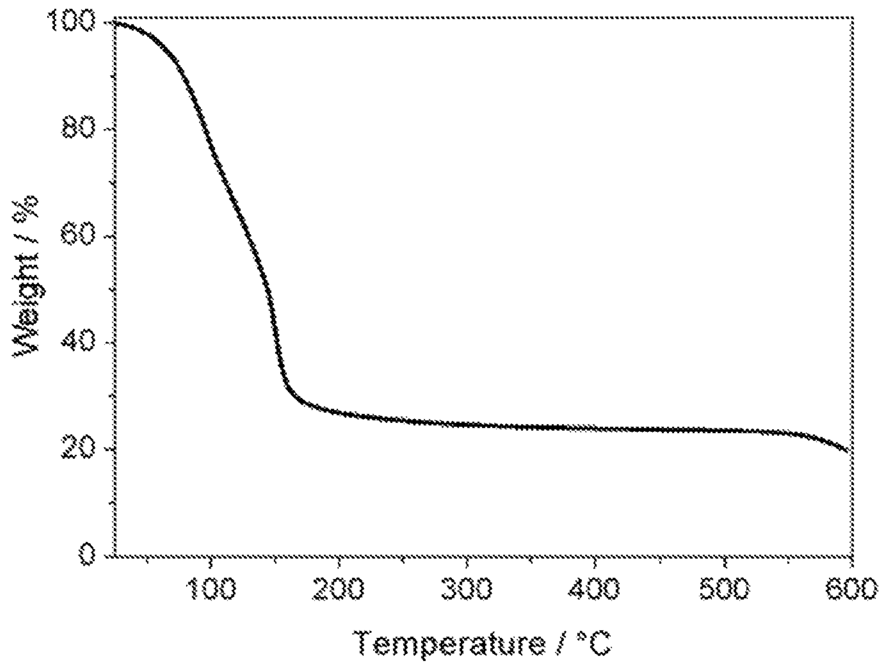
FIG. 23 shows a graph that can demonstrate TGA trace of PAA 0.5 equiv. DMAEMA salt solution with 24 wt % PI solids (determined from remaining weight at 400° C.).
Figure 24:
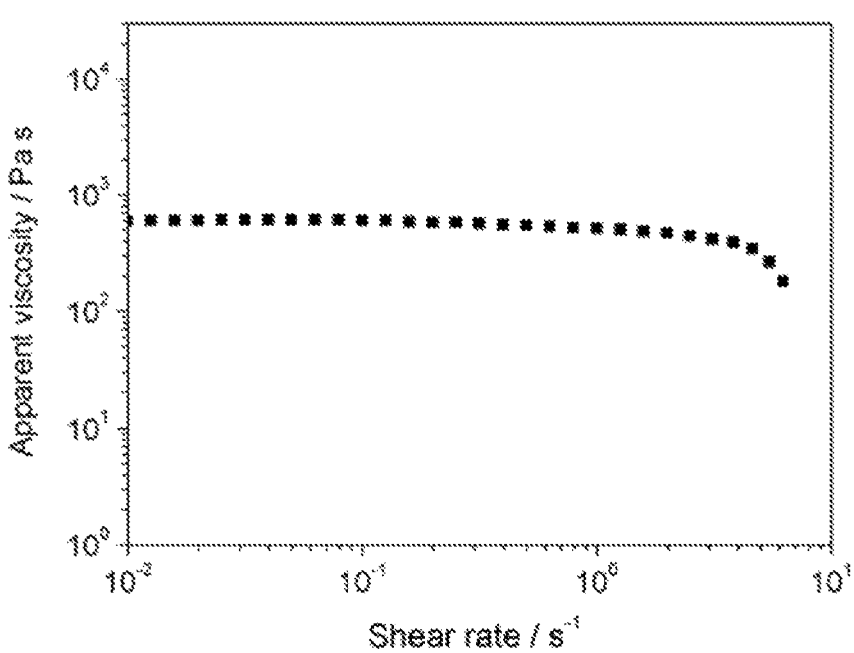
FIG. 24 shows a graph that can demonstrate a flow sweep of PAA 0.5 equiv. DMAEMA salt solution (24 wt % PI solids).
Figure 25:
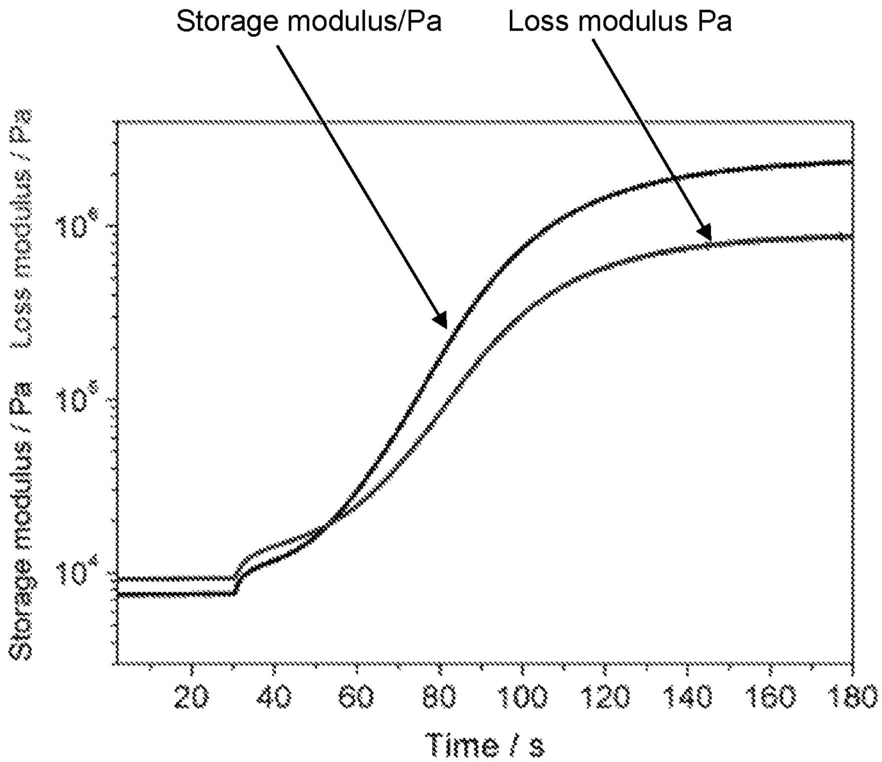
FIG. 25 shows a graph that can demonstrate Moduli (Pa) versus time (s) for photorheology of PAA 0.5 equiv. DMAEMA salt solution (24 wt % PI solids) and 10 wt % photoinitiator (TPO). UV-light irradiation started at 30 s. Determined gel time=23 s.
Figure 26:
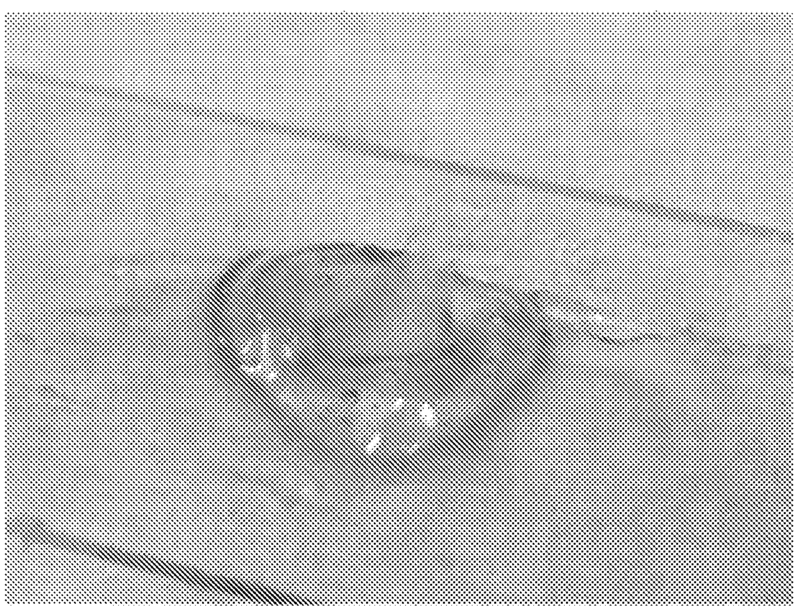
FIG. 26 shows a photographic image that can demonstrate PAA 0.5 equiv. DMAEMA (24 wt % PI) photoresin failed to produce a well-defined and controlled 3D part with the UV-DIW process due to the long gel time (about 20 s).

In this Example, high viscosity resins, facilitate multimaterial printing, and reduce material usage, UV-DIW was as a printing technique. Similar to VP, UV-DIW required an ink with a short gel time, but contrary to VP, it used high solution viscosities and shear-thinning flow behavior. Utilizing the PAA DMAEMA salt strategy, to obtain high viscosity resins, the solids of the PAA solution were increased to generate an ink for UV-DIW. However, this approach failed. The dissolution of PAA in NMP and addition of DMAEMA (0.5 equiv. per COOH) rendered a solution with 24 wt % PI solids, e.g., a solution with 9 wt % higher PI solids compared to the VP photoresin (FIG. 23). Although the ink possessed a promising high zero-shear rate viscosity of 600 Pa·s and started to shear-thin at low shear rates (about 3 $s^{-1}$)(FIG. 24), the ink produced via this approach suffered from slow photocuring characteristics. Photorheology elucidated that a solution with 10 wt % photoinitiator (TPO) possessed a rather long gel time (about 20 s) (FIG. 25). Translated to the UV-DIW process, slow photocuring caused poor layer fidelity after ink deposition and precluded precise printing (FIG. 26).

Figure 27:
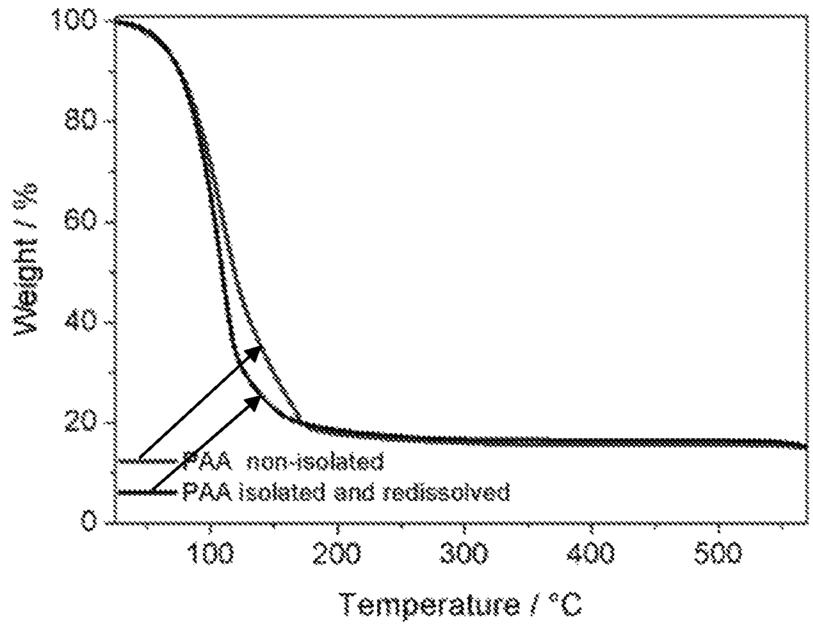
FIG. 27 shows a graph that can demonstrate TGA traces of PAA (targeted Mn=50 k g·mol-1) in NMP, isolated as solid and redissolved (black trace) and non-isolated (red trace). Solids were determined from remaining weight at 400° C. and are ~16 wt % PI for both samples.
Figure 28:
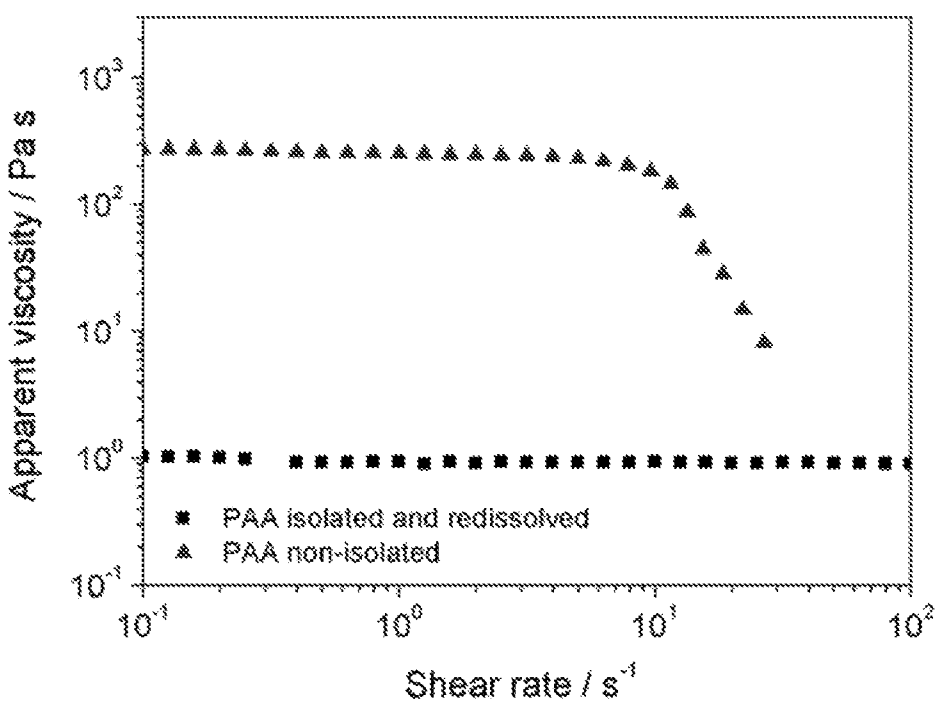
FIG. 28 shows a graph that can demonstrate Apparent viscosity (Pas) versus shear rate ($s^{-1}$) for PAA (targeted Mn=50 k g·$mol^{-1}$) in NMP (16 wt % PI solids), isolated as solid and redissolved (black trace) and non-isolated PAA (red trace).

Instead of increasing the PI solid content of the ink, the unusual solution viscosities of polyamic acids was leveraged. The solution viscosities of PAAs depend strongly on their synthetic history. In particular, the viscosity of a PAA NMP solution is much higher if utilized directly after polymerization than if the PAA is precipitated from the reaction medium (NMP) into a nonsolvent, filtered off, dried and redissolved. For example, step-growth polymerization of PMDA and ODA in NMP afforded a PAA with 16 wt % PI solids, which possessed an initial zero-shear rate solution viscosity of 270 Pa s. In contrast, after precipitation of the PAA in a methanol/water mixture, drying and redissolution in NMP, the viscosity of the PAA solution dropped to 0.9 Pa·s, which is more than two orders-of-magnitude lower (FIGS. 27-28). Differences in PAA chain conformations in solution can impart this change in viscosity.[10] In addition to differences in solution viscosity, the precipitated and redissolved PAA solution possessed an intensified amber color, which indicated partial imidization of the PAA due to drying at 60° C. This complicated UV-DIW because the strong light absorbance of PMDA-ODA PI in the range of 200 to 500 nm hinders UV-absorbance of the photoinitiator and consequently impedes UV-initiation and cross-linking.[22]

The decreased UV-absorbance of nonisolated PAAs and their increased solution viscosities inspired exploitation of nonisolated PAAs as precursors for UV-DIW of polyimides. Step-growth polymerization of excess dianhydride (e.g., PMDA) and diamine (e.g., ODA) yielded a PAA with a targeted number-average molecular weight ($M_n$) of 50 kg $mol^{-1}$ and dianhydride end groups (Scheme (10)).

Scheme (10) UV-DIW ink preparation scheme. Step-growth polymerization of ODA and excess PMDA yielded a PMDA-ODA PAA with dianhydride end groups (indicated by the asterisk) in NMP. Addition of DMAEMA rendered the UV-curable ink. UV-illumination initiated crosslinking of DMAEMA and afforded an organogel. Drying and heating produced the all aro-matic PMDA-ODA PI and promoted thermal degredatin of the PDMAEMA crosslinks.

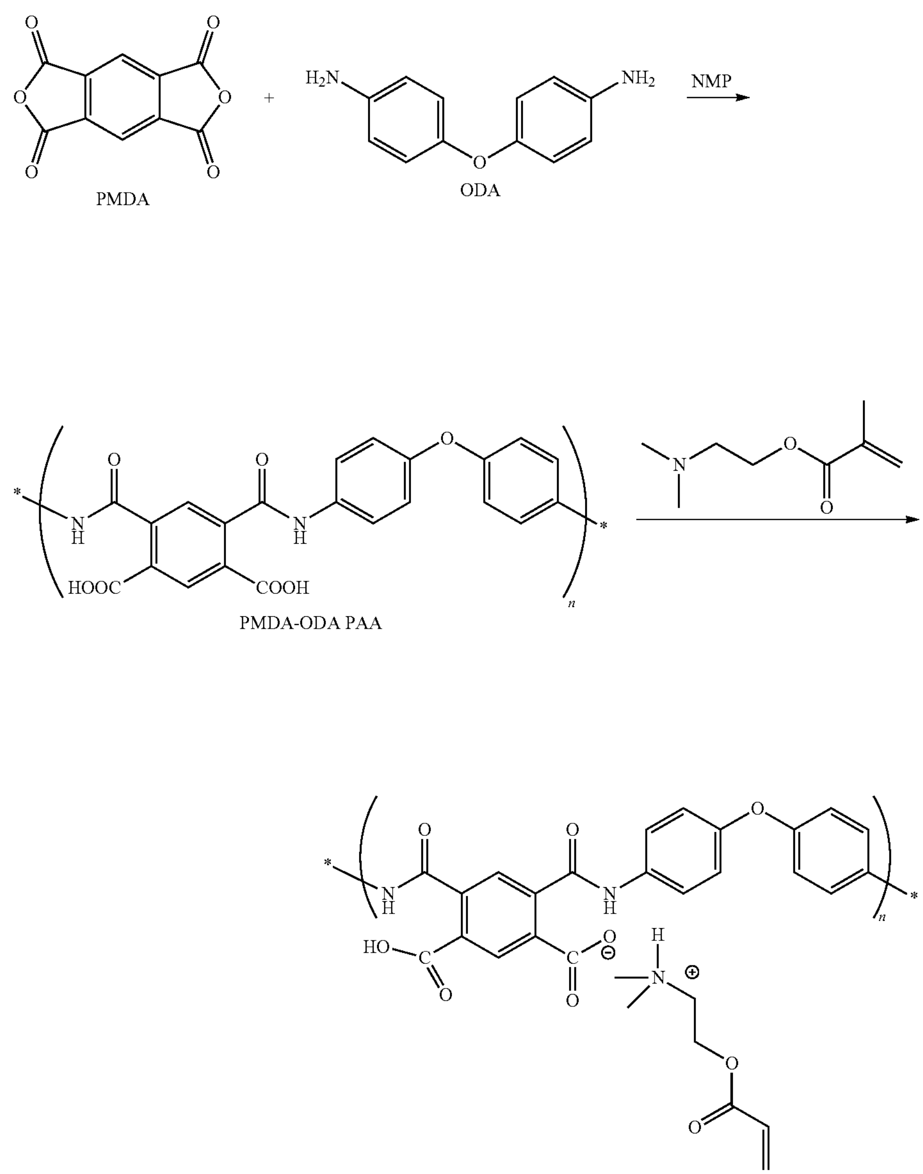

-continued

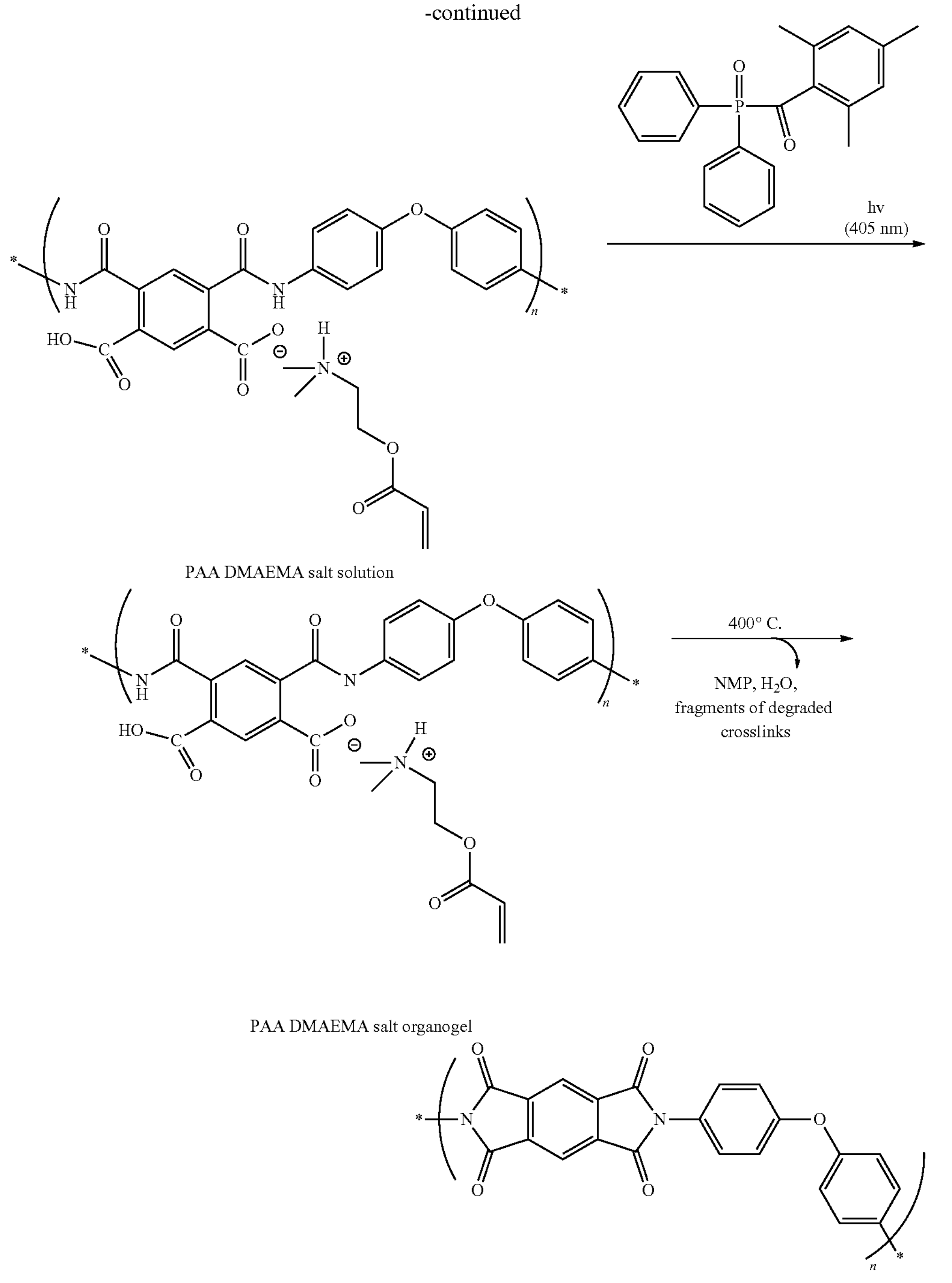

Figure 20A:
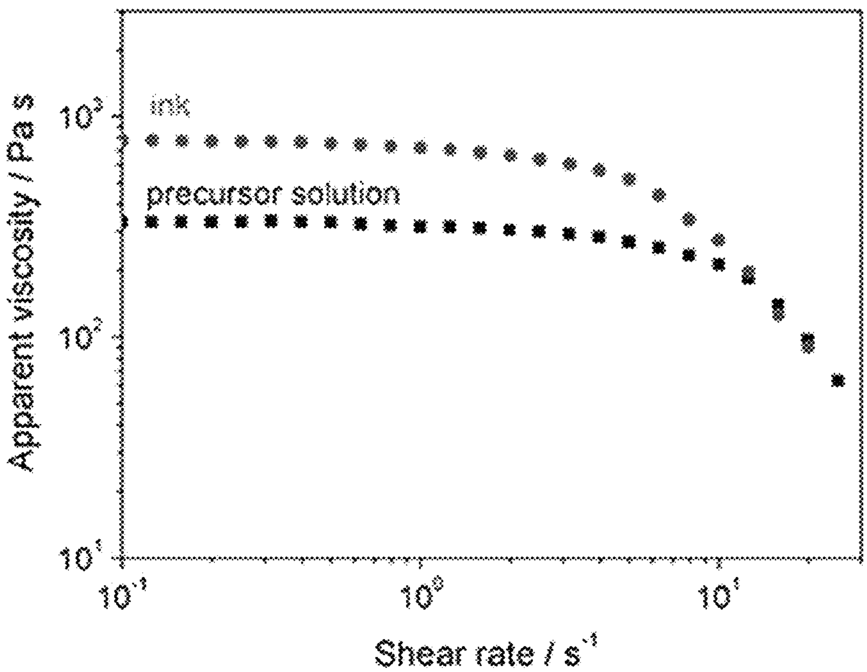
FIGS. 20A-20B shows graphs that show data for a representative ink.
Figure 20B:
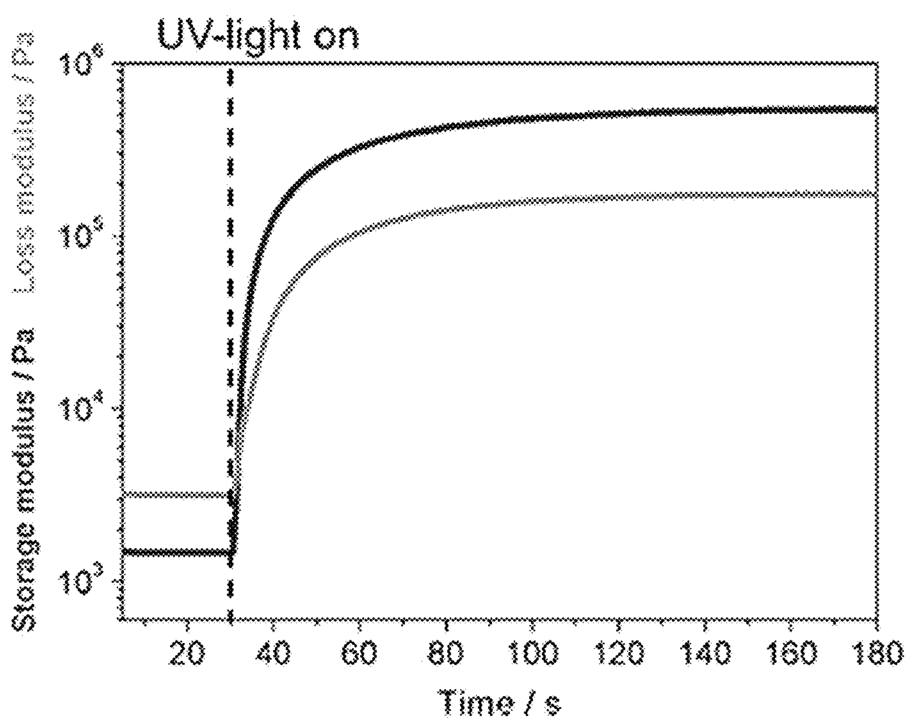
Figure 29:
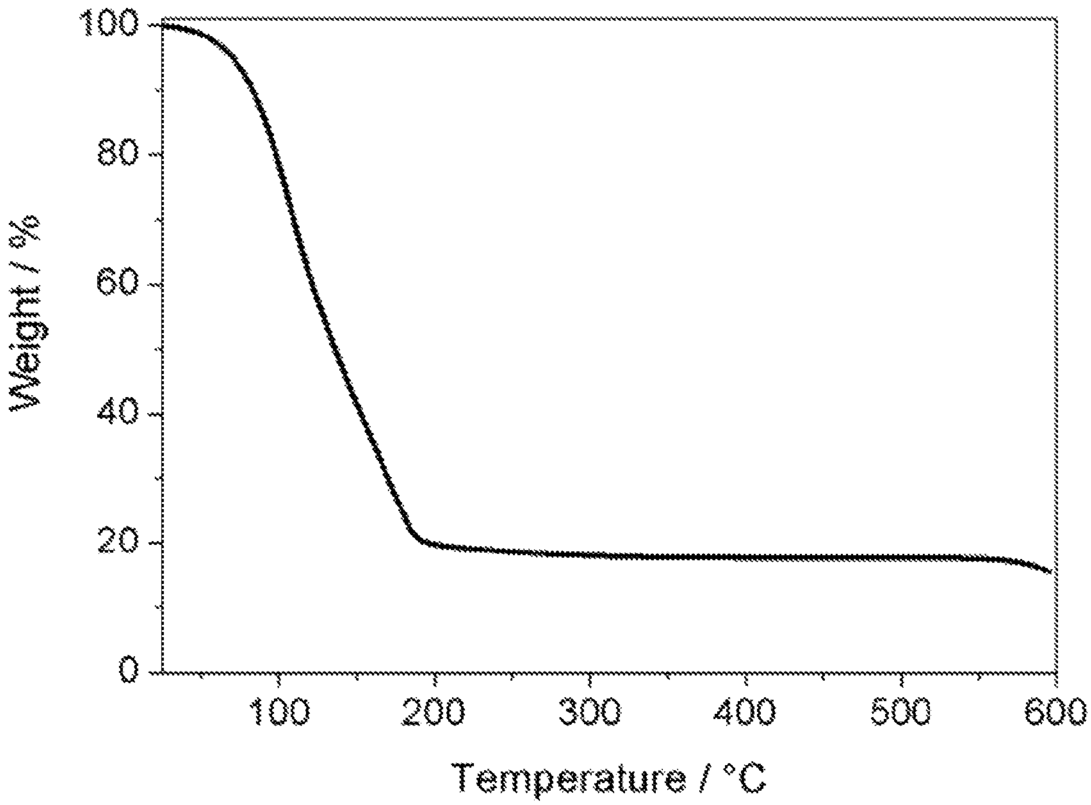
FIG. 29 shows a graph that can demonstrate TGA traces of a representative PAA (targeted Mn=50 k g·$mol^{-1}$) in NMP, 17.8 wt % PI solids, determined from remaining weight at 400° C.
Figure 30:
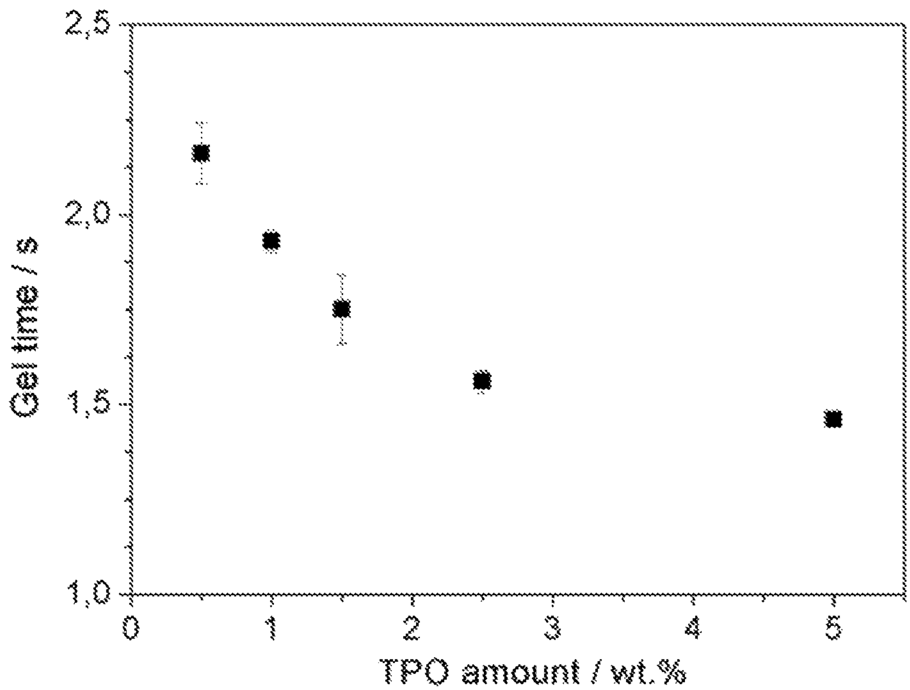
FIG. 30 shows a graph that can demonstrate gel time (s) versus TPO amount (wt %) for a representative PAA 0.5 equiv. DMAEMA salt solution.

A representative nonisolated PAA solution (precursor) consisted of 17.8 wt % PI solids (FIG. 29) and possessed a zero-shear rate viscosity of 330 Pa·s. The addition of 0.5 equiv. of DMAEMA to the solution increased the viscosity further to 770 Pa·s and pronounced the shear-thinning flow behavior, which reduced the pressure required for extrusion through a nozzle (FIG. 20A). Addition of a typical UV-light photo-initiator (TPO) enabled UV-cross-linking of the DMAEMA groups. Because DMAEMA interacted electrostatically with the PAA backbone, UV-cross-linking of the DMAEMA induced gelation of the ink and afforded an organogel. Photorheology studies elucidated the gel state storage modulus (G') and gel time of the ink (FIG. 20B). Varying the TPO amount and plotting the gel times versus wt % TPO indicated that 2.5 wt % TPO was the minimum amount of photoinitiator to provide short gel times below 1.7 s (FIG. 30 and FIG. 20B). Fast gelation was crucial to solidify the printed lines in place after ink deposition. In addition, a high gel state modulus guaranteed shape retention of the deposited lines and allowed for printing of self-supporting structures.

Figure 21A:
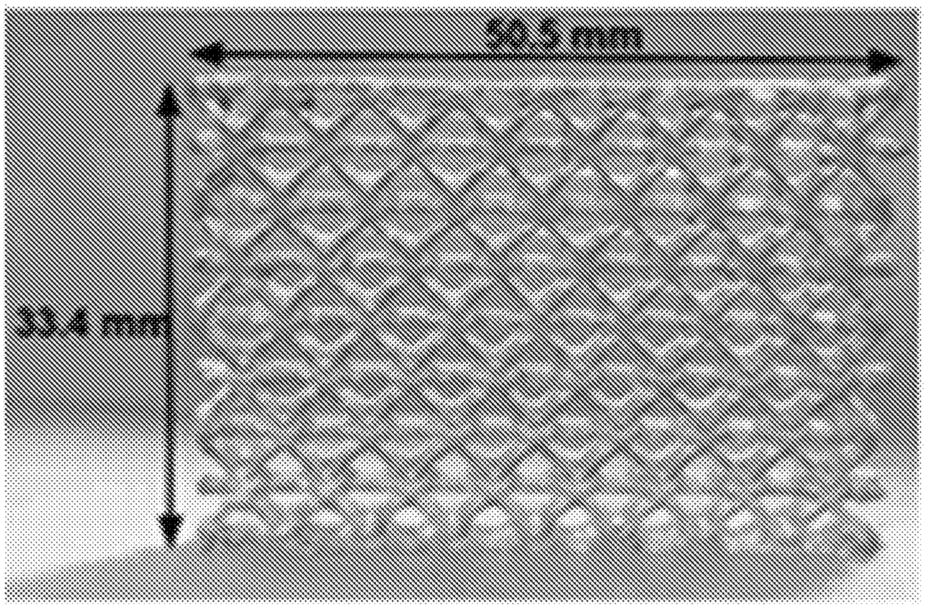
Figure 21B:
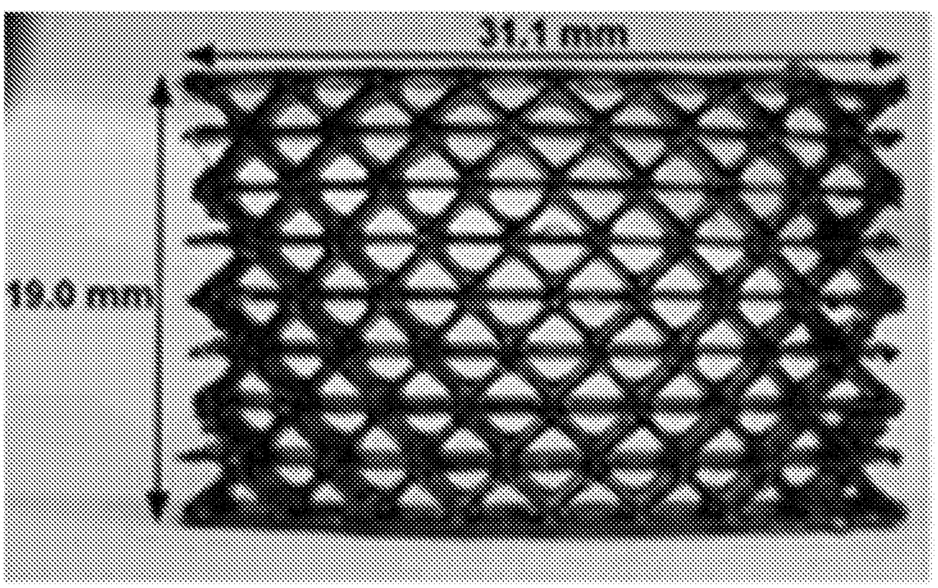

A custom-built UV-DIW printer enabled AM of the ink (PAA DMAEMA salt solution). Deposition and subsequent UV curing of each layer yielded a self-supporting three-dimensional organogel that retained its shape even under the weight of subsequent layers (FIGS. 21A and 21D). Parts were printed using a nozzle with a diameter of 250 μm that deposited lines averaging 500 μm wide. Variation in deposition speed, extruder pressure, and layer height allowed for control over the deposited line width. An amber color UV-irradiation blocking syringe was used to prevent accidental curing and extended the pot life of the ink. The use of a polyethylene piston in the syringe body and the release of air trapped between the piston and photoresin reduced the photoresins exposure to air, minimizing cross-linking inhibition due to oxygen. The rather high zero-shear rate viscosity of the photoresin (770 Pa·s), short curing times (about 1.7 s), and high gel state modulus (G'=5×105 Pa), coupled with the geometric freedom provided by AM allowed printing of several complex structures, including cellular and truss structures with as-printed dimensions as large as 33.4 mm×50.5 mm. Because DIW is not restricted to a printing stage submerged in a vat of material, larger structures are printable and would require significantly less material than VP.

Furthermore, fast gelation and mechanical integrity of the printed lines enabled AM of self-supporting features, with lines spanning gaps of 1.5 mm over the underlying layer. In particular, the print of simple cubic structures (SC-structures), evenly spaced parallel lines that were rotated by 90° every two layers, highlighted the self-supporting ability of the ink (FIG. 21D). FIG. 21F illustrates the final PMDA-ODA PI part, which demonstrate self-supporting bridges that retained their shape during imidization.

Figure 22A:
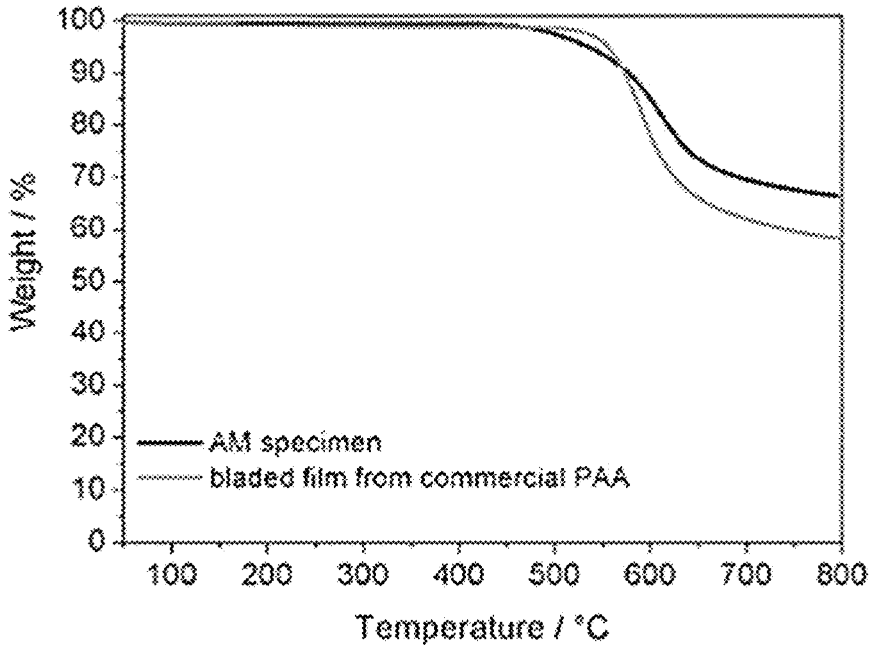
FIGS. 22A-22B show graphs (FIG. 22A) TGA traces of AM specimen and bladed film from commercial PAA after imidization.

Removal of the cured organogel from the print substrate and subsequent hanging from a thin wire allowed for uniform evaporation of the solvent. A detailed drying and heating procedure removed all solvent, triggered thermal degradation of the aliphatic cross-links (PDMAEMA) and induced imidization to afford the all-aromatic PI (Scheme (10)). Solvent removal, pyrolysis of the PDMAEMA cross-links, and imidization induced an isotropic dimensional shrinkage of about 45%, which translated to a weight loss of about 83% and confirmed a PI solid loading of about 17% (FIGS. 21B-21C, 21E, and 21F). The additively manufactured PMDA-ODA PI possessed a high thermal stability (Td,5%=534° C.), only slightly lower than a PI film prepared from commercial PAA (Td,5%=550° C.) (FIG. 22A) using a doctor blade. High thermal stability is indispensable to enable applications for aerospace or military use. As illustrated in FIGS. 21A-21F, all PMDA-ODA PI objects possessed a darker color than commercial Kapton film. Although a darker color is expected because of the increased thickness of a printed structure (several mm) versus commercial thin film (30-50 μm), TGA measurements elucidated an increase in char yield of about 10 wt % of the AM specimen compared to commercial PI film. A higher char yield might indicate residual carbon in the AM PMDA-ODA PI due to the pyrolysis of the sacrificial PDMAEMA cross-links and photoinitiator.

Figure 22B:
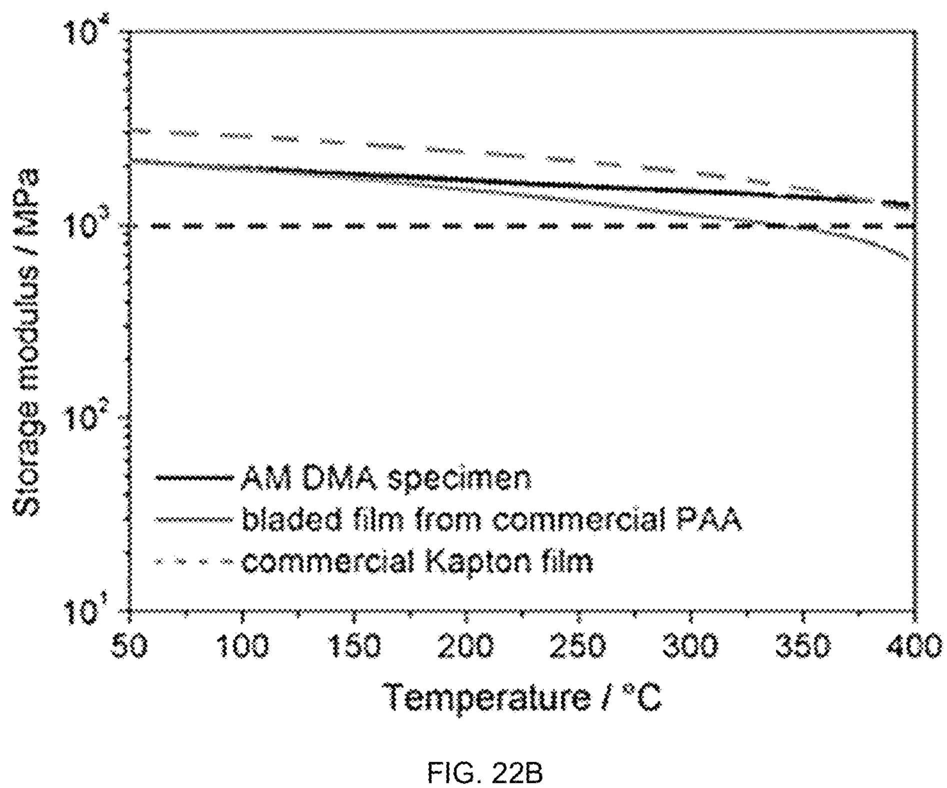

Dynamical mechanical analysis (DMA) of a printed AM specimen confirmed outstanding thermome-chanical properties up to 400° C., performing similarly to commercial Kapton film (FIG. 22B). A storage modulus above 1 GPa up to 400° C. is essential to provide mechanical integrity to an AM part and enables potential applications over a wide temperature window.

In brief summary, UV-direct ink write described in this Example resulted in fabrication of complex 3D geometries of all-aromatic PMDA-ODA PI. PAA DMAEMA salt solutions served as UV-sensitive ink and yielded the PMDA-ODA PI upon heating and imidization. In particular, non-isolated PAA solutions provided the flow behavior needed for DIW extrusion. Extrusion and subsequent UV-illumination allowed for printing arbitrary shapes, e.g., truss and cellular structures. The short gel times of the PAA DMAEMA ink and high gel state modulus of the organogel enabled printing of self-supporting SC-structures, with lines spanning gaps of 1.5 mm in the underlying layer. Drying and heating of the 3D parts removed solvent, promoted thermal degradation of the sacrificial cross-links, and induced imidization. Although the thermal treatment resulted in 45% isotropic dimensional shrinkage and might complicate the production of complex features, part fidelity was maintained. TGA and DMA measurements demonstrated high thermal stability and good mechanical strength of 3D printed parts up to +400° C. Increased char yields of the AM PI indicated residual carbon due to pyrolysis of the PDMAEMA cross-links and photoinitiator. A more detailed analysis of the char formation and potential residual carbon in the PI is under investigation. Overall, UV-DIW of PAA DMAEMA ink possesses can be used in multimaterial 3D printing of components that are resistant to solvents, extreme temperatures, and radiation.

Materials and Methods

Materials. 4,4'-Oxydianiline, pyromellitic dianhydride, 2-(dimethylamino)ethyl methacrylate (DMAEMA) and diphenyl(2,4,6-trimethylbenzoyl)phosphine oxide (TPO) were purchased from Sigma Aldrich. 4,4'-Oxydianiline was sublimed before use. Anhydrous N-methyl-2-pyrrolidone (NMP) over molecular sieve was received from Acros Organics.

Figure 31:
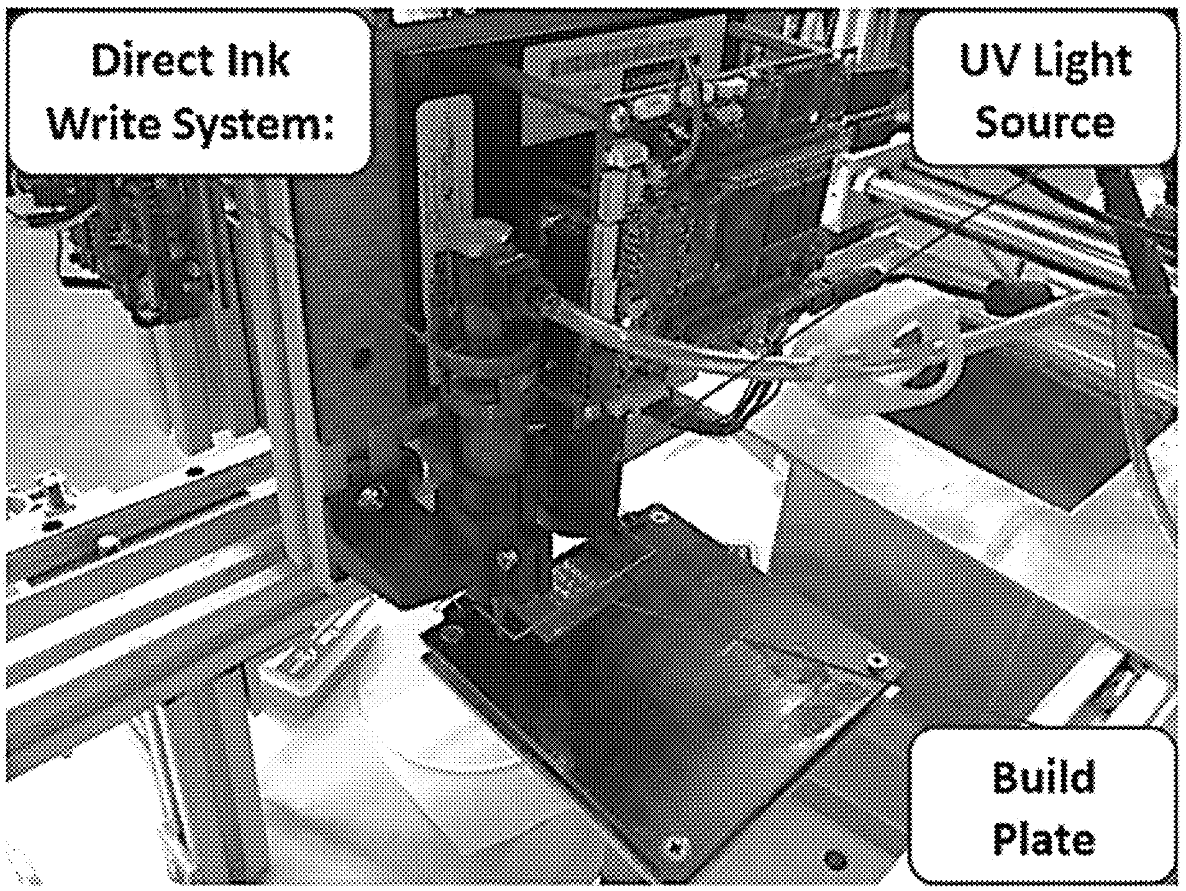
FIG. 31 shows a photograph of a Ultraviolet-Assisted Direct Ink Writing (UV-DIW) setup integrating a Nordson EFD Ultimus V DIW system and a Keynote Photonics LC4500-UV Digital Light Processing (DLP) projector.

Instrumentation. Thermal gravimetric analysis (TGA) measurements were conducted using a TA instruments Q500 under nitrogen flow with heating rates of 10° C./min and sample sizes of about 15 mg. Solution viscosities of polyamic acid (PAA) and PAA DMAEMA salts in NMP were determined using a TA Instruments DHR-2 rheometer. Flow sweeps were performed at room temperature, using 40 mm disposable parallel plates (aluminum) at shear rates between 0.1 and 100 $s^{-1}$ with a gap set to 1000 μm. Photorheology was conducted on the same rheometer equipped with an Omnicure S2000 photo-accessory (high-pressure mercury light source with 320-500 nm filter), Smart Swap™ UV geometry, a 20 mm aluminum upper parallel plate and a 20 mm quartz lower parallel plate. The samples were subjected to 0.3% oscillatory strain and a frequency of 1 Hz. The gap distance was set to 500 μm. The samples were equilibrated for 60 s before each measurement, with the axial force set to 0 N. UV irradiation started after 30 s and samples were exposed to UV-light (250 $mW/cm^2$) for a total of 150 s. All measurements were conducted under air and at room temperature. The gel point and crossover modulus were determined from the intersection of the loss and storage modulus. The G' plateau modulus was calculated by averaging the G' values over the last 60 s (values from 120 s-180 s). Dynamic mechanical analysis (DMA) was conducted on a TA Instruments Q800 in an oscillatory tension mode with a heating rate of 3° C./min and a frequency of 1 Hz. Measurements were taken from 25° C. to 400° C. The UV-DIW printer consisted of a Nordson EFD Ultimus V DIW System and a Keynote Photonics LC4500-UV Digital Light Processing (DLP) projector provided UV-irradiation at 405 nm with a measured intensity of 14 $mW/cm^2$ on the build plate (FIG. 31). The UV light source and the DIW system were mounted onto Zaber A-LST500 linear slides that provided linear motion in the XY-direction. A Zaber A-LST250 linear slide provided translation in the Z-direction. The printer was controlled via a custom-built LabVIEW software program that sent G-Code commands to the printer that synchronized the stop and start of extrusion with the XYZ movement. Previous UV-DIW systems have positioned the UV light to illuminate the exit of the nozzle, initiating resin curing immediately upon exit.[19,23] However, to eliminate the highly photosensitive material from clogging the nozzle, the UV light source was positioned next to the nozzle. The printer was instructed to execute a specialized toolpath to ensure the deposited line was exposed to a sufficient UV energy needed to gel the resin. The photo resin possessed a sufficient viscosity and surface tension to maintain its shape during the time between deposition and subsequent curing.

Terminology. The used terminology in this Example is in accordance to previous work.[7] PAA refers to the polyamic acid consisting of PMDA-ODA repeat units. PAA DMAEMA salt refers to the PMDA-ODA polyamic acid with added DMAEMA. The equivalents of DMAEMA are calculated in respect to the carboxyl groups of the PAA repeating unit, e.g. 0.5 equiv. DMAEMA refer to one DMAEMA per repeating unit. PAA 0.5 equiv. DMAEMA salt in NMP represented the utilized UV-sensitive ink. The used terminology in at least this Example regarding Additive Manufacturing is in accordance with ISO/ASTM 52900: 2015.[24]

Synthesis of PMDA-ODA PAA. The following describes an example to prepare a PAA with targeted molecular weight (Mn) of 50 k g·mol-1. A 500 mL three-neck round bottom flask was equipped with a mechanical stirrer, a septum and a nitrogen inlet. Under nitrogen atmosphere, 250 mL anhydrous NMP and 40.048 g 4,4'-oxydianiline (ODA) (0.200 mol) were added to the flask. After the ODA was dissolved completely, 43.9905 g PMDA (0.20168 mol) were added to the flask via addition funnel and the funnel was rinsed with 70 mL anhydrous NMP to ensure addition of all PMDA. After stirring for 6 h, an additional 30 mL NMP (anhydrous) were added to the solution. The mixture was stirred over night at 23° C. under nitrogen atmosphere. Afterwards, the solution was transferred to a glass jar with cap, flushed with nitrogen and stored in the dark at −20° C. Note that the solution viscosity of the resulting PAA differed slightly from batch to batch.

Ink formulation (PAA 0.5 equiv. DMAEMA salt solution). As an example, 150 g of the solution (PAA dissolved in NMP, 18.9 wt %. PAA solids) was transferred to a 250 mL three-neck round bottom flask, equipped with a mechanical stirrer, a septum and a nitrogen inlet. 0.5 equiv. DMAEMA (11.43 mL) and 2.5 wt. % TPO (975 mg dissolved in 0.9 mL NMP) were added to the solution and the solution was stirred for 12 h under nitrogen atmosphere to yield a homogeneous PAA DMAEMA salt solution (UV-sensitive ink). The solution viscosities of the PAA DMAEMA salts showed slight differences due to batch variation of the synthesized PAA.

UV-DIW printing process. The various 3D geometries were deposited on glass substrates with a deposition speed of 8 mm·s-1, a 0.3 mm layer height, 0.25 mm nozzle diameter, and 620.5 kPa extruder pressure on a glass substrate. Deposited material was exposed to the UV light source for a minimum of 5 s. To print self-supporting simple cubic structures (SC-structures), parallel roads were deposited 1.5 mm apart, alternating their direction by 90° every two layers. The extruder pressure was lowered to 227.5 kPa, layer height to 0.2 mm, and the deposition speed to 2 mm·s-1 to increase the success of depositing a self-supporting bridge.

Post-printing process (solvent release and imidization). The crosslinked organogels were removed from the glass substrate and hung on a thin copper wire to enable uniform drying under air. After 1-2 days, the 3D objects were placed in a vacuum oven and heated to 60° C., held for one hour and subsequently heated to 200° C. with a heating rate of 2° C./min and held for 30 min at 200° C. After cooling to room temperature (cooling rate of 2° C./min), the objects were transferred to a furnace and heated to 400° C. under nitrogen atmosphere (heating rate of 2° C./min), held for 30 min at 400° C. and then cooled back to room temperature with a cooling rate of 2° C./min. TGA measurements confirmed successful removal of the solvent and thermal decomposition of the sacrificial crosslinks.

References for Example 17

(1) Huang, Y.; Leu, M. C.; Mazumder, J.; Donmez, A. Additive Manufacturing: Current State, Future Potential, Gaps and Needs, and Recommendations. J. Eng. Ind. 2015, 137, 014001.
(2) Gao, W.; Zhang, Y.; Ramanujan, D.; Ramani, K.; Chen, Y.; Williams, C. B.; Wang, C. C.; Shin, Y. C.; Zhang, S.; Zavattieri, P. D. The Status, Challenges, and Future of Additive Manufacturing in Engineering. Comput.-Aided Des. 2015, 69,65-89.
(3) Deng, D.; Chen, Y.; Zhou, C. Investigation on PEEK fabrication using Mask-image-projection-based Stereolithography, Solid Freeform Fabr. Symp. Proc., 2012, 606-616.
(4) Kishore, V.; Chen, X.; Ajinjeru, C.; Hassen, A. A.; Lindahl, J.; Faila, J.; Kunc, V.; Duty, C. Additive Manufacturing of High Performance Semi-crystalline Thermoplastics and Their Composites. Solid Freeform Fabr. Symp. Proc. 2016, 906-915.
(5) Bagsik, A.; Schöppner, V.; Klemp, E. FDM Part Quality Manufactured With Ultem* 9085. Int. Sci. Conf. Polym. Mater. 2010, 307-315.
(6) Hegde, M.; Meenakshisundaram, V.; Chartrain, N.; Sekhar, S.; Tafti, D.; Williams, C. B.; Long, T. E. 3D Printing All-Aromatic Polyimides using Mask-Projection Stereolithography: Processing the Nonprocessable. Adv. Mater. 2017, 29, 1701240.
(7) Herzberger, J.; Meenakshisundaram, V.; Williams, C. B.; Long, T. E. 3D Printing All-Aromatic Polyimides Using Stereolithographic 3D Printing of Polyamic Acid Salts. ACS Macro Lett. 2018, 7, 493-497.
(8) Zhang, F.; Tuck, C.; Hague, R.; He, Y.; Saleh, E.; Li, Y.; Sturgess, C.; Wildman, R. Inkjet Printing of Polyimide Insulators for the 3D Printing of Dielectric Materials for Microelectronic Applications. J. Appl. Polym. Sci. 2016, 133, 43361.
(9) www.dupont.com, DEC-Kapton-summary-of-properties.pdf
(10) Wilson, D.; Stenzenberger, H. D.; Hergenrother, P. M. Polyimides; Springer: 1990.
(11) Bershtein, V.; Sukhanova, T.; Krizan, T.; Keating, M.; Grigoriev, A.; Egorov, V.; Yakushev, P.; Peschanskaya, N.; Vylegzhanina, M.; Bursian, A. Relationship of Processing Conditions to Structure and Properties in PMDA-ODA Polyimide. J. Macromol. Sci., Part B: Phys. 2005, 44, 613-639.
(12) Gibson, I.; Rosen, D. W.; Stucker, B. Additive Manufacturing Technologies; Springer: 2010; Vol. 238.
(13) Fukukawa, K.-i.; Ueda, M. Recent progress of photosensitive polyimides. Polym. J. 2008, 40, 281.
(14) Vaezi, M.; Seitz, H.; Yang, S. A Review on 3D Micro-additive Manufacturing Technologies. Int. J. Adv. Manuf. Technol. 2013, 67,1721-1754.

(15) Bártolo, P. J. Stereolithography: Materials, Processes and Applications; Springer Science & Business Media: 2011.

(16) Compton, B. G.; Lewis, J. A. 3D-printing of Lightweight Cellular Composites. Adv. Mater. 2014, 26, 5930-5935.

(17) Guo, S. Z.; Gosselin, F.; Guerin, N.; Lanouette, A. M.; Heuzey, M. C.; Therriault, D. Solvent-cast three-dimensional printing of multifunctional microsystems. Small 2013, 9, 4118-4122.

(18) Gratson, G. M.; Lewis, J. A. Phase Behavior and Rheological Properties of Polyelectrolyte Inks for Direct-write Assembly. Langmuir 2005, 21, 457-464.

(19) Lebel, L. L.; Aissa, B.; Khakani, M. A. E.; Therriault, D. Ultraviolet-Assisted Direct-Write Fabrication of Carbon Nanotube/Polymer Nanocomposite Microcoils. Adv. Mater. 2010, 22, 592-596.

(20) Schaffner, M.; Faber, J. A.; Pianegonda, L.; Rühs, P. A.; Coulter, F.; Studart, A. R. 3D Printing of Robotic Soft Actuators with Programmable Bioinspired Architectures. Nat. Commun. 2018, 9, 878.

(21) Sun, K.; Wei, T. S.; Ahn, B. Y.; Seo, J. Y.; Dillon, S. J.; Lewis, J. A. A. 3D Printing of Interdigitated Li-Ion Microbattery Architectures. Adv. Mater. 2013, 25, 4539-4543.

(22) Virk, H.; Chandi, P.; Srivastava, A. Physical and Chemical Response of 70 MeV Carbon Ion Irradiated Kapton-H Polymer. Bull. Mater. Sci. 2001, 24, 529-534.

(23) Barry, R. A.; Shepherd, R. F.; Hanson, J. N.; Nuzzo, R. G.; Wiltzius, P.; Lewis, J. A., Direct-Write Assembly of 3D Hydrogel Scaffolds for Guided Cell Growth. Adv. Mater. 2009, 21, 2407-2410.

(24) Standard, A., ISO/ASTM 52900: 2015 Additive Manufacturing—General principles—Terminology. ASTM F2792-10e1 2012.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

The disclosure will be better understood upon reading the following aspects which should not be confused with the claims.

Aspect 1. A polymer resin for ultraviolet-assisted direct ink write photopolymerization, the polymer resin comprising: (i) a polyamic acid salt comprising repeat units having a structure according to the following formula

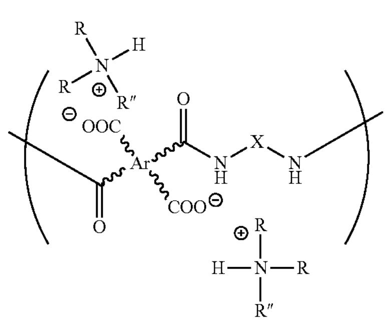

where each occurrence of R″ comprises a photocrosslinkable group; where each occurrence of R is independently selected from the group consisting of H, substituted and unsubstituted alkyl, substituted and unsubstituted heteroalkyl, and substituted and unsubstituted alkenyl; where each occurrence of Ar is independently selected from the group

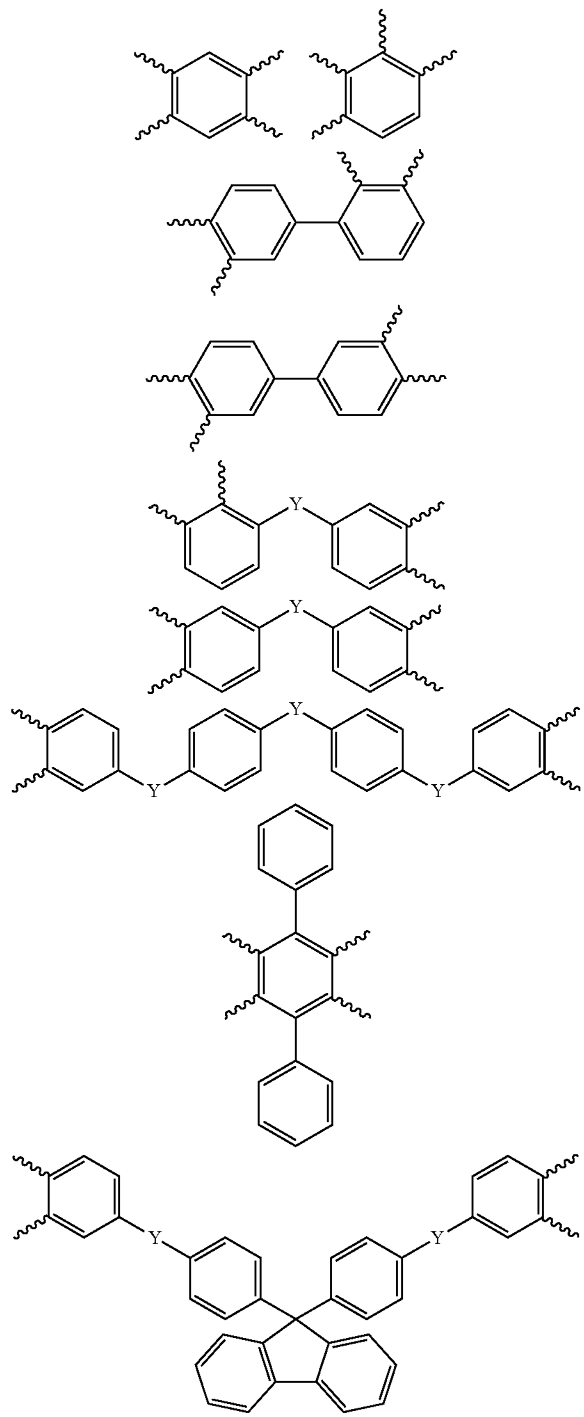

where each occurrence of X is a substituted or unsubstituted aryl or heteroaryl group; where each occurrence of Y is independently selected from the group consisting of O, S, C═O, $C(CF_3)_2$, $C(CH_3)_2$, $SO_2$, and C≡C;

(ii) a photoinitiator suitable for initiating crosslinking of the photocrosslinkable groups when exposed to a light source of a suitable wavelength and intensity; and (iii) a suitable solvent.

Aspect 2. The polymer resin according to any one of aspects 1-27, wherein each occurrence of X is selected from the group

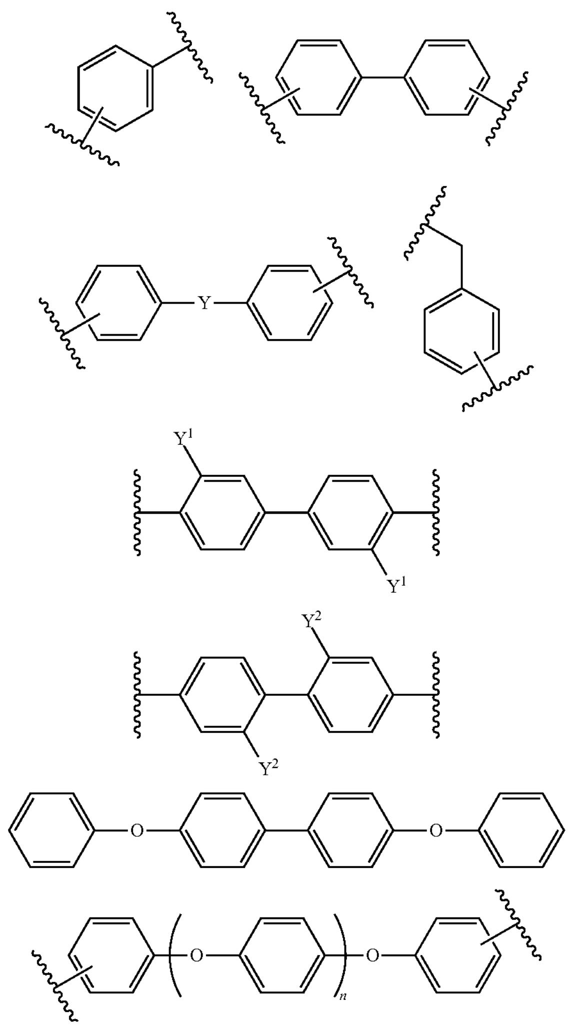

Aspect 3. The polymer resin according to any one of aspects 1-27, wherein each occurrence of R" is selected from the group

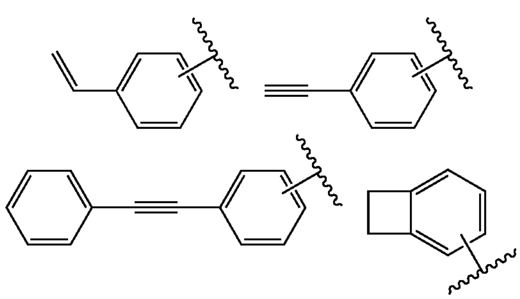

-continued

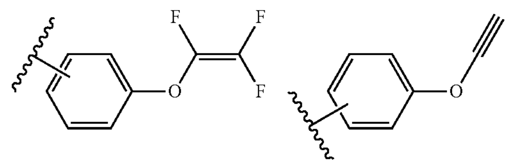

Aspect 4. A polymer resin for ultraviolet-assisted direct ink write photopolymerization, the polymer resin comprising: (i) a polyamic acid salt formed from the addition of a photocrosslinkable amine to a polyamic acid (ii) a photoinitiator suitable for initiating crosslinking of the photocrosslinkable amine when exposed to a light source of a suitable wavelength and intensity; and (iii) a suitable solvent.

Aspect 5. The polymer resin according to any one of aspects 1-27, wherein the photocrosslinkable amine is selected from the group of

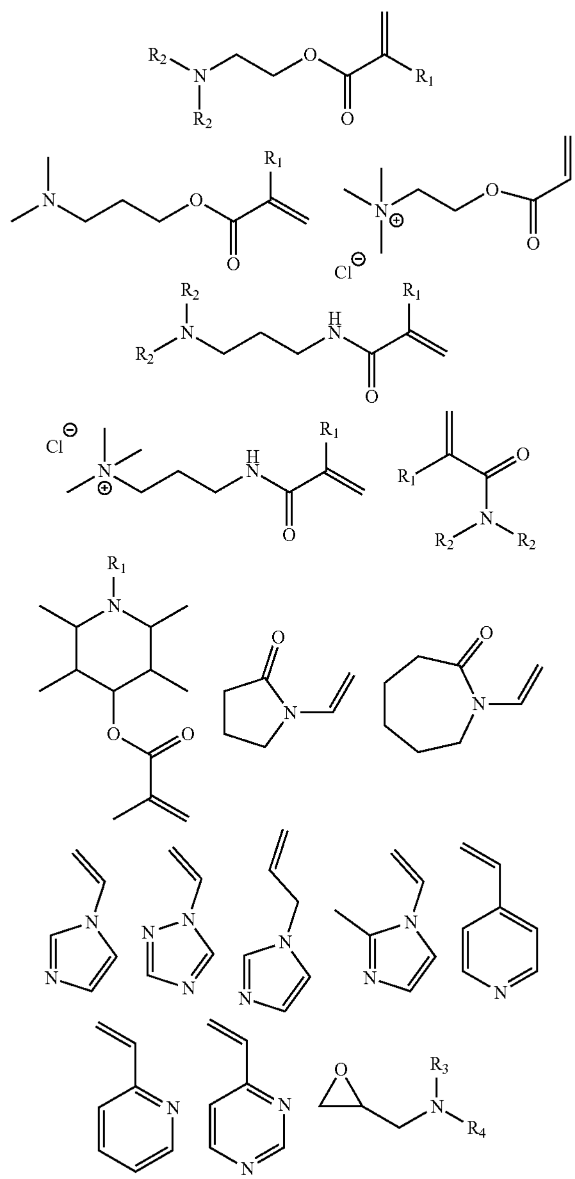

-continued

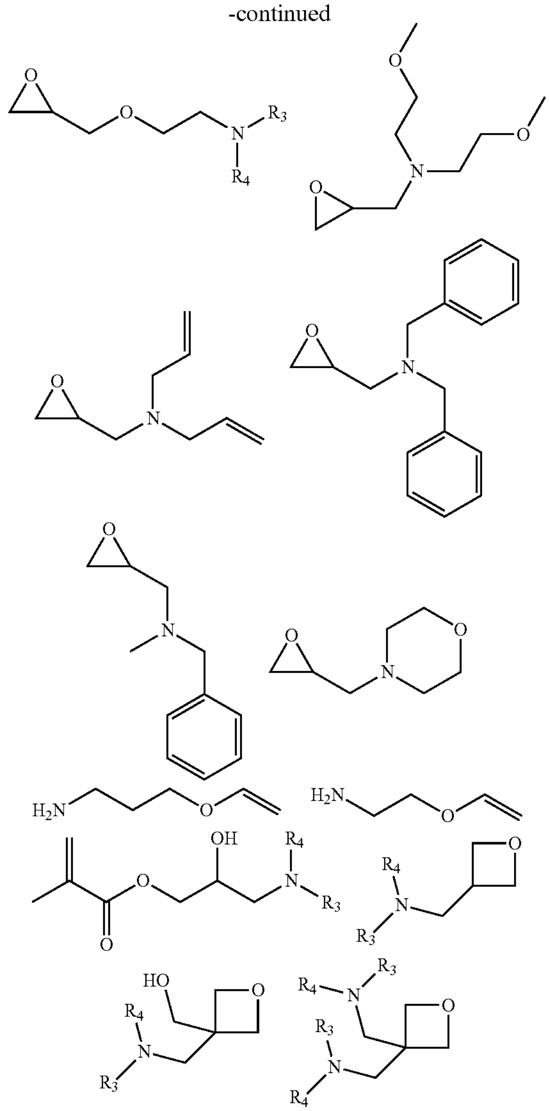

-continued

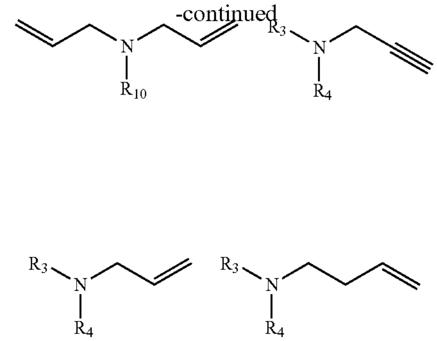

where each occurrence of $R_1$ is independently —H or —$CH_3$; where each occurrence of $R_2$ is independently —H, —$CH_3$, or —$CH_2CH_3$; and where each occurrence of $R_3$ and $R_4$ is independently —H, an aliphatic group, or an aromatic group.

Aspect 6. The polymer resin according to any one of aspects 1-27, wherein the polyamic acid is formed by the addition of a diamine to a dianhydride in a suitable precursor solvent and wherein the polyamic acid is not isolated from the suitable solvent prior to forming the polyamic acid salt.

Aspect 7. The polymer resin according to any one of aspects 1-27, wherein the suitable precursor solvent is selected from the group consisting of: N-methyl-2-pyrrolidone (NMP), dimethylacetamide (DMAC), dimethylformamide (DMF), y-butyrolactone, mixtures with hydrocarbon solvents/aromatic hydrocarbon solvents, water, ammonia, and mixtures thereof.

Aspect 8. The polymer resin according to any one of aspects 1-27, wherein the suitable precursor solvent is N-methyl-2-pyrrolidone (NMP).

Aspect 9. The polymer resin according to any one of aspects 1-27, wherein the polyamic acid has a viscosity ranging from about 100 Pa·s to 400 Pa·s.

Aspect 10. The polymer resin according to any one of aspects 1-27, wherein the diamine is selected from the group of

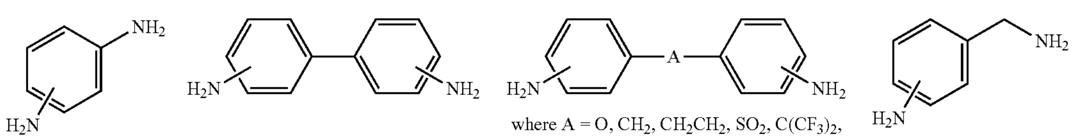

where A = O, $CH_2$, $CH_2CH_2$, $SO_2$, $C(CF_3)_2$, $C(CH_3)_2$, S, S—S, CH═CH, C═O, NH

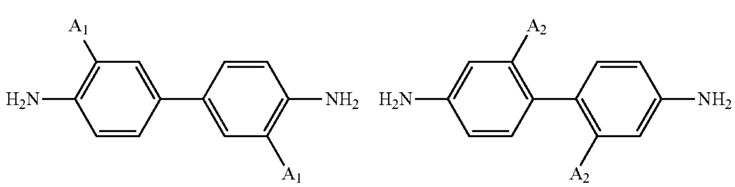

where $A_1$ = Cl, CH, $OCH_3$, $CH_3$, $CH_2CH_3$ or aliphatic or aromatic $A_2$ = $CH_3$, $CF_3$, $SO_3H$, $SO_3Na$, tert-butyl or aliphatic or aromatic

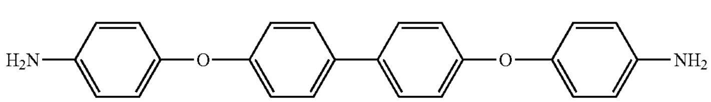

-continued
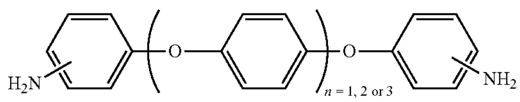
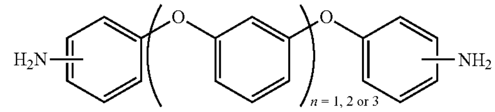
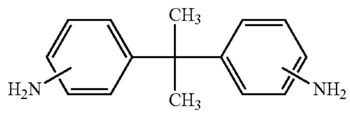
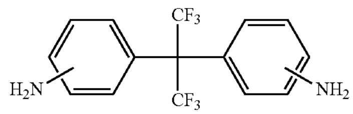
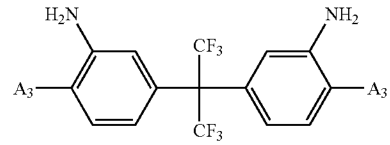
where $A_3 = CH_3$, $OCH_3$, or OH
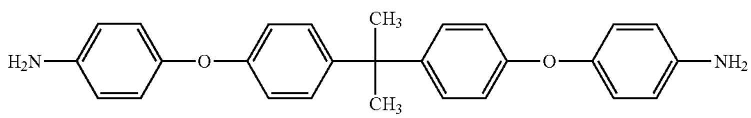
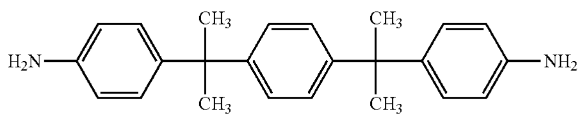
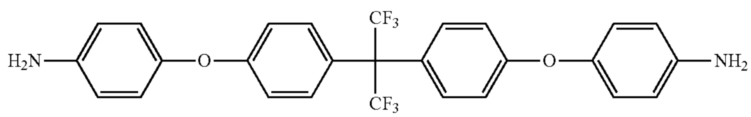
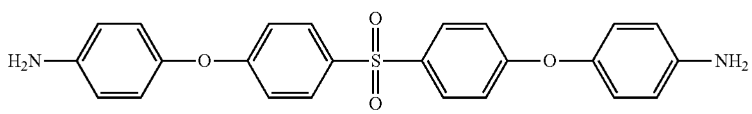
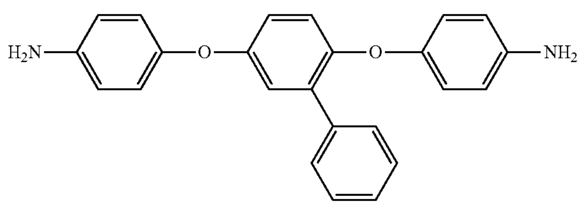
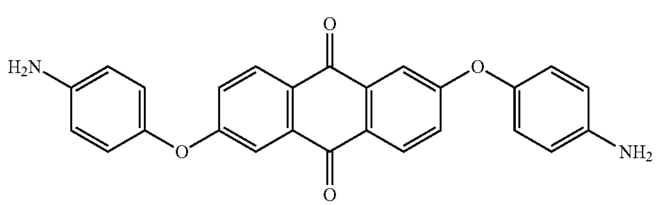
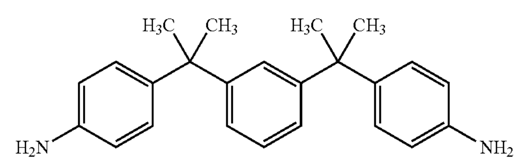
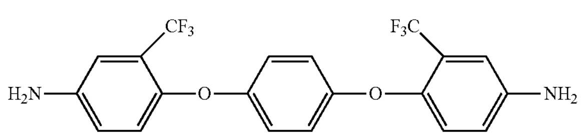
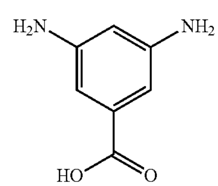
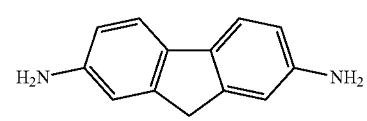
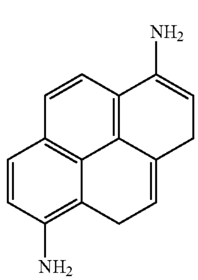
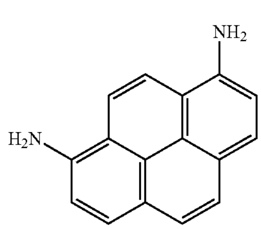
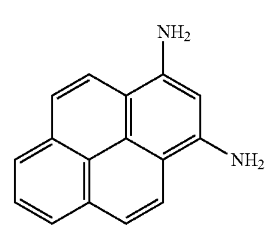
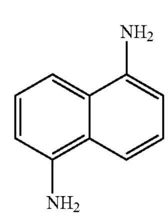

-continued
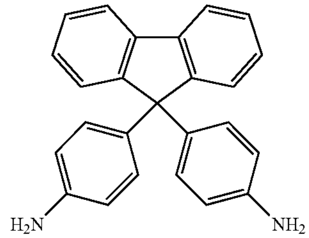
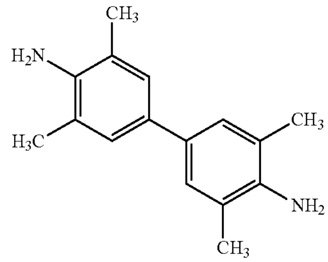
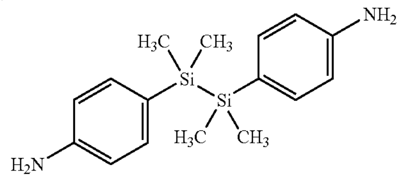
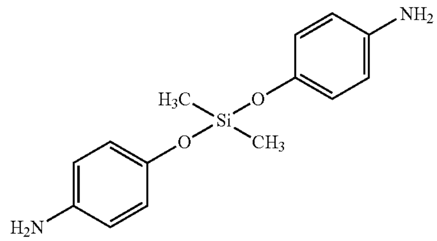
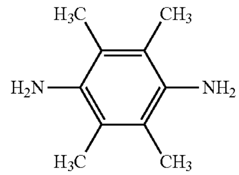
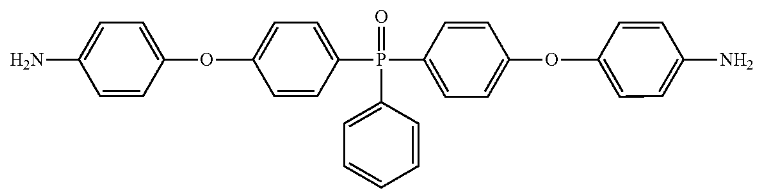
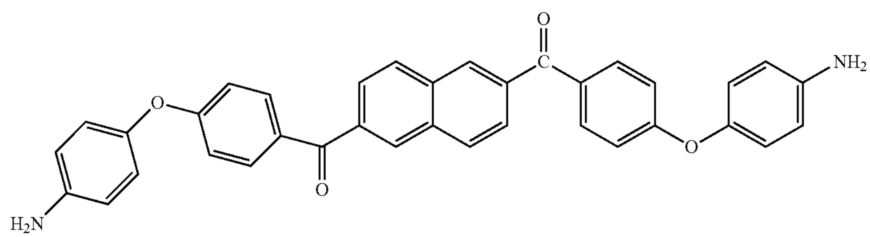
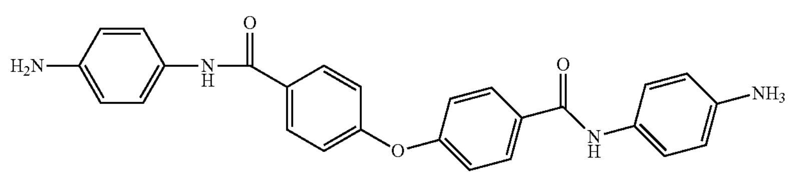
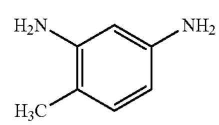
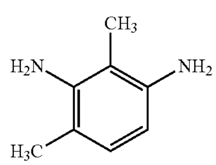
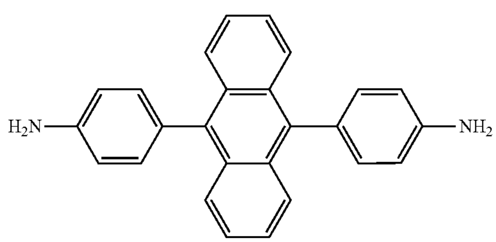
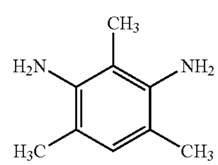
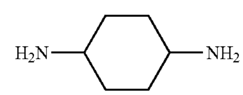
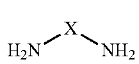
where X is either aliphatic or aromatic
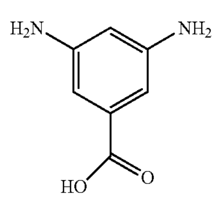

Aspect 11. The polymer resin according to any one of aspects 1-27, wherein the dianhydride is selected from the group
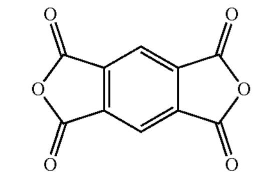
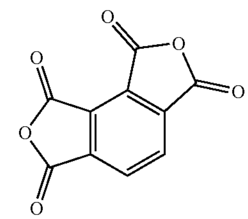
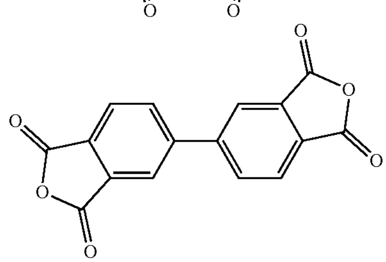
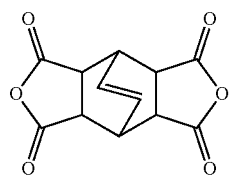
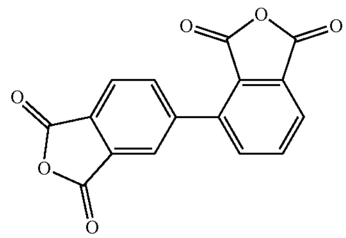
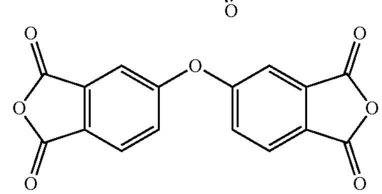
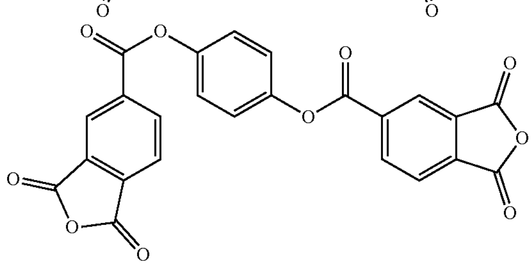
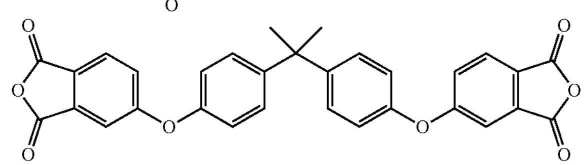
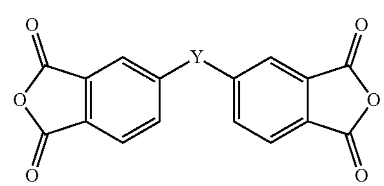
where Y is $C{=}O$, $C(CF_3)_2$, $C(CH_3)_2$, $SO_2$ or $C{\equiv}C$
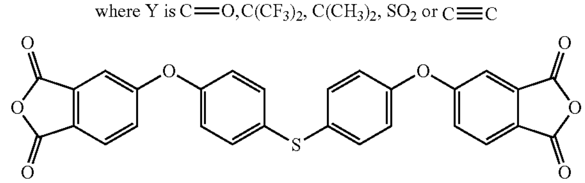
-continued
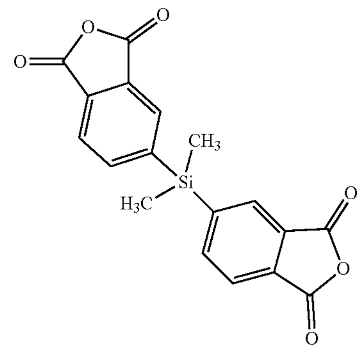
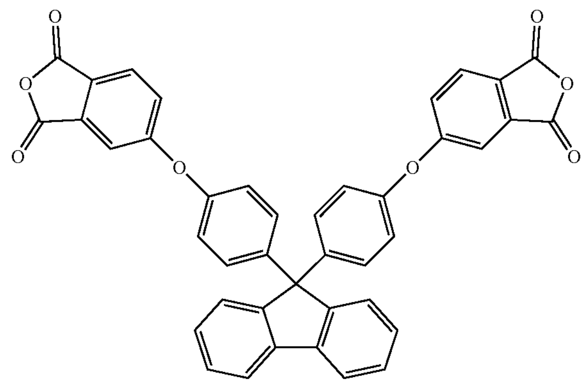
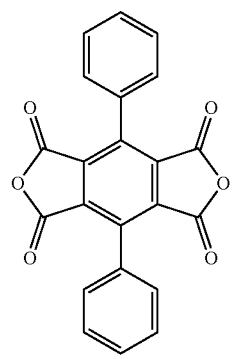
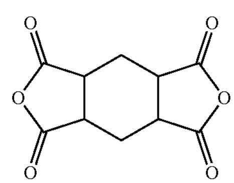
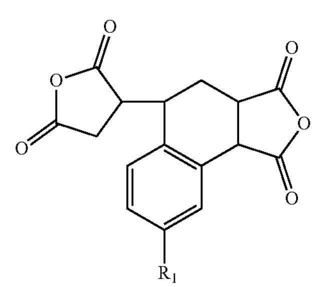
where $R_1$ is either F, $CH_2Cl$, $CH_2Br$, $CH_2F$, H, or $CH_3$
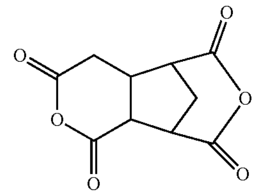
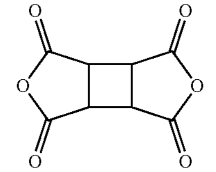

-continued

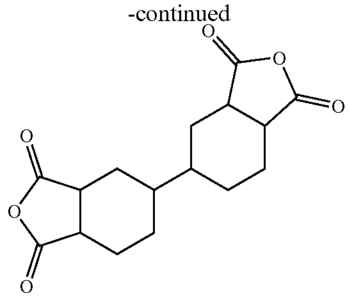

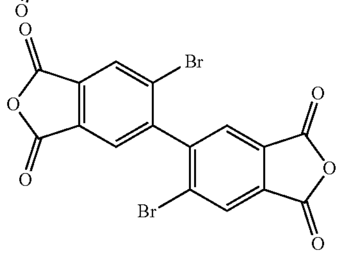

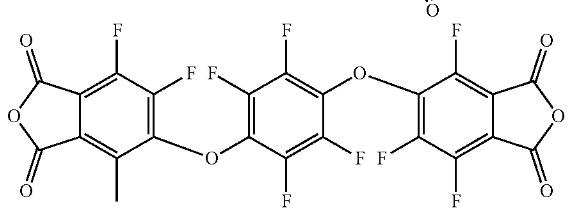

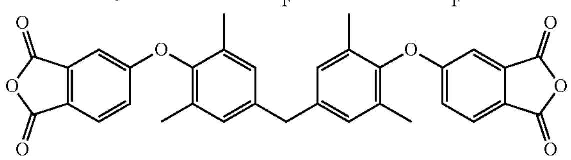

Aspect 12. The polymer resin according to any one of aspects 1-27, wherein the polymer has an average molecular weight of about 40000 g/mol to about 60000 g/mol.

Aspect 13. The polymer resin according to any one of aspects 1-27, wherein the polymer has a polydispersity of about 2 or less.

Aspect 14. The polymer resin according to any one of aspects 1-27, wherein the photocrosslinkable groups have a thermal decomposition temperature of about 350° C. or less.

Aspect 15. The polymer resin according to any one of aspects 1-27, wherein the photocrosslinkable groups comprise an acrylate, a methacrylate, or a combination thereof.

Aspect 16. The polymer resin according to any one of aspects 1-27, wherein the suitable solvent is selected from the group consisting of N-methyl-2-pyrrolidone (NMP), dimethylacetamide (DMAC), dimethylformamide (DMF), y-butyrolactone, mixtures with hydrocarbon solvents/aromatic hydrocarbon solvents, water, ammonia, and mixtures thereof.

Aspect 17. The polymer resin according to any one of aspects 1-27, wherein the suitable solvent is N-methyl-2-pyrrolidone (NMP).

Aspect 18. The polymer resin according to any one of aspects 1-27, wherein the suitable wavelength is about 300 nm to 500 nm.

Aspect 19. The polymer resin according to any one of aspects 1-27, wherein the photoinitiator is a phosphine oxide.

Aspect 20. The polymer resin according to any one of aspects 1-27, wherein the photoinitiator is phenylbis(2,4,6-trimethylbenzoyl)phosphine.

Aspect 21. The polymer resin according to any one of aspects 1-27, wherein the photoinitiator is present in an amount from about 1.5 wt % to about 5 wt % based upon a total weight of the polymer resin.

Aspect 22. A polymer resin according to any one of aspects 1-27, further comprising a UV blocker.

Aspect 23. The polymer resin according to any one of aspects 1-27, wherein the UV blocker is selected from the group consisting of: a benzophenone, a benzotriazole, a diazine, a triazine, a benzoate, an oxalanilide, a azobenzone, a metal oxides, and any combination thereof.

Aspect 24. The polymer resin according to any one of aspects 1-27, wherein the UV blocker is present in an amount from 0% to 3% by weight based upon the total weight of the polymer resin.

Aspect 25. The polymer resin according to any one of aspects 1-27, wherein the viscosity of the polymer resin is greater than 400 Pa·s.

Aspect 26. The polymer resin according to any one of aspects 1-27, wherein the viscosity of the polymer resin is between 400 and 1,000 Pa·s.

Aspect 27. The polymer resin according to any one of aspects 1-26, wherein the viscosity of the polymer resin is between 700 and 1,000 Pa·s.

Aspect 28. A method of making an article, the method comprising: (a) applying an effective amount of a light to a polymer resin according to any one of aspects 1-27; (b) repeating step (a) a number of times to form the precursor article in a layer-by-layer fashion; and (c) heating the precursor article to a first elevated temperature for a period of time to form the article comprising polyimide repeat units having a structure according to the following formula

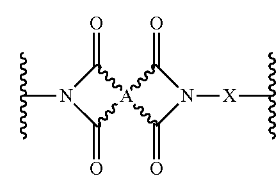

wherein each occurrence of X is a substituted or unsubstituted aromatic group, and wherein each occurrence of A is a substituted or unsubstituted aromatic group.

Aspect 29. The method according to aspect 28 or aspect 30, the method further comprising drying the precursor article to remove the solvent prior to forming the polyimide repeat units.

Aspect 30. The method according to aspect 28 or aspect 29, wherein the drying is performed by drying the precursor article in a vacuum oven for about 1 h. at one or more temperatures between 25° C. and 150° C.

Aspect 31. The method according to any one of aspect 28-30, wherein the article comprises a non-layered structure.

We claim:

1. A polymer resin for ultraviolet-assisted direct ink write photopolymerization, the polymer resin comprising:

(i) a polyamic acid salt comprising repeat units having a structure according to the following formula:

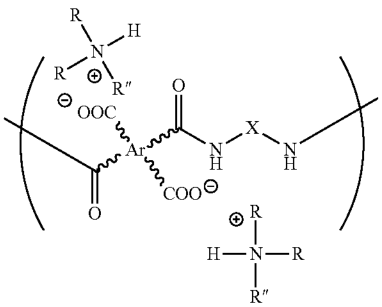

wherein each occurrence of R" comprises a photocrosslinkable group selected from the group having a structure according to the following formulas:

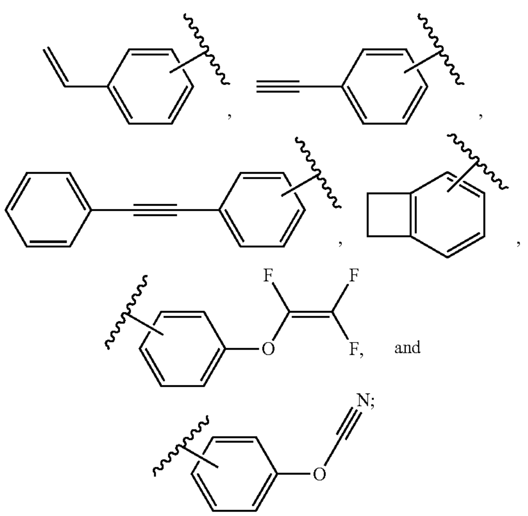

wherein each occurrence of R is independently selected from the group consisting of H, substituted and unsubstituted alkyl, substituted and unsubstituted heteroalkyl, and substituted and unsubstituted alkenyl;

wherein each occurrence of Ar is independently selected from the group

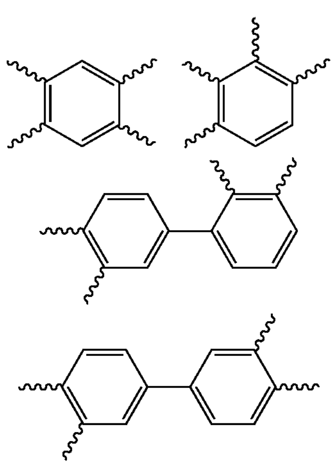

-continued

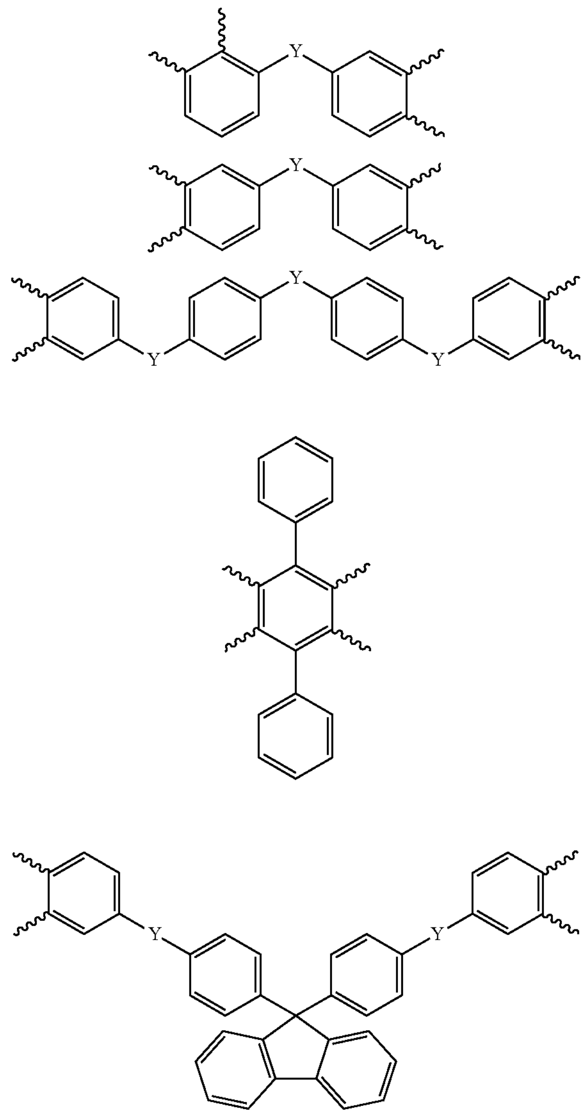

wherein each occurrence of X is a substituted or unsubstituted aryl or heteroaryl group; and wherein each occurrence of Y is independently selected from the group consisting of O, S, C═O, $C(CF_3)_2$, $C(CH_3)_2$, $SO_2$, and C≡C;

(ii) a photoinitiator suitable for initiating crosslinking of the photocrosslinkable groups when exposed to a light source of a suitable wavelength and intensity; and (iii) a suitable solvent.

2. The polymer resin according to claim 1, wherein each occurrence of X is selected from the group:

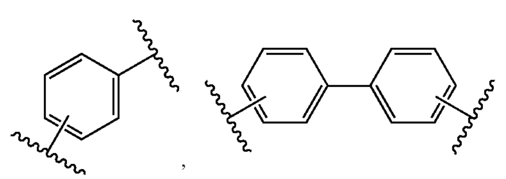

-continued

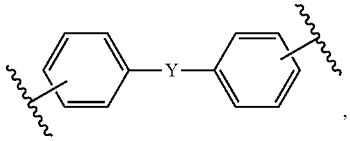

,

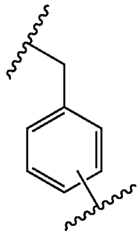

,

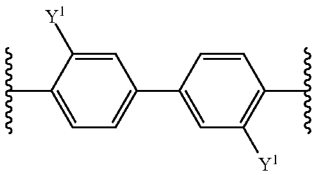

,

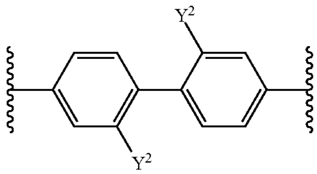

,

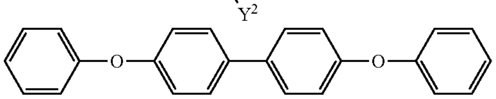

, and

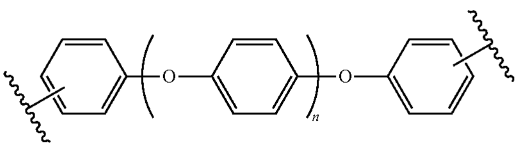

.

3. A polymer resin for ultraviolet-assisted direct ink write photopolymerization, the polymer resin comprising:

(i) a polyamic acid salt formed from the addition of a photocrosslinkable amine to a polyamic acid (ii) a photoinitiator suitable for initiating crosslinking of the photocrosslinkable amine when exposed to a light source of a suitable wavelength and intensity; and (iii) a suitable solvent;

wherein the polyamic acid is formed by the addition of a diamine to a dianhydride in a suitable precursor solvent and wherein the polyamic acid is not isolated from the suitable solvent prior to forming the polyamic acid salt.

4. The polymer resin according to claim 3, wherein the photocrosslinkable amine is selected from the group consisting of:

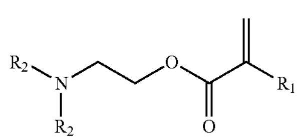

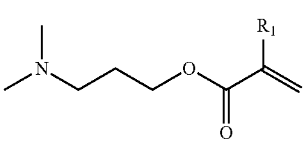

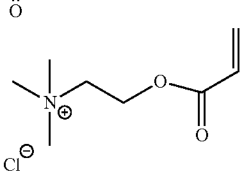

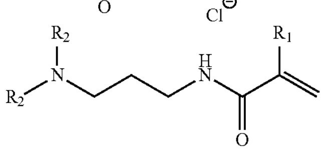

-continued

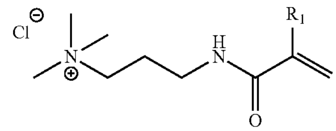

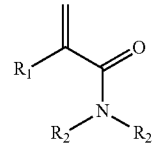

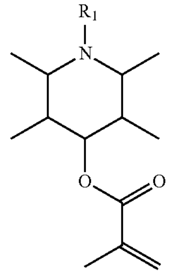

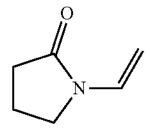

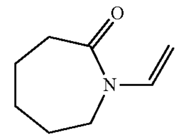

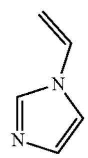

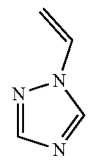

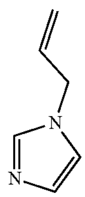

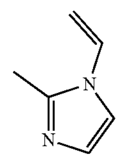

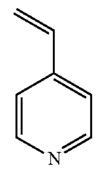

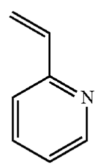

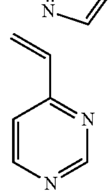

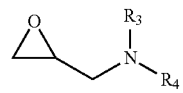

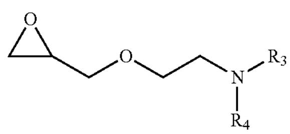

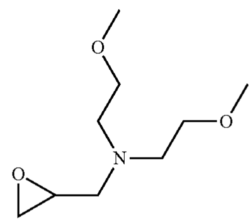

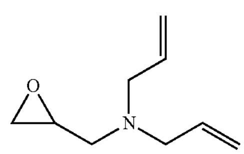

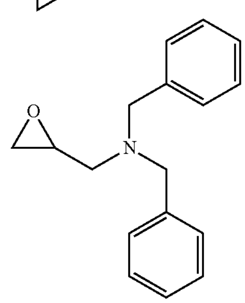

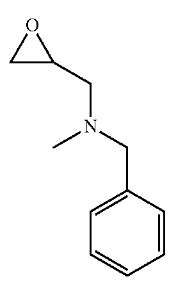

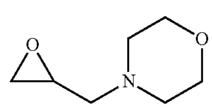

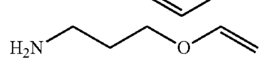

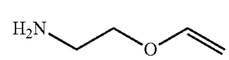

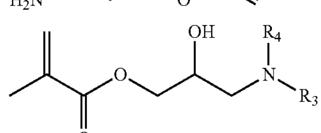

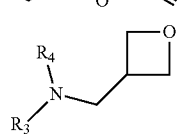

-continued

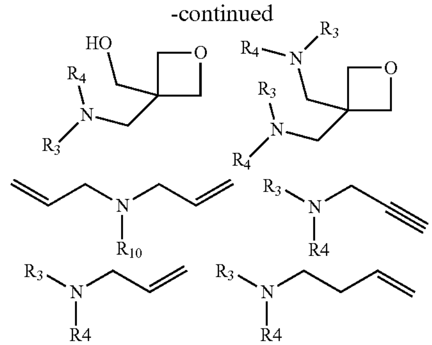

wherein each occurrence of $R_1$ is independently —H or —$CH_3$;

wherein each occurrence of $R_2$ is independently —H, —$CH_3$, or —$CH_2CH_3$; and wherein each occurrence of $R_3$ and $R_4$ is independently —H, an aliphatic group, or an aromatic group.

5. The polymer resin of claim 3, wherein the suitable precursor solvent is selected from the group consisting of: N-methyl-2-pyrrolidone (NMP), dimethylacetamide (DMAC), dimethylformamide (DMF), y-butyrolactone, mixtures with hydrocarbon solvents/aromatic hydrocarbon solvents, water, ammonia, and mixtures thereof.

6. The polymer resin of claim 5, wherein the suitable precursor solvent is N-methyl-2-pyrrolidone (NMP).

7. The polymer resin according to claim 3, wherein the polyamic acid has a viscosity ranging from about 100 Pa·s to 400 Pa·s.

8. The polymer resin according to claim 3, wherein the diamine is selected from the group:

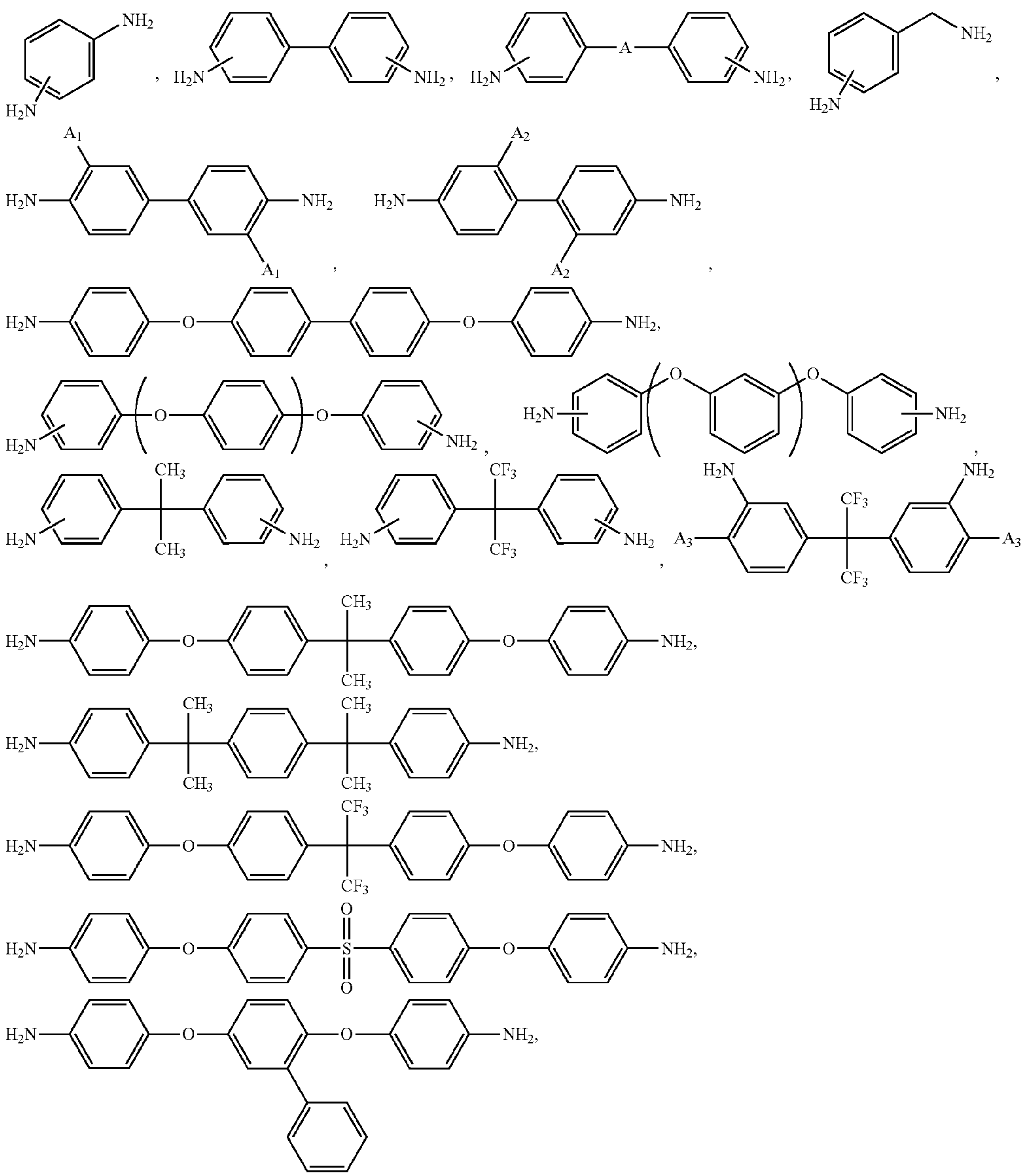

-continued
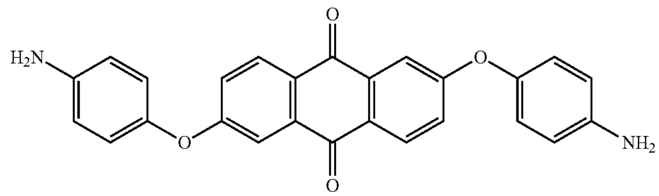, 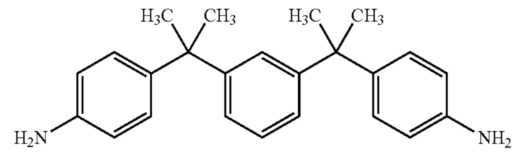,
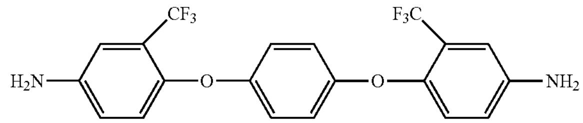, 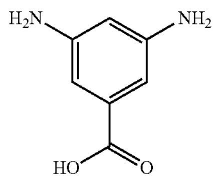, 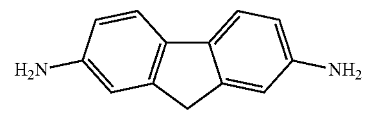,
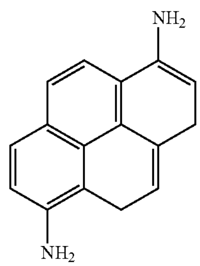, 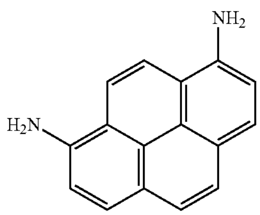, 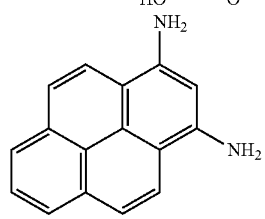, 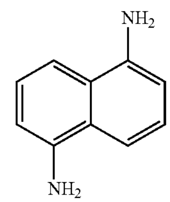,
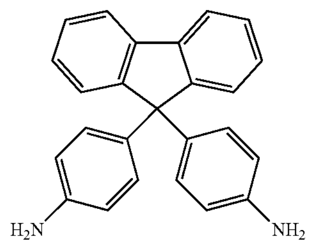, 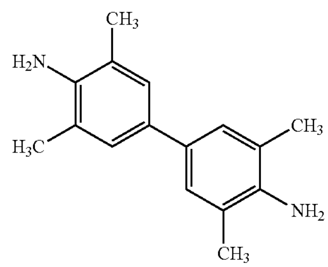, 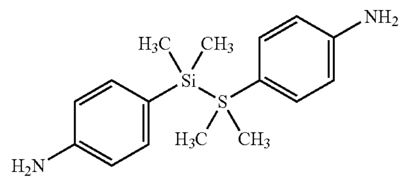,
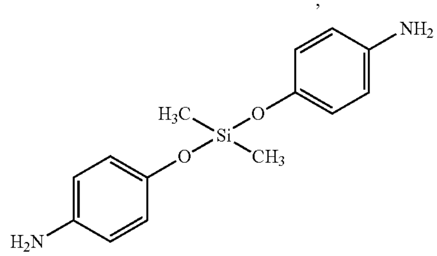, 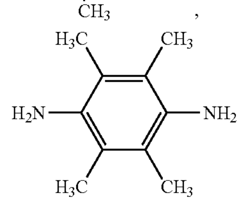,
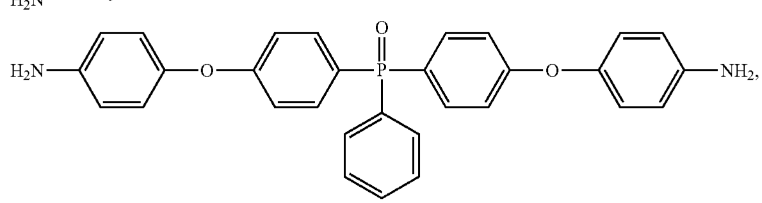
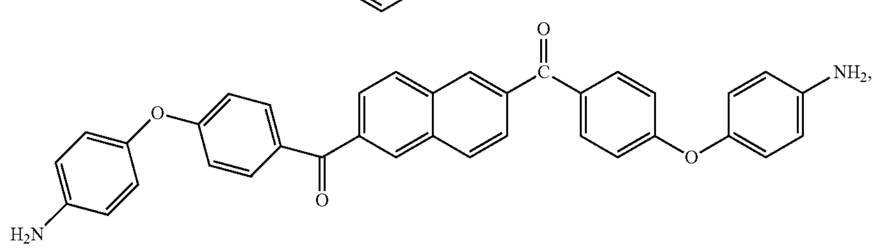
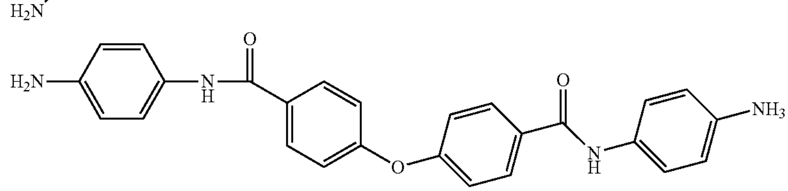, 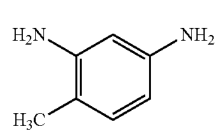, -continued

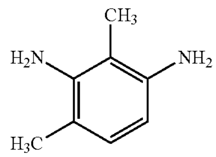,
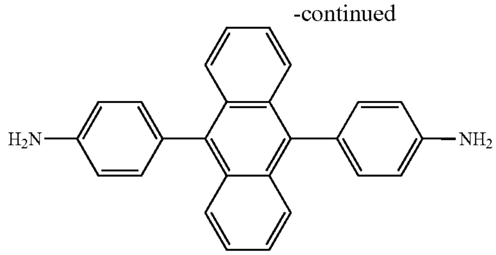,
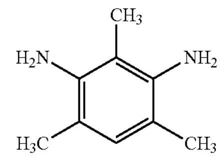,

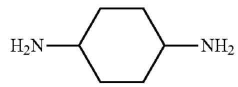,
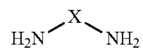, or
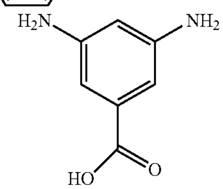;

wherein A is O, $CH_2$, $CH_2CH_2$, $SO_2$, $C(CF_3)_2$, $C(CH_3)_2$, S, S—S, CH═CH, C═O, or N;

wherein $A_1$ is Cl, CH, $OCH_2$, $CH_2$, $CH_2CH_3$ or aliphatic or aromatic;

wherein $A_2$ is $CH_3$, $CF_3$, $SO_3H$, $SO_3Na$, tert-butyl or aliphatic or aromatic;

wherein A3 is $CH_3$, $CF_3$, or OH;

wherein n is 1, 3, or 3; and wherein X is aliphatic or aromatic.

9. The polymer resin according to claim 3, wherein the dianhydride is selected from the group:

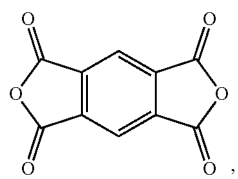,
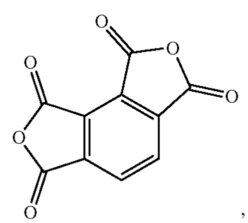,

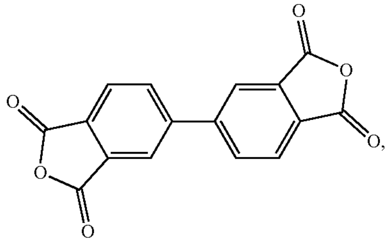

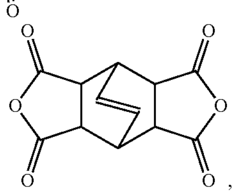,

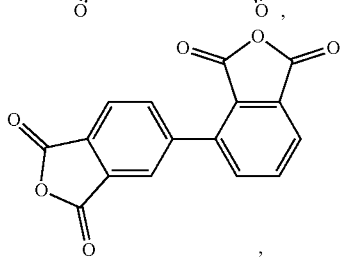,

-continued

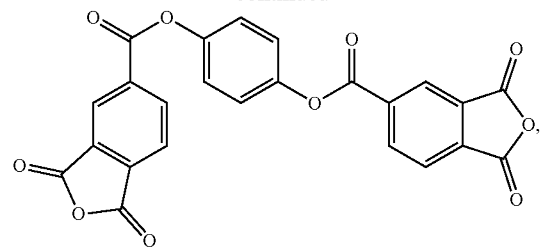

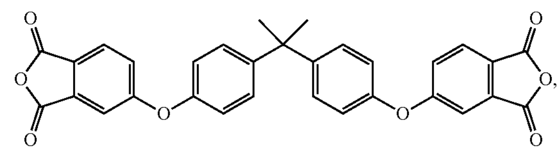

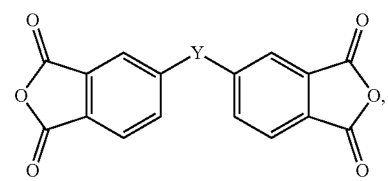

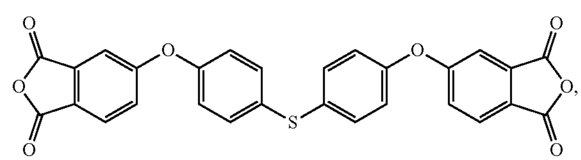

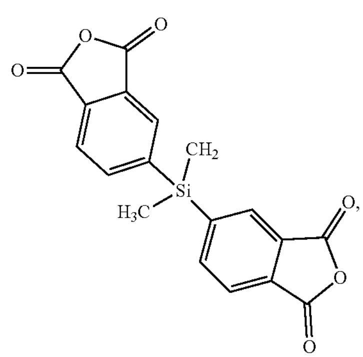

-continued

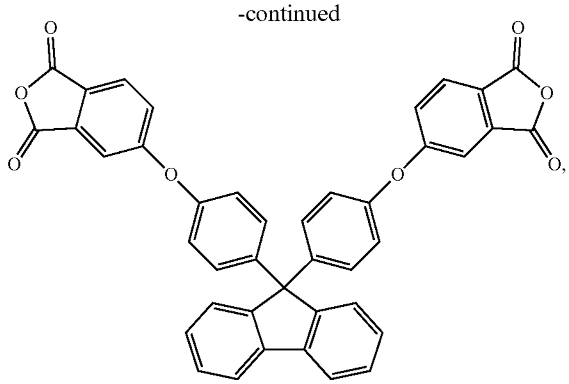

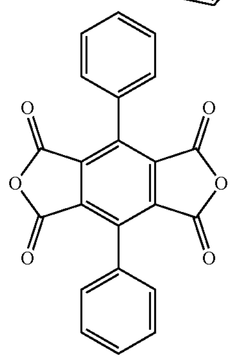

,

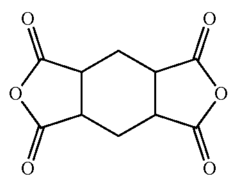

,

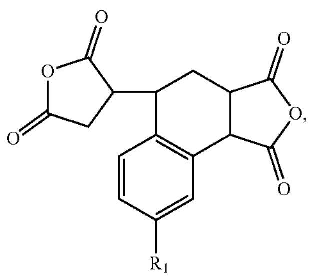

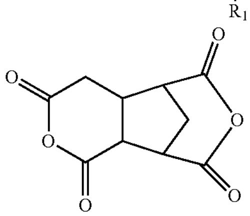

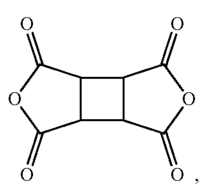

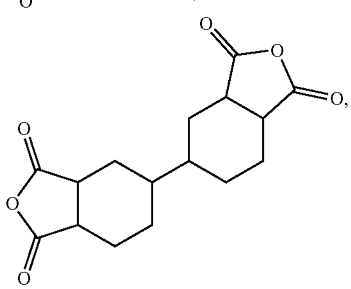

-continued

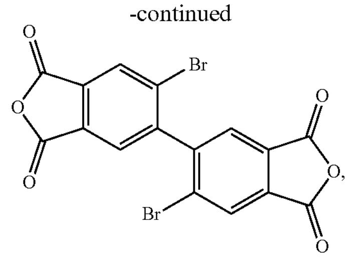

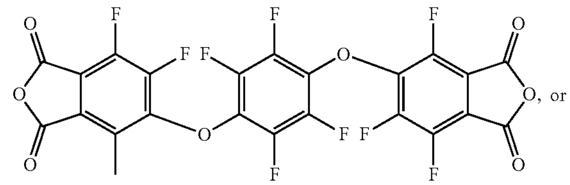

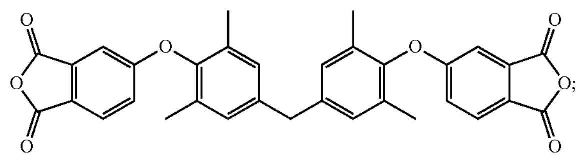

wherein Y is C═O, $C(CH_3)$, $C(CH_3)_2$, $SO_2$, or C≡O; and wherein $R_1$ is F, $CH_2Cl$, $CH_2Br$, $CH_2F$, H, or $CH_3$.

10. The polymer resin according to claim 1, wherein the polymer has an average molecular weight of about 40000 g/mol to about 60000 g/mol.

11. The polymer resin according to claim 1, wherein the polymer has a polydispersity of about 2 or less.

12. The polymer resin according to claim 1, wherein the photocrosslinkable groups have a thermal decomposition temperature of about 350° C. or less.

13. The polymer resin according to claim 1, wherein the photocrosslinkable groups comprise an acrylate, a methacrylate, or a combination thereof.

14. The polymer resin according to claim 1, wherein the suitable wavelength is about 300 nm to 500 nm.

15. The polymer resin according to claim 1, wherein the photointiator is a phosphine oxide.

16. A polymer resin according to claim 1, further comprising a UV blocker.

17. The polymer resin according to claim 1, wherein the viscosity of the polymer resin is between 400 and 1,000 Pa·s.

* * * * *